(12) United States Patent
Watanabe et al.

(10) Patent No.: US 9,634,629 B2
(45) Date of Patent: Apr. 25, 2017

(54) SEMICONDUCTOR AMPLIFIER CIRCUIT

(71) Applicant: Kabushiki Kaisha Toshiba, Minato-ku (JP)

(72) Inventors: Fumiya Watanabe, Yokohama (JP); Mikihiko Ito, Tokyo (JP); Masaru Koyanagi, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 74 days.

(21) Appl. No.: 14/525,538

(22) Filed: Oct. 28, 2014

(65) Prior Publication Data

US 2016/0036397 A1 Feb. 4, 2016

Related U.S. Application Data

(60) Provisional application No. 62/031,515, filed on Jul. 31, 2014.

(51) Int. Cl.
| | |
|---|---|
| *G06G 7/12* | (2006.01) |
| *G06G 7/26* | (2006.01) |
| *H03F 3/45* | (2006.01) |
| *G11C 7/10* | (2006.01) |
| *G11C 7/06* | (2006.01) |

(52) U.S. Cl.
CPC ......... *H03F 3/4521* (2013.01); *G11C 7/1057* (2013.01); *G11C 7/062* (2013.01); *H03F 2203/45651* (2013.01); *H03F 2203/45658* (2013.01)

(58) Field of Classification Search
CPC .................. H03F 3/04; H03F 3/4521

USPC ........................................ 327/563; 330/257
See application file for complete search history.

(56) References Cited

U.S. PATENT DOCUMENTS

| | | | |
|---|---|---|---|
| 6,339,344 B1 | 1/2002 | Sakata et al. | |
| 7,183,852 B2* | 2/2007 | Abe | H03F 3/4521 330/253 |
| 7,248,115 B2* | 7/2007 | Nishimura | H03F 3/45183 330/253 |
| 2014/0016404 A1 | 1/2014 | Kim et al. | |
| 2014/0032941 A1 | 1/2014 | Kajigaya et al. | |

FOREIGN PATENT DOCUMENTS

| | | |
|---|---|---|
| JP | 2000-306382 | 11/2000 |
| JP | 2010-165449 | 7/2010 |
| JP | 2014-22030 | 2/2014 |
| JP | 2014-026681 | 2/2014 |

* cited by examiner

*Primary Examiner* — Lincoln Donovan
*Assistant Examiner* — Metasebia Retebo
(74) *Attorney, Agent, or Firm* — Oblon, McClelland, Maier & Neustadt, L.L.P.

(57) ABSTRACT

According to one embodiment, a semiconductor amplifier circuit includes: a first amplifier circuit including first and second P-type transistors; a second amplifier circuit including first and second N-type transistors; and first to seventh current mirror circuits. The first and second current mirror circuits are connected to drains of the first and second P-type transistors. The third and fourth current mirror circuits are connected to drains of the first and second N-type transistors. The sixth current mirror circuit is connected to the first, fourth and fifth current mirror circuits. The seventh current mirror circuit is connected to the second, third and fifth current mirror circuits.

18 Claims, 57 Drawing Sheets

[Embodiment 7-2]

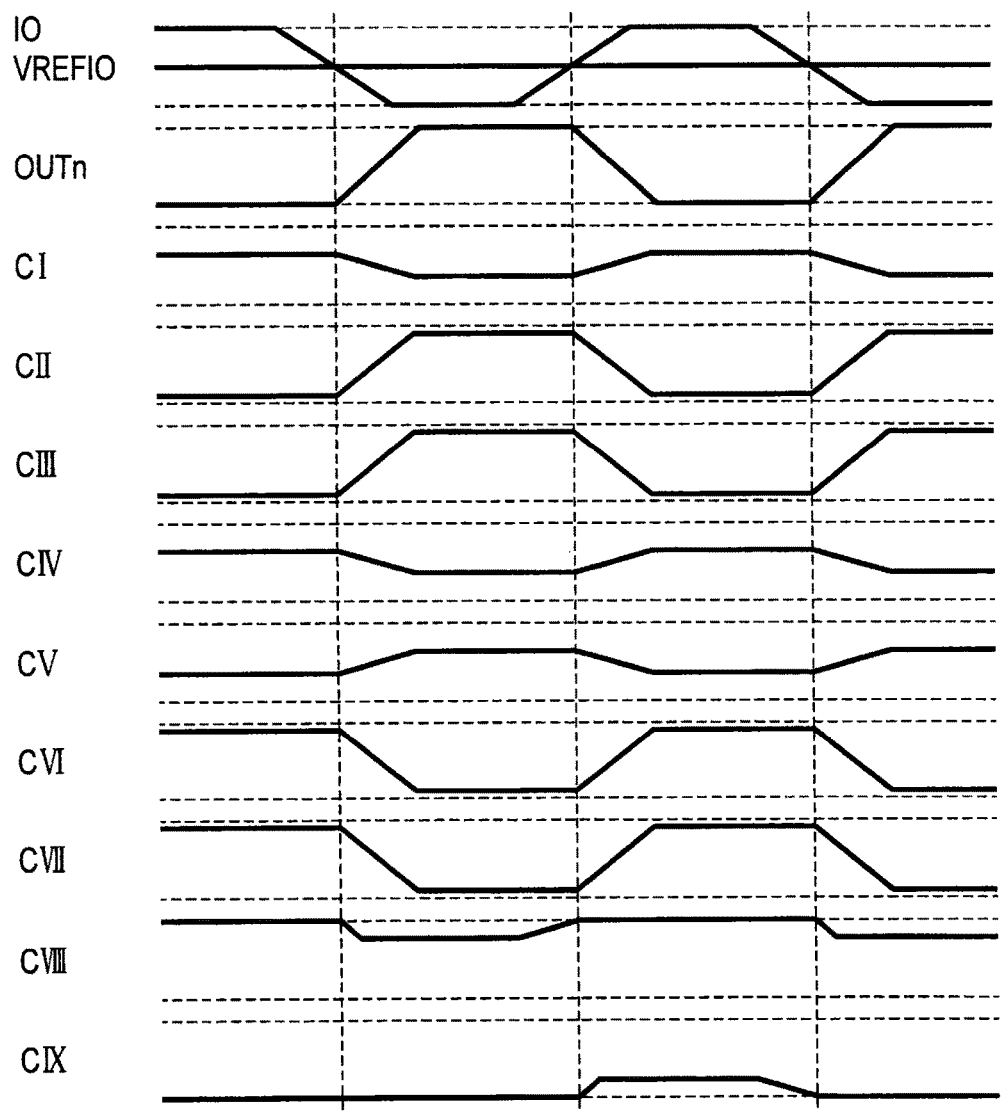
F I G. 2

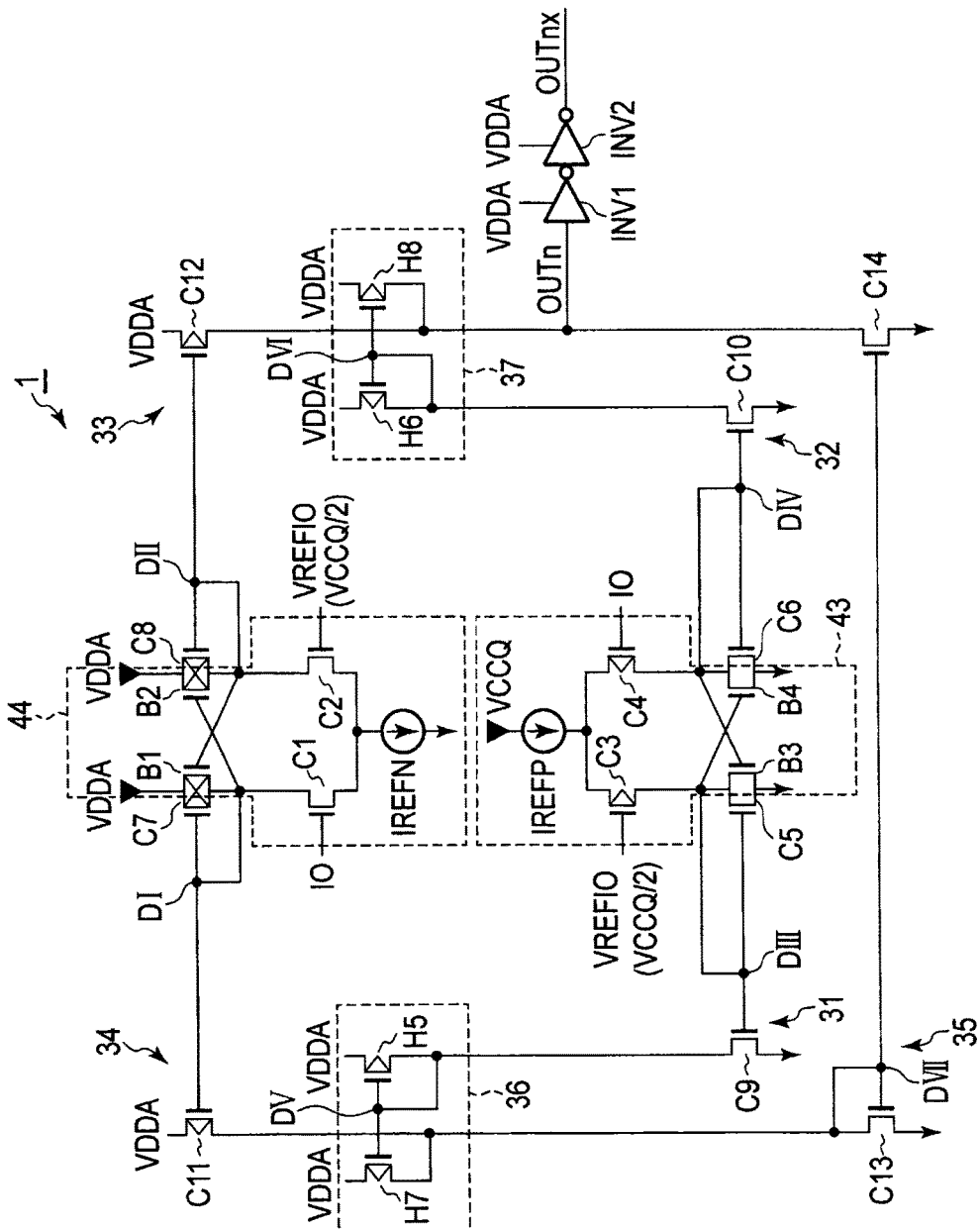
F I G. 3B

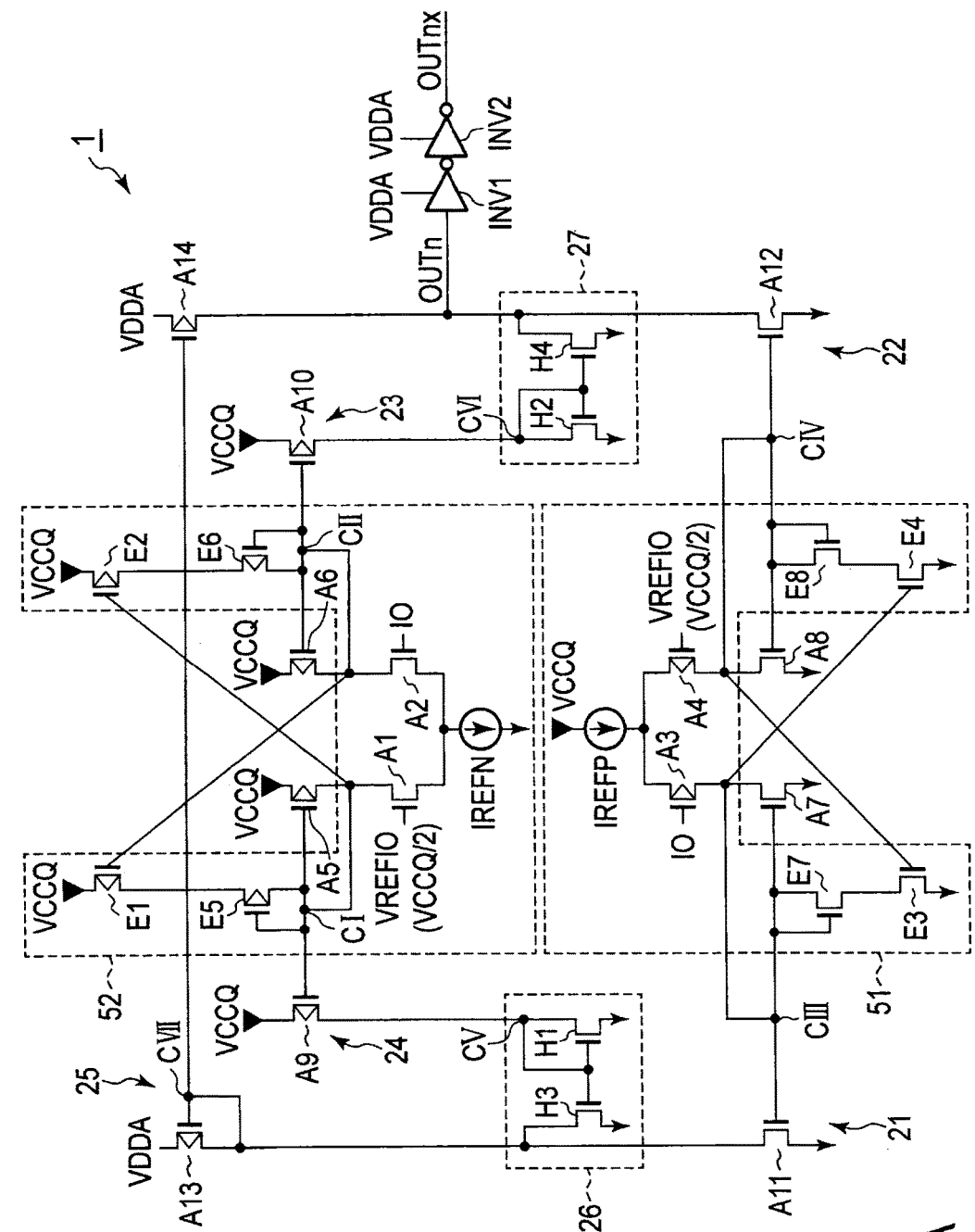
[Embodiment 3-2]
F I G. 6A

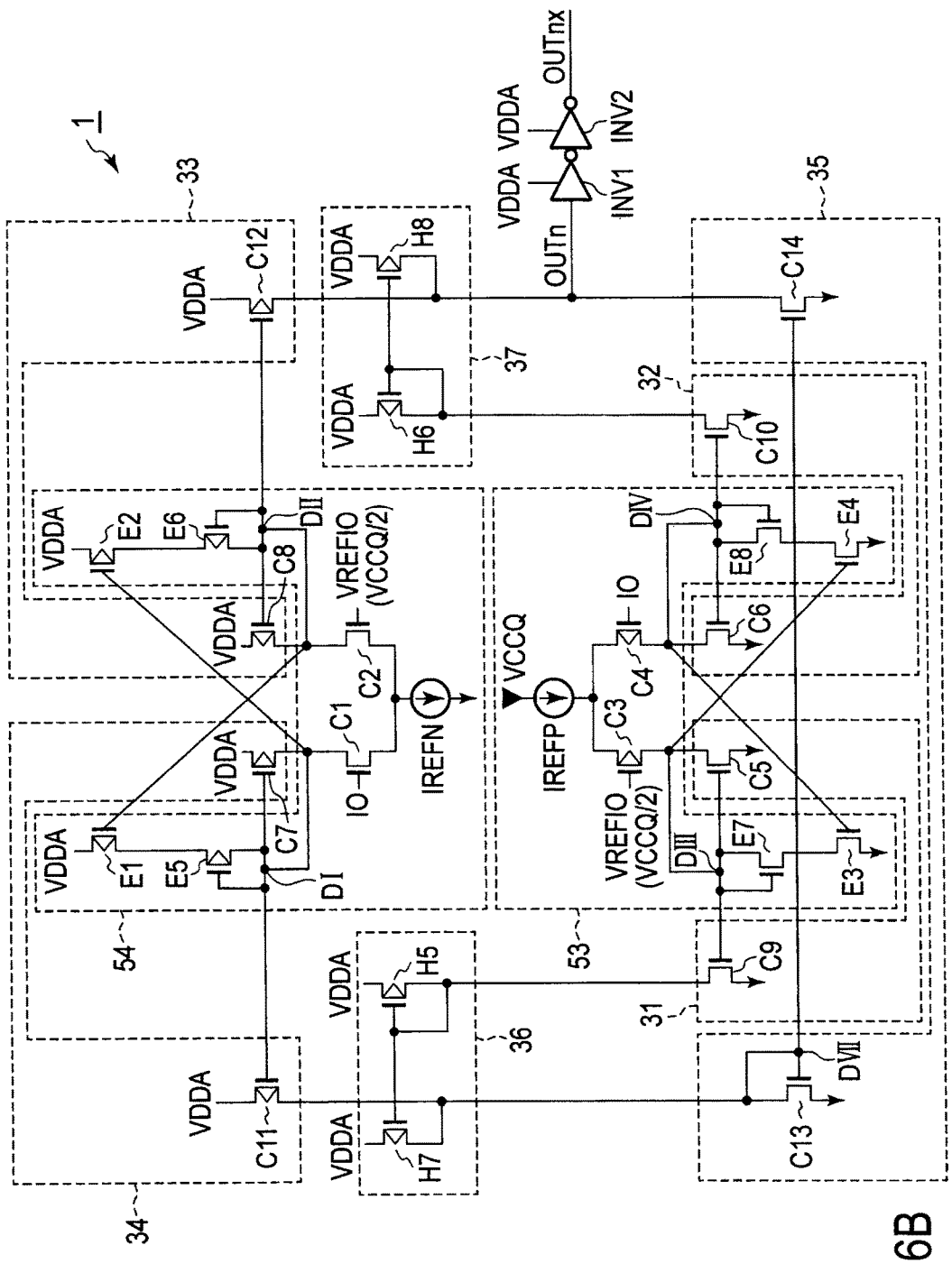
F I G. 6B

[Embodiment 4-3]

[Embodiment 5-1]

FIG. 9

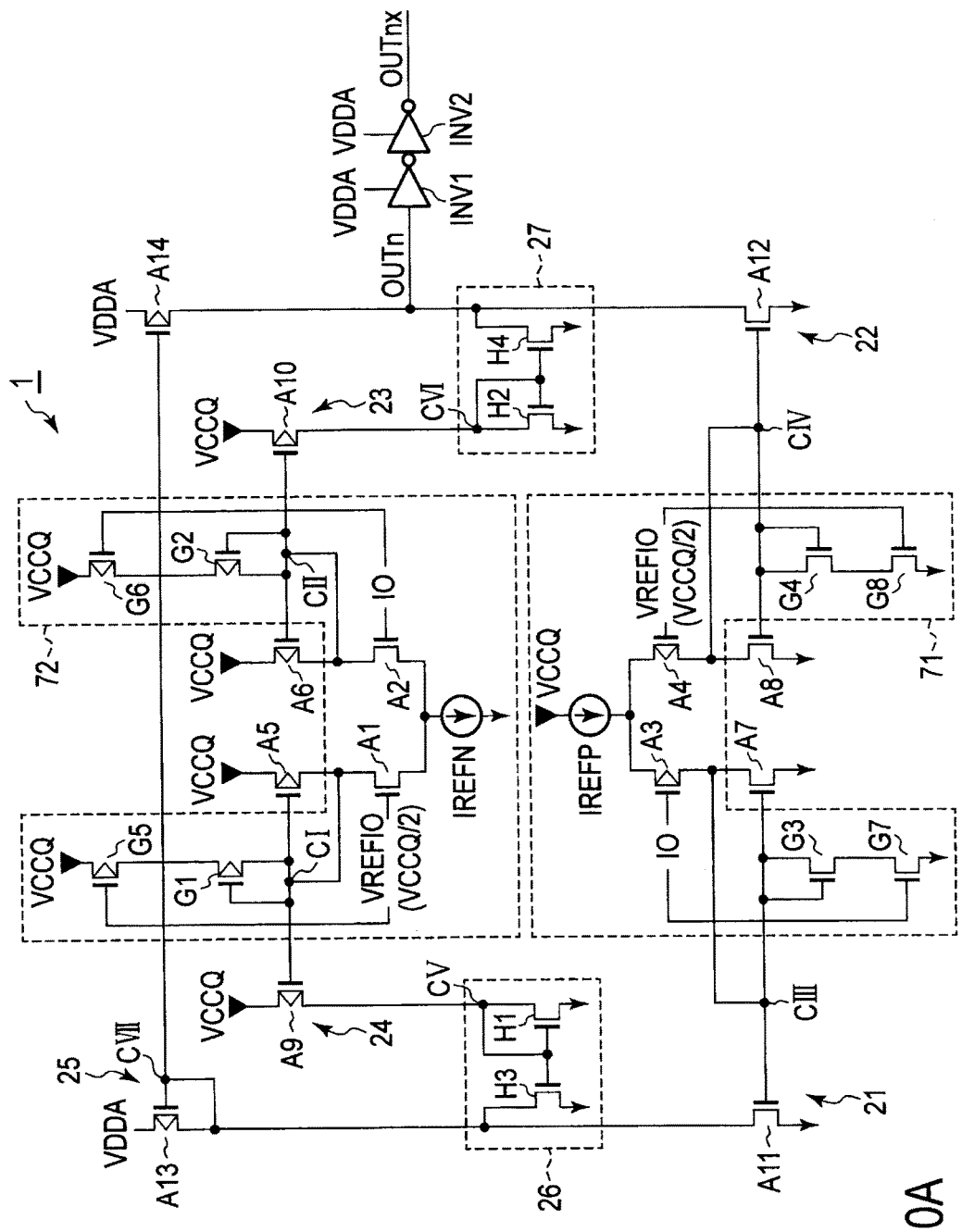
[Embodiment 5-2]
F I G. 10A

[Embodiment 5-3]

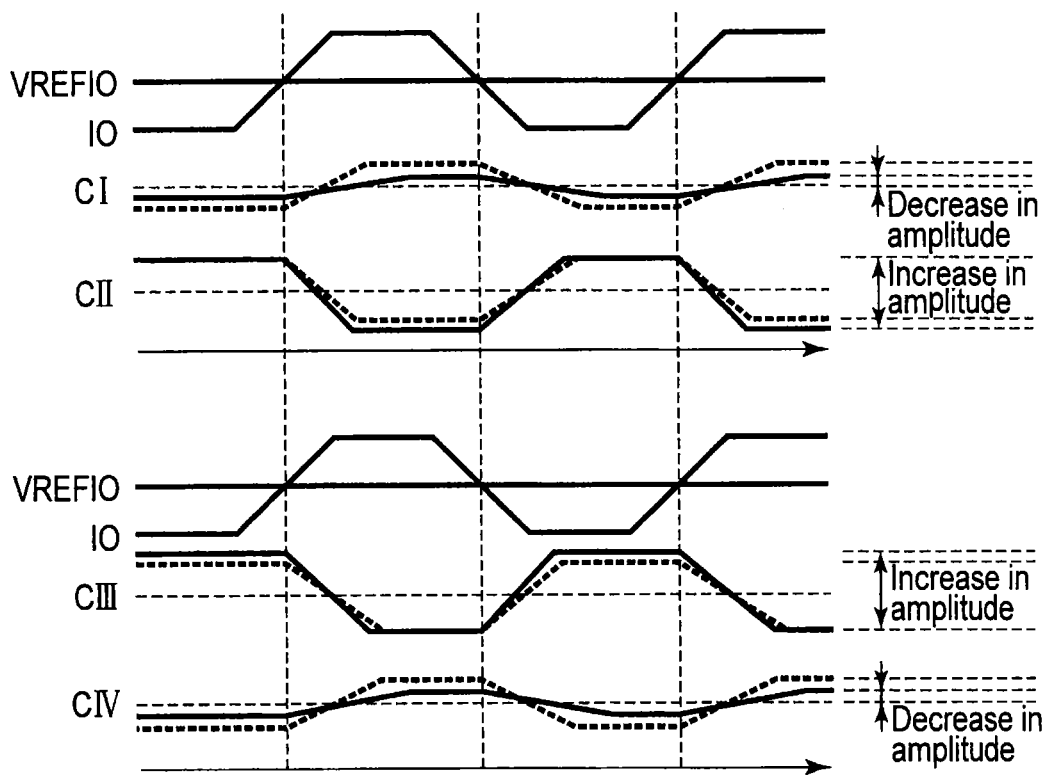
F I G. 11

[Embodiment 6-3]
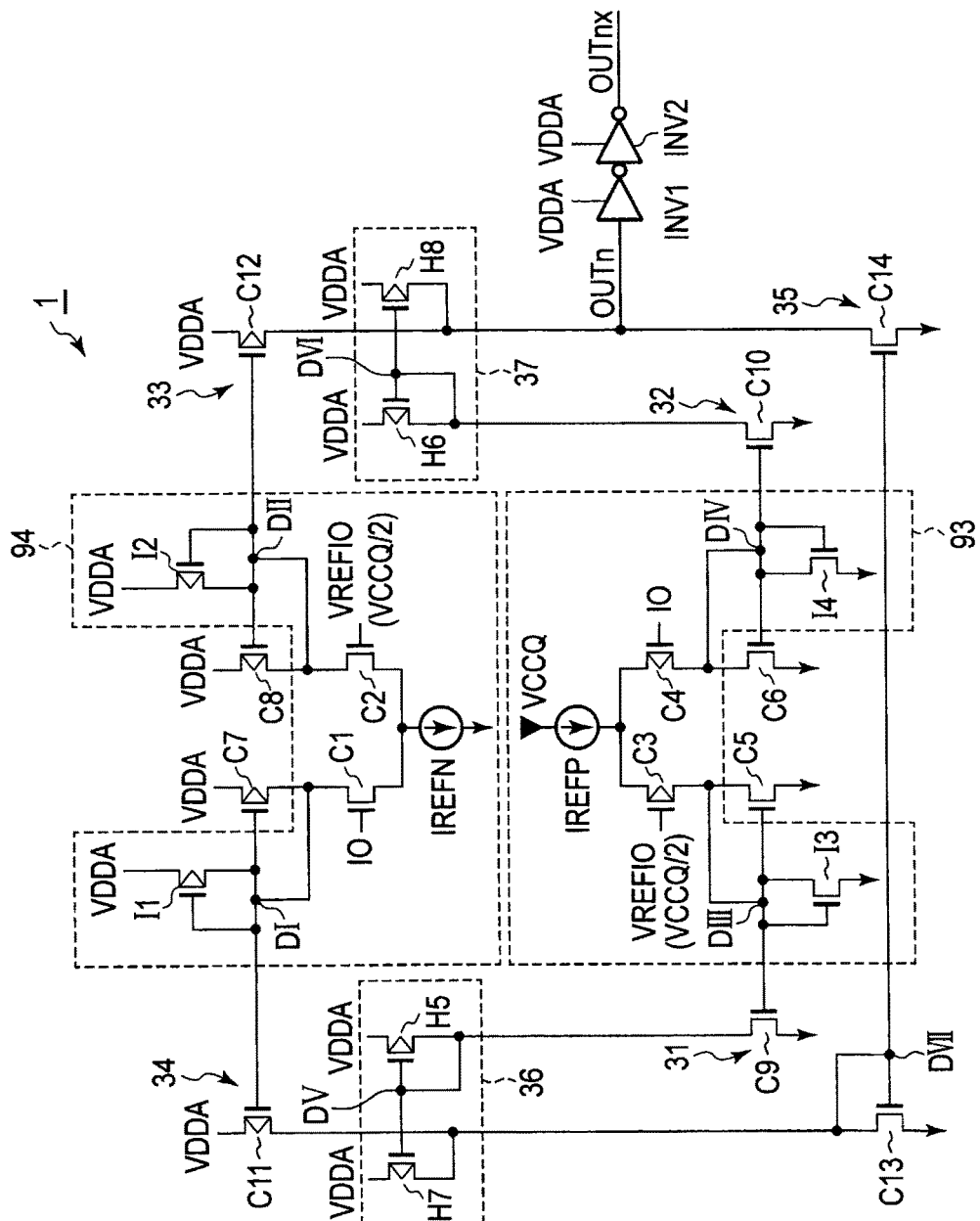
F I G. 13B

[Embodiment 7-2]

F I G. 15A

[Embodiment 7-3]

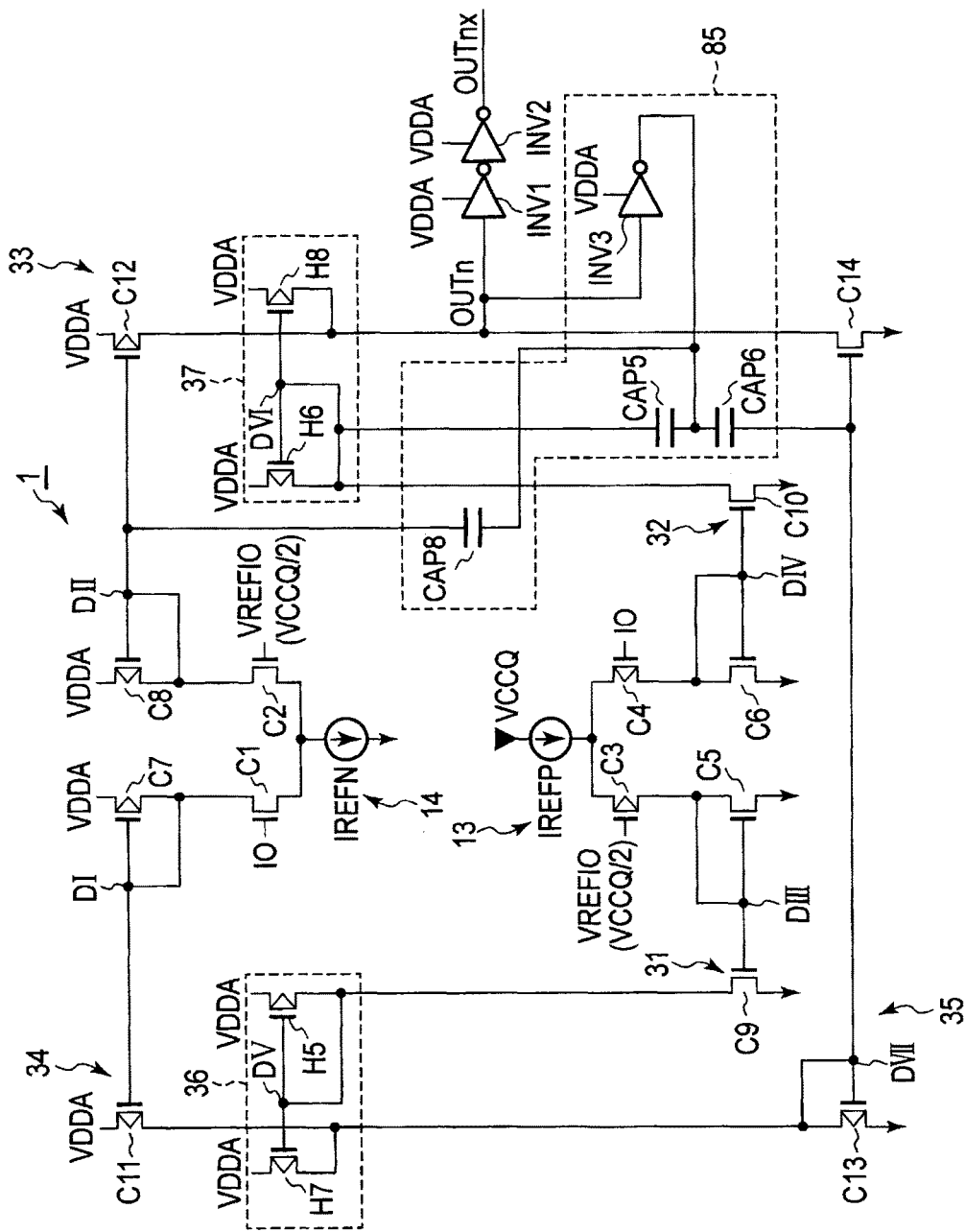
F I G. 16B

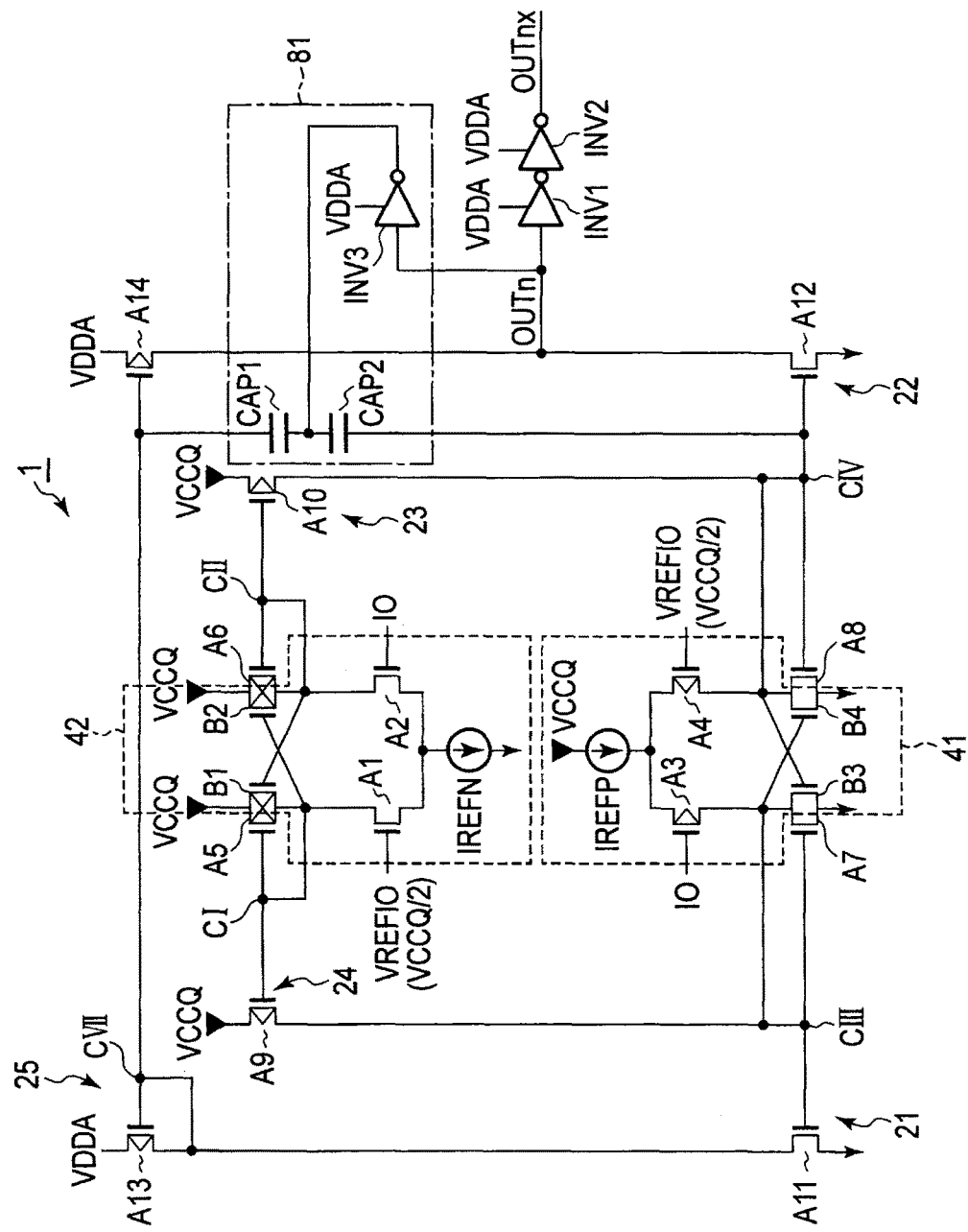
F I G. 17

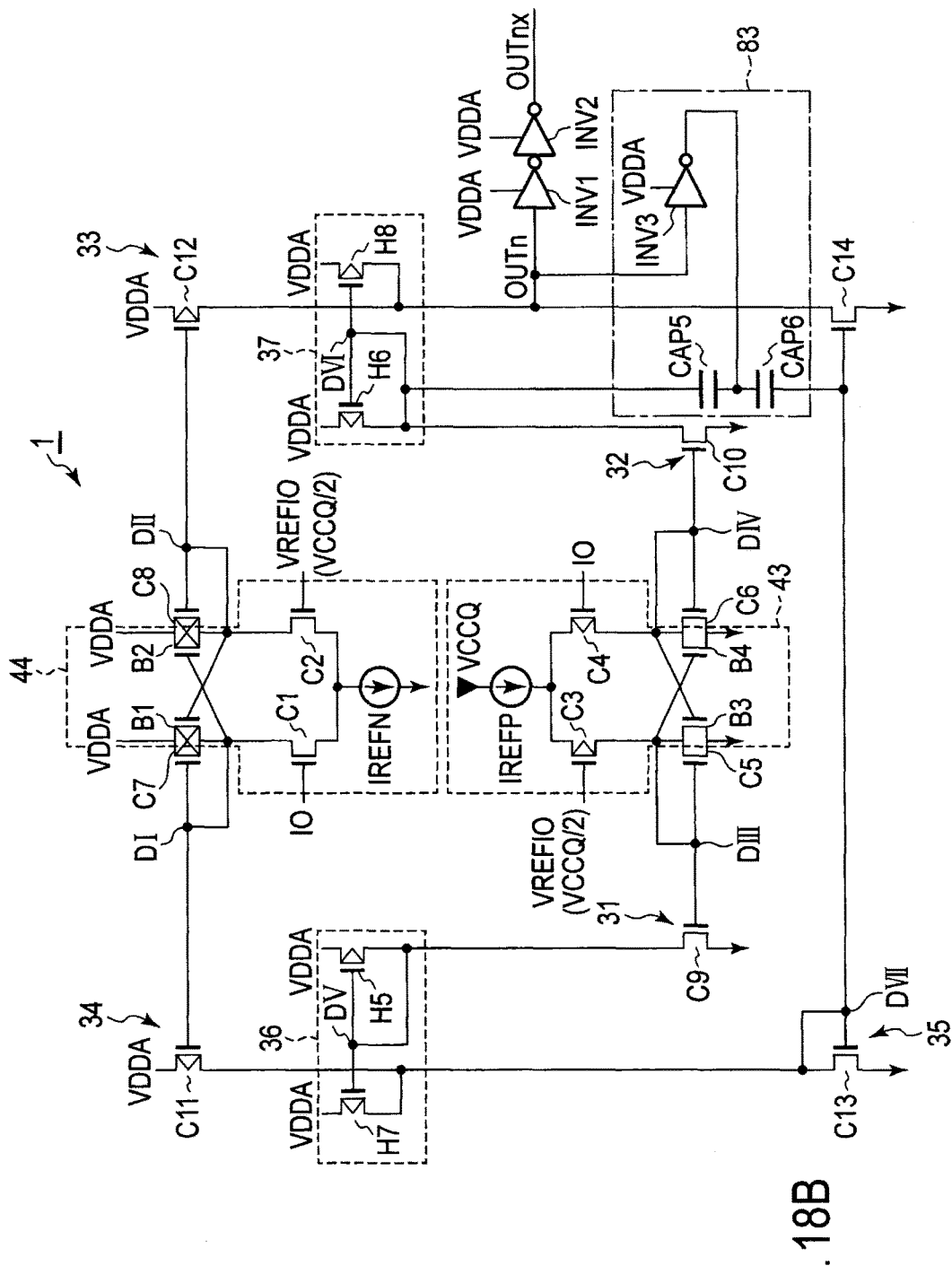
F I G. 18B

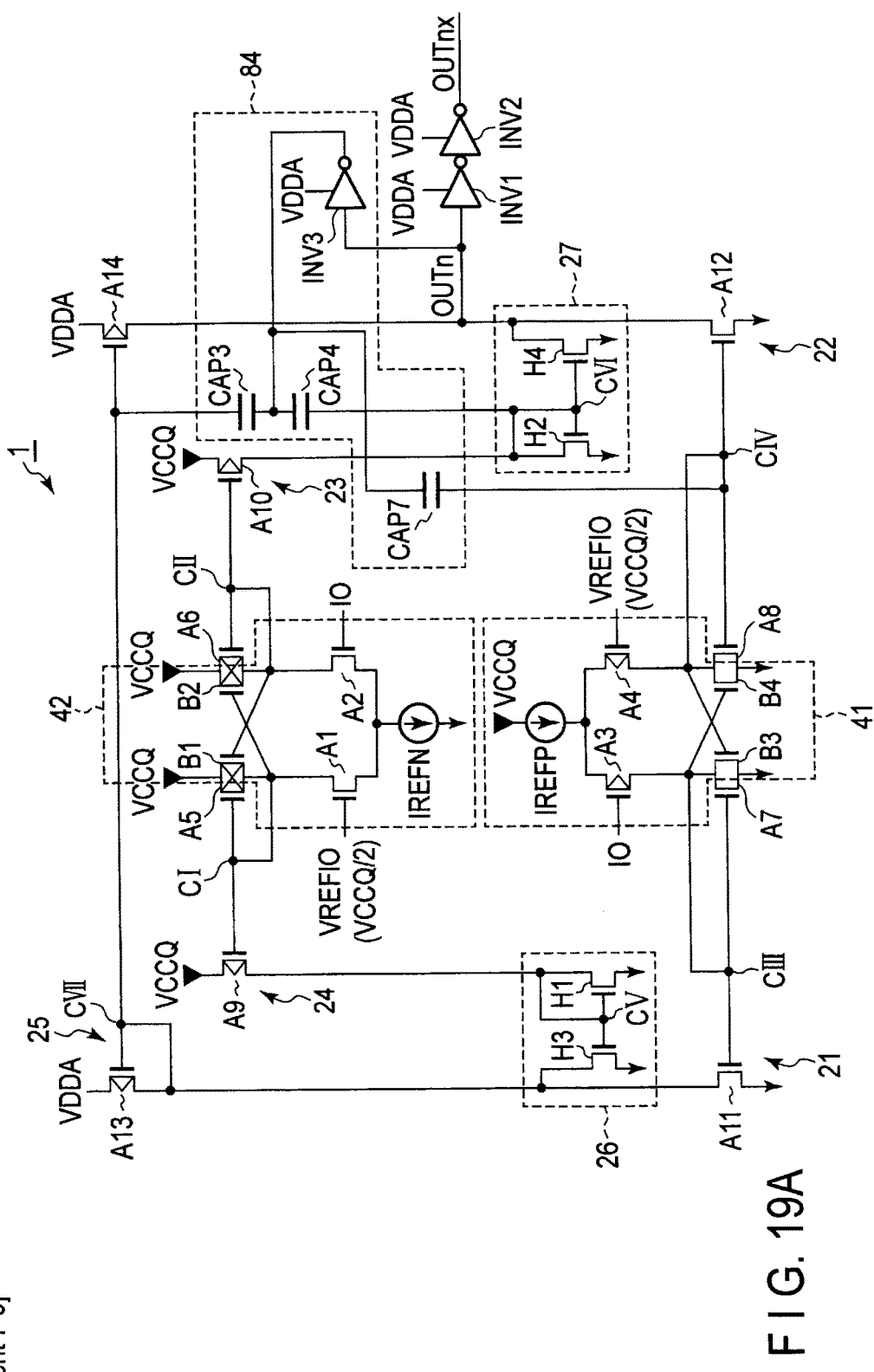
[Embodiment 7-9]
F I G. 19A

[Embodiment 7-10]

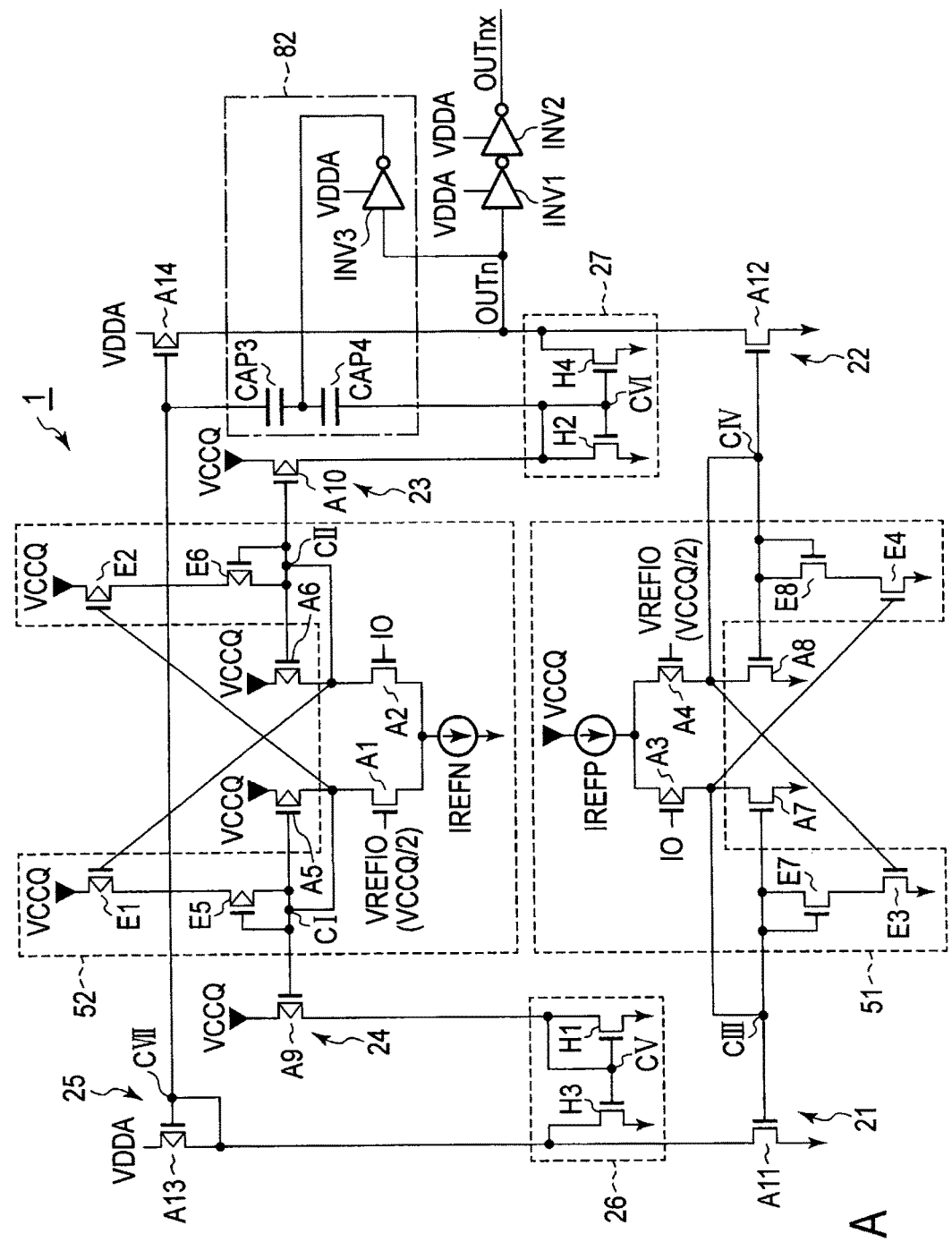
F I G. 21A

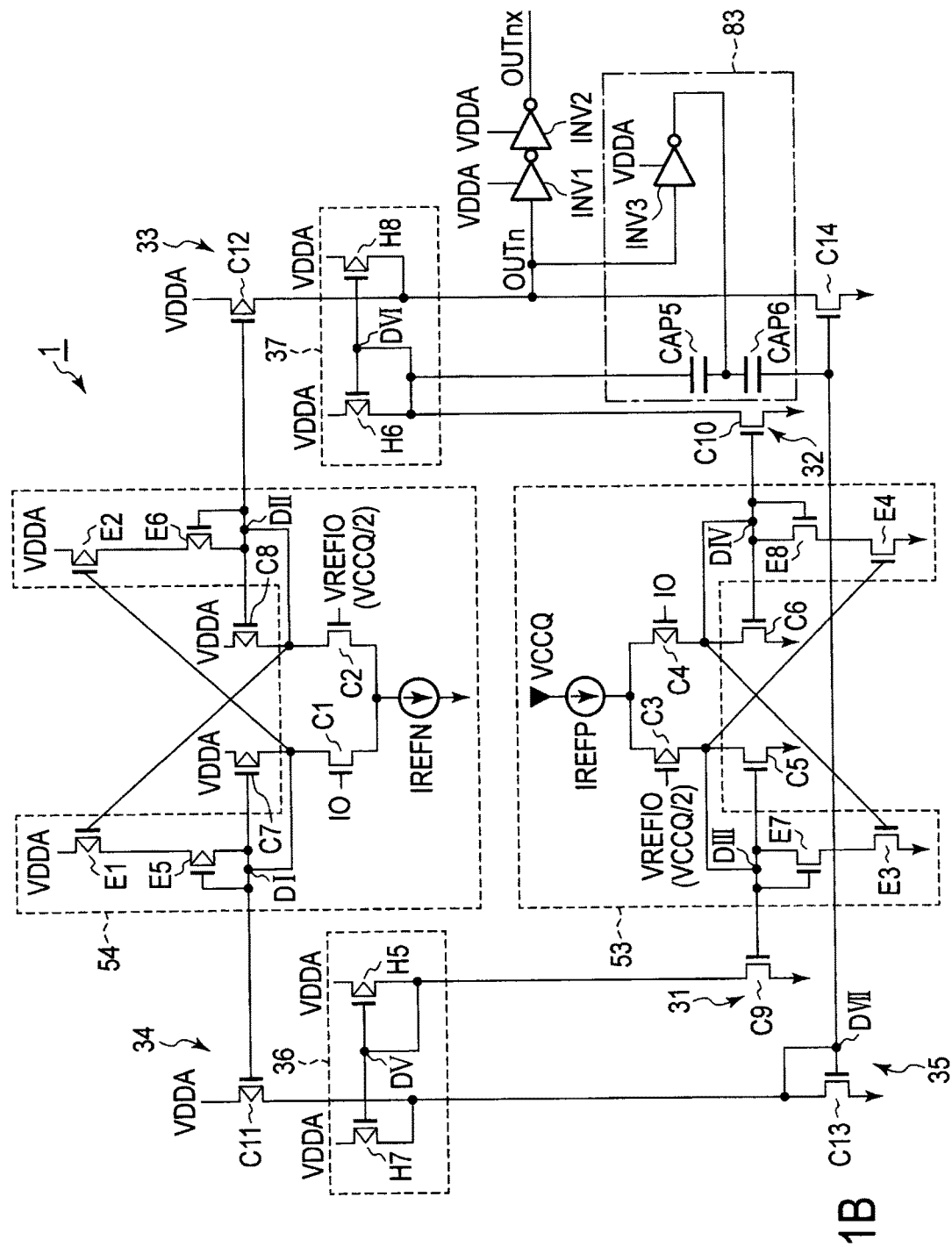
[Embodiment 7-13]
F I G. 21B

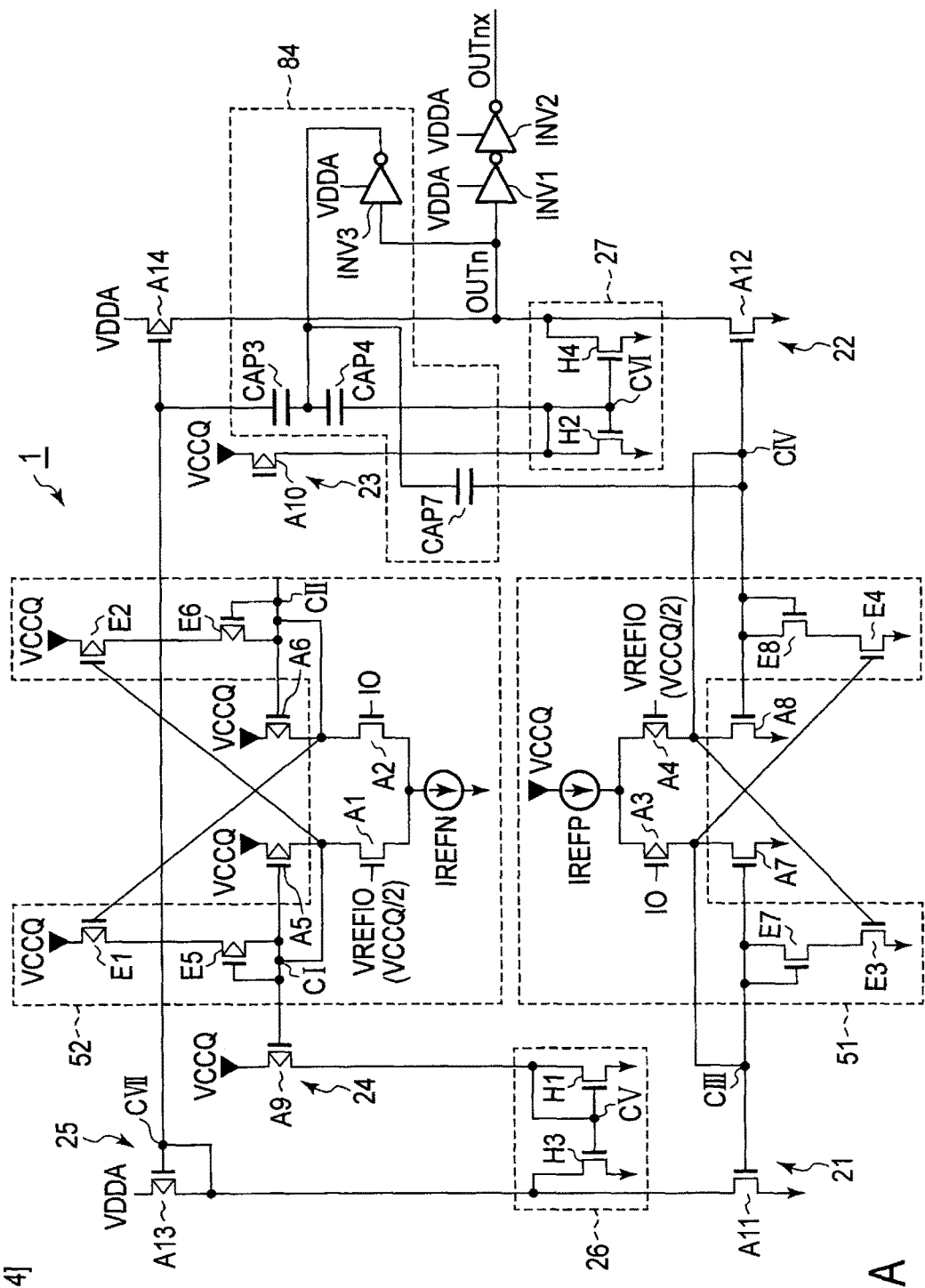
F I G. 22A

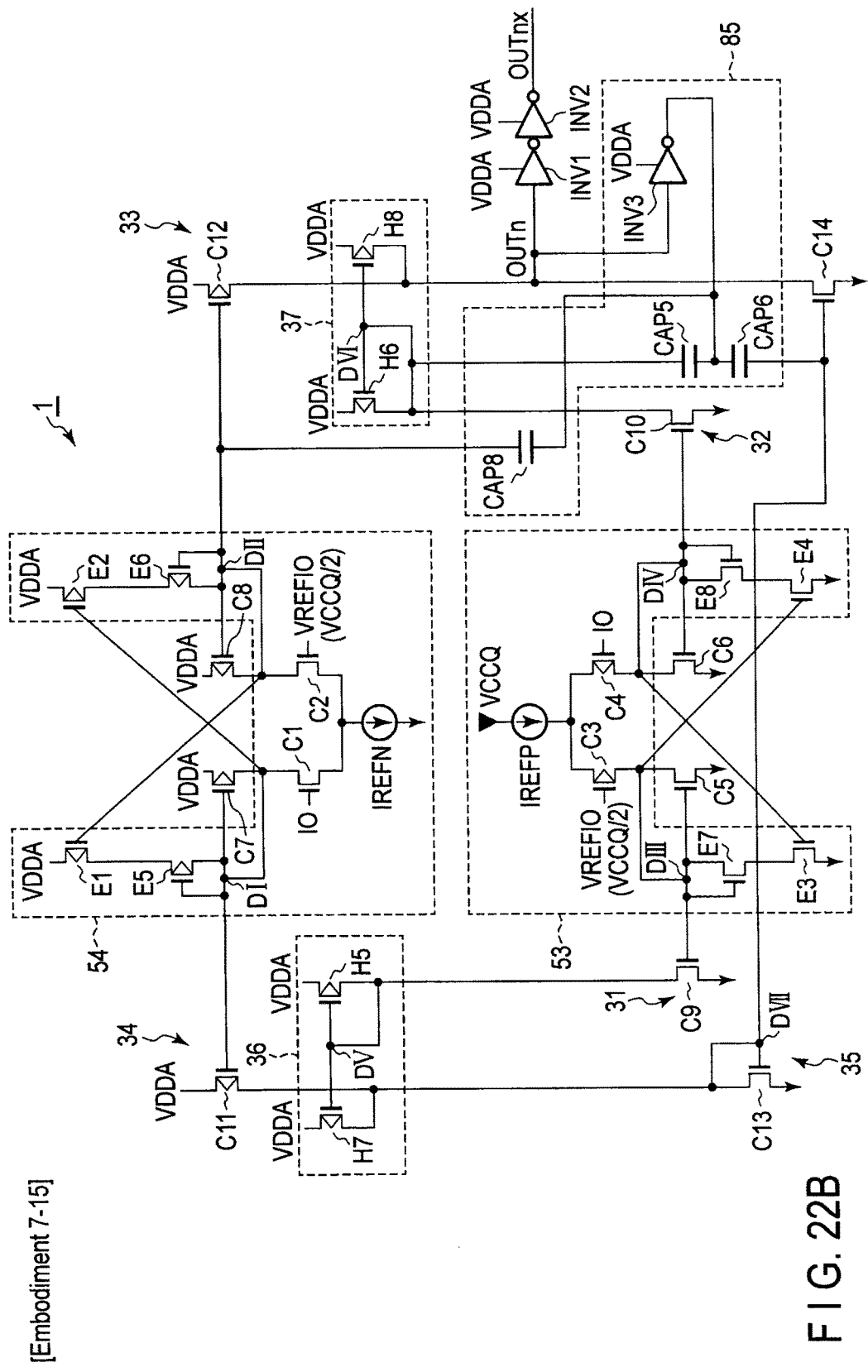
[Embodiment 7-15]
F I G. 22B

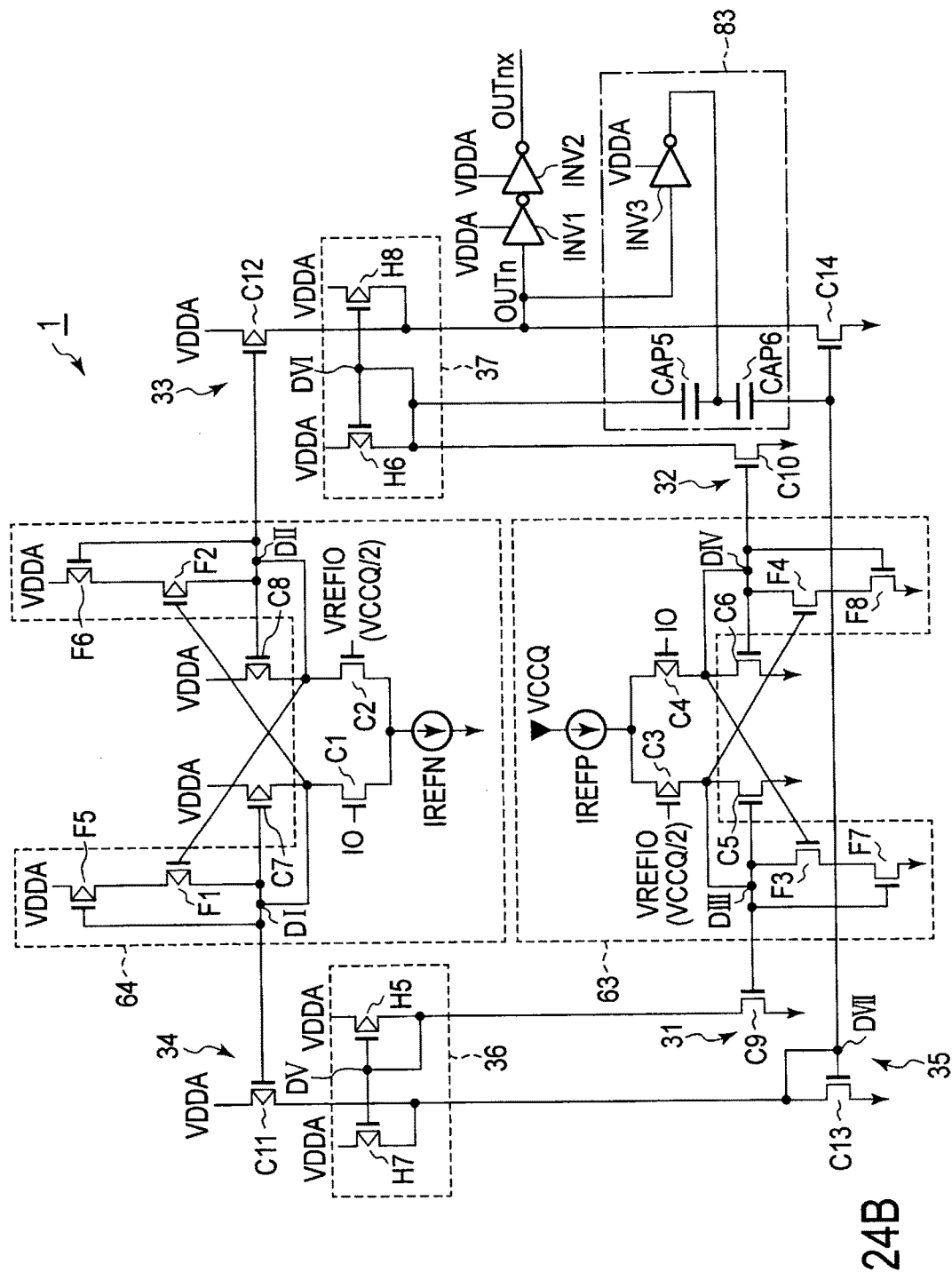
F I G. 24B

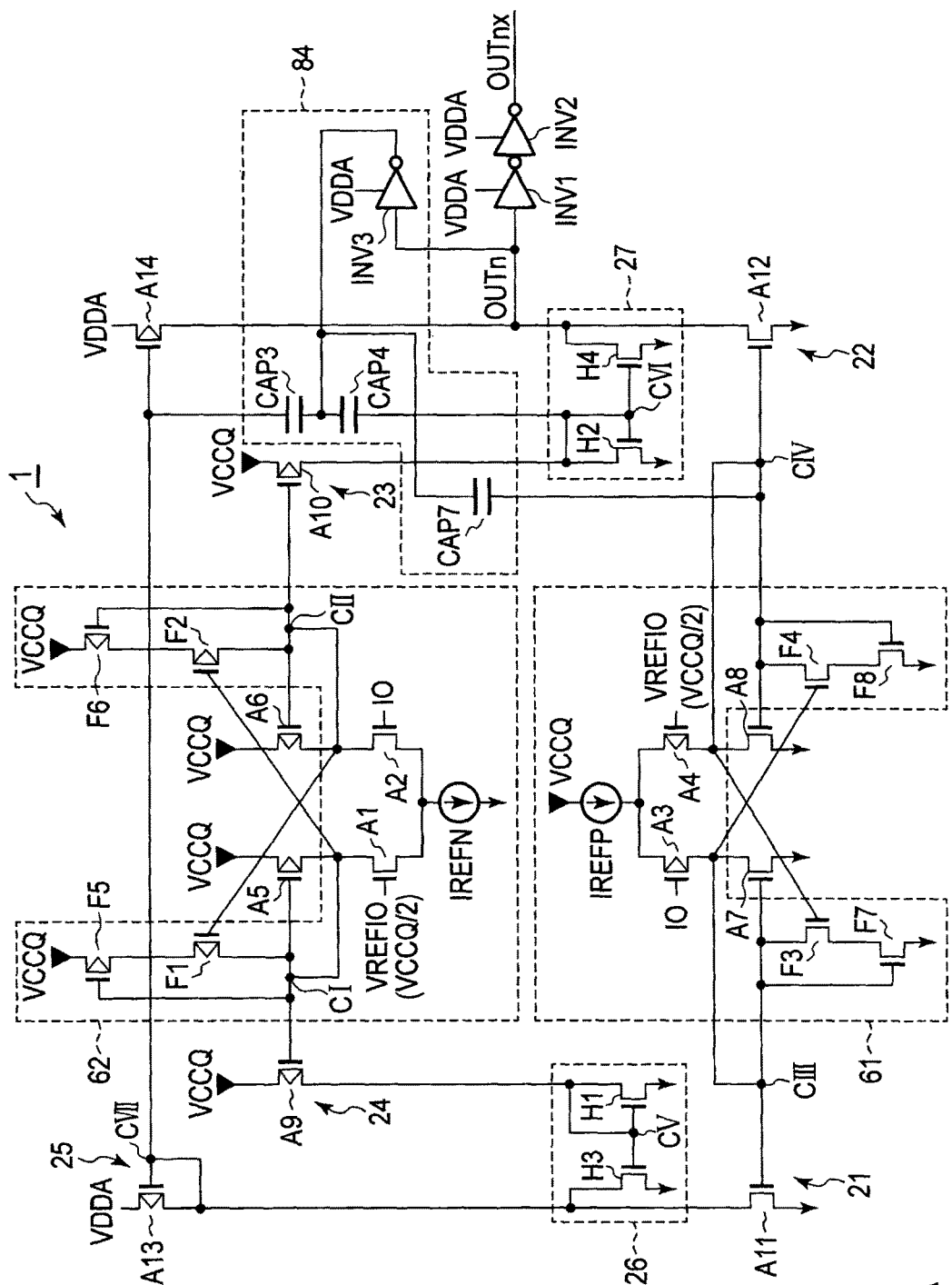
F I G. 25A

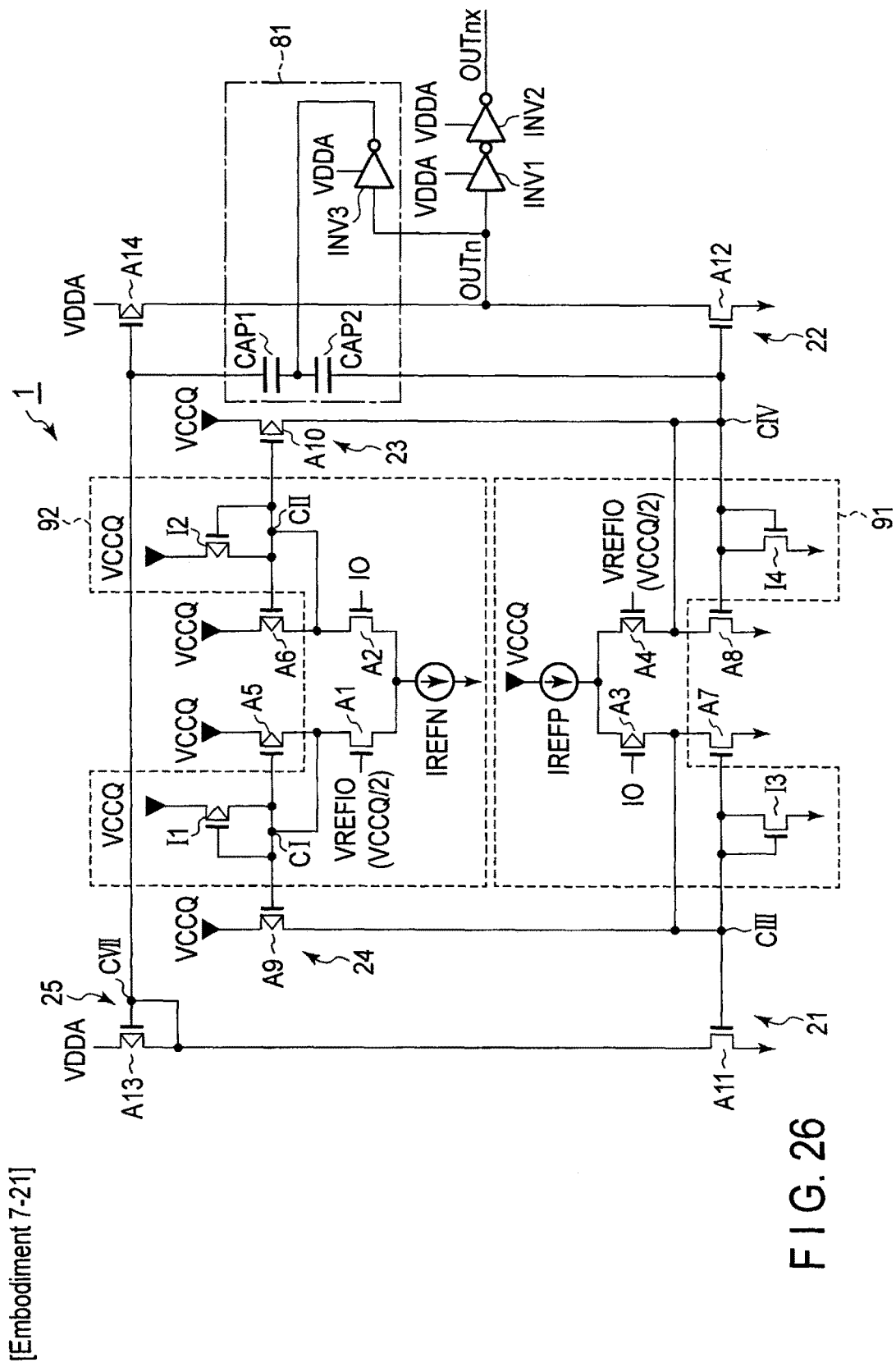
F I G. 26

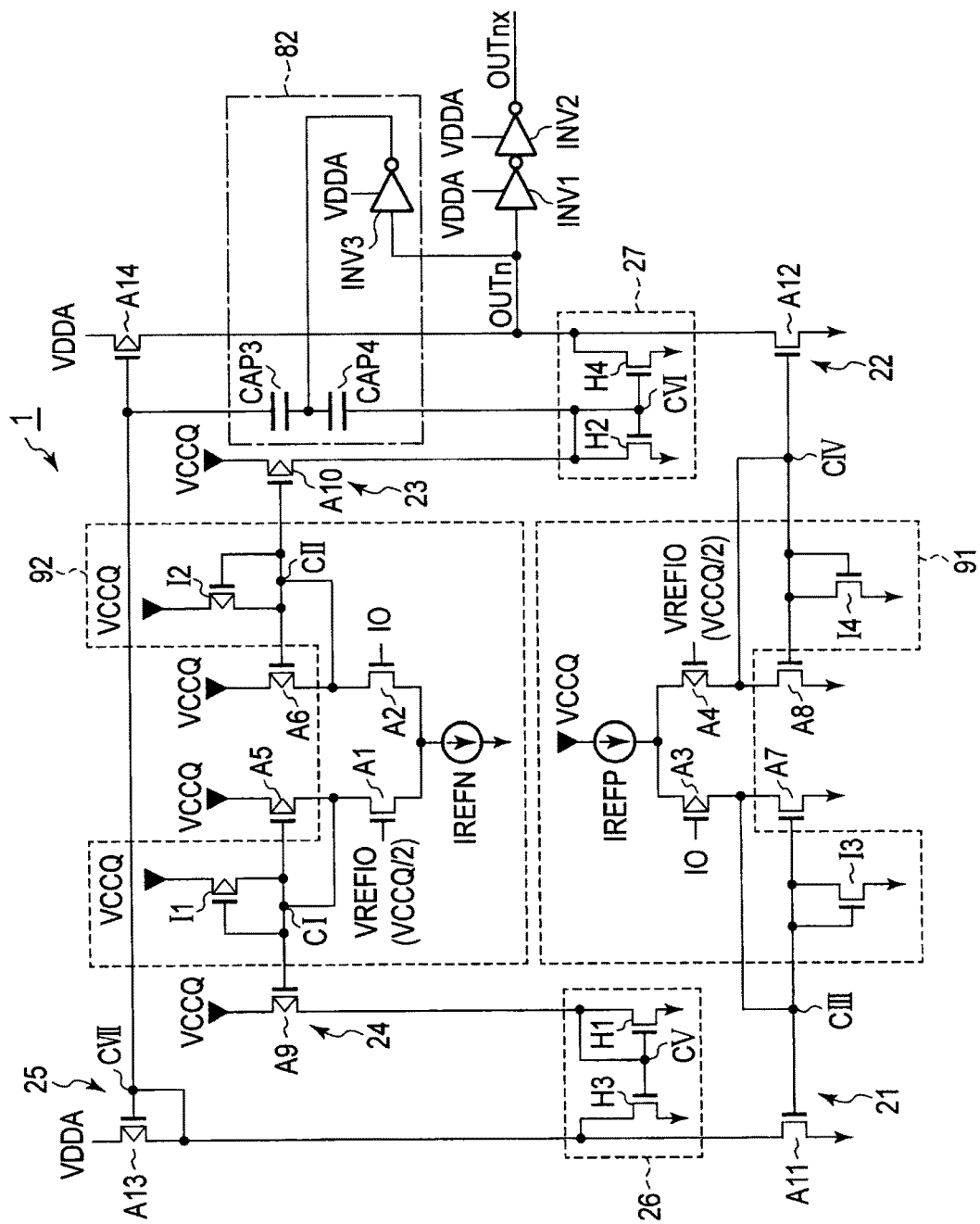
[Embodiment 7-22]
F I G. 27A

[Embodiment 7-23]

FIG. 27B

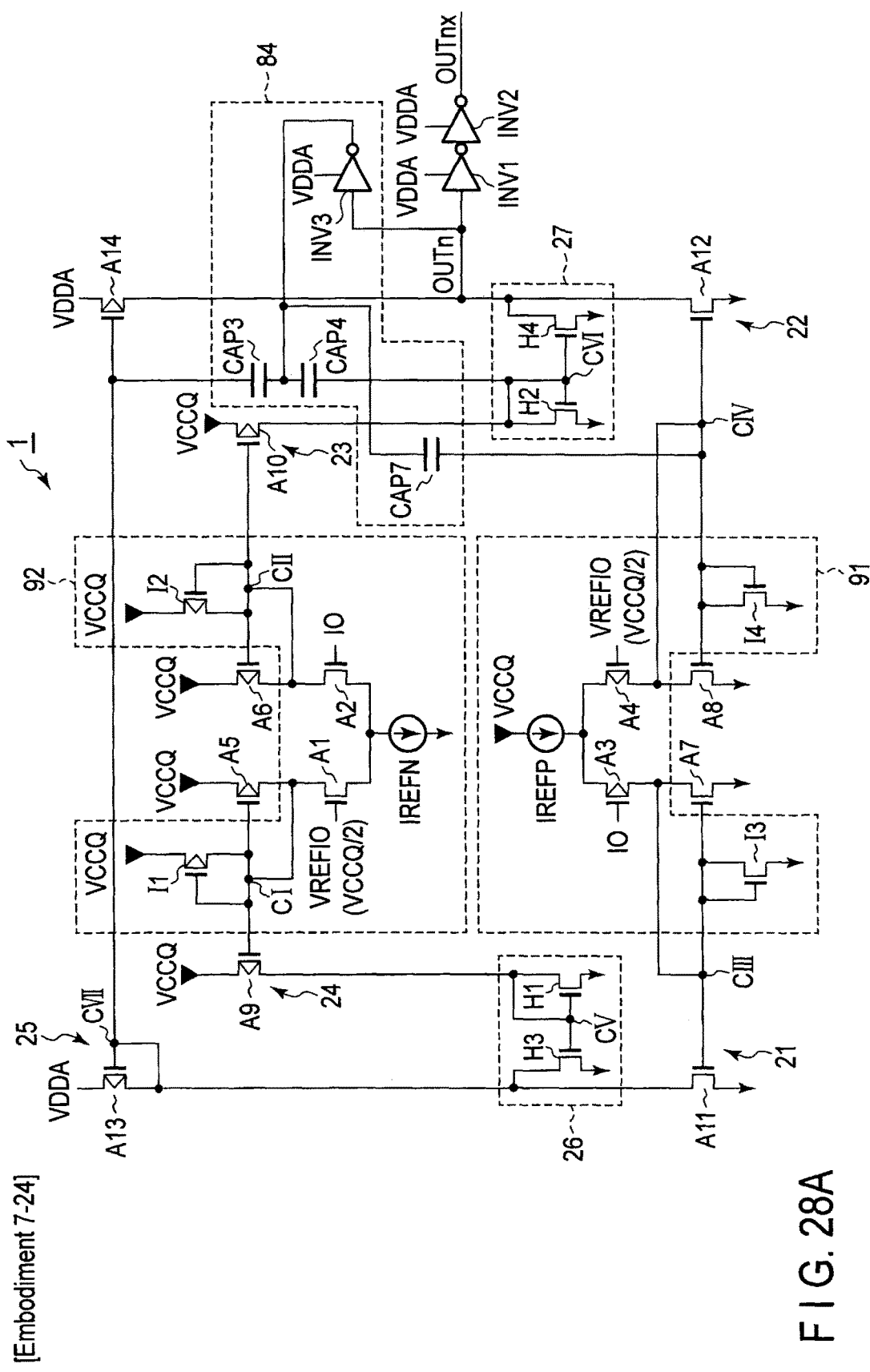
F I G. 28A

[Embodiment 7-26]

[Embodiment 7-27]

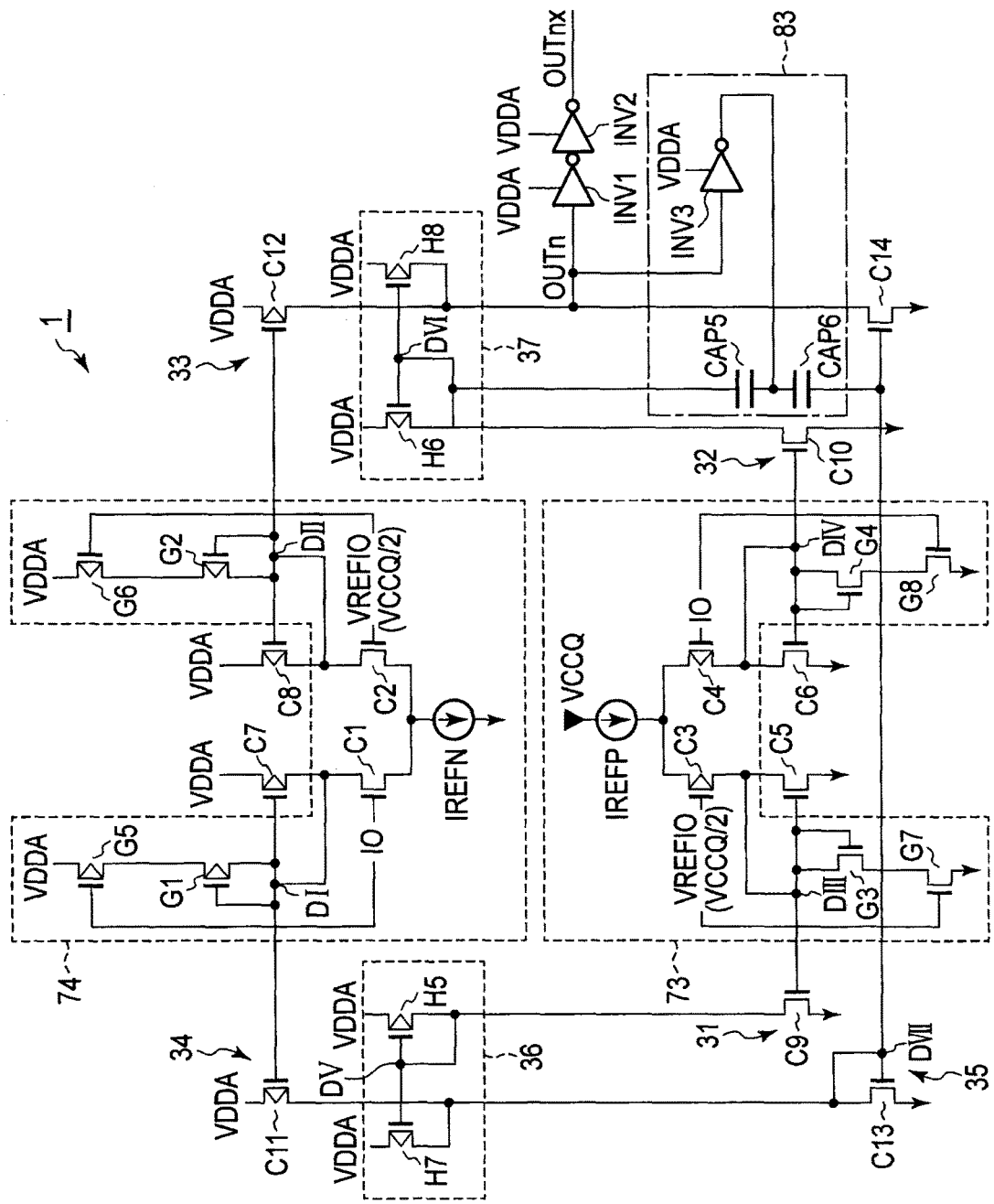
F I G. 30B

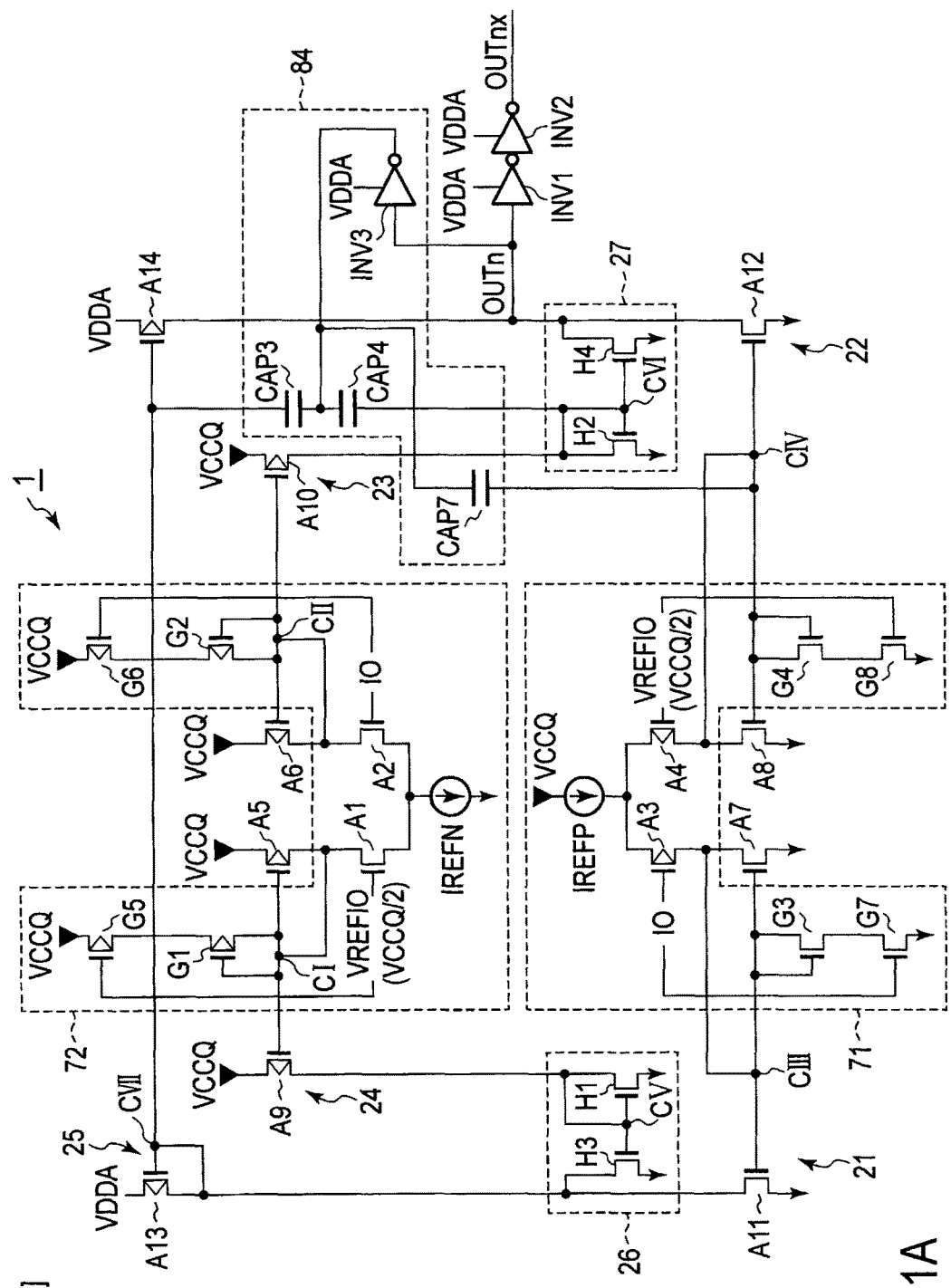
F I G. 31A

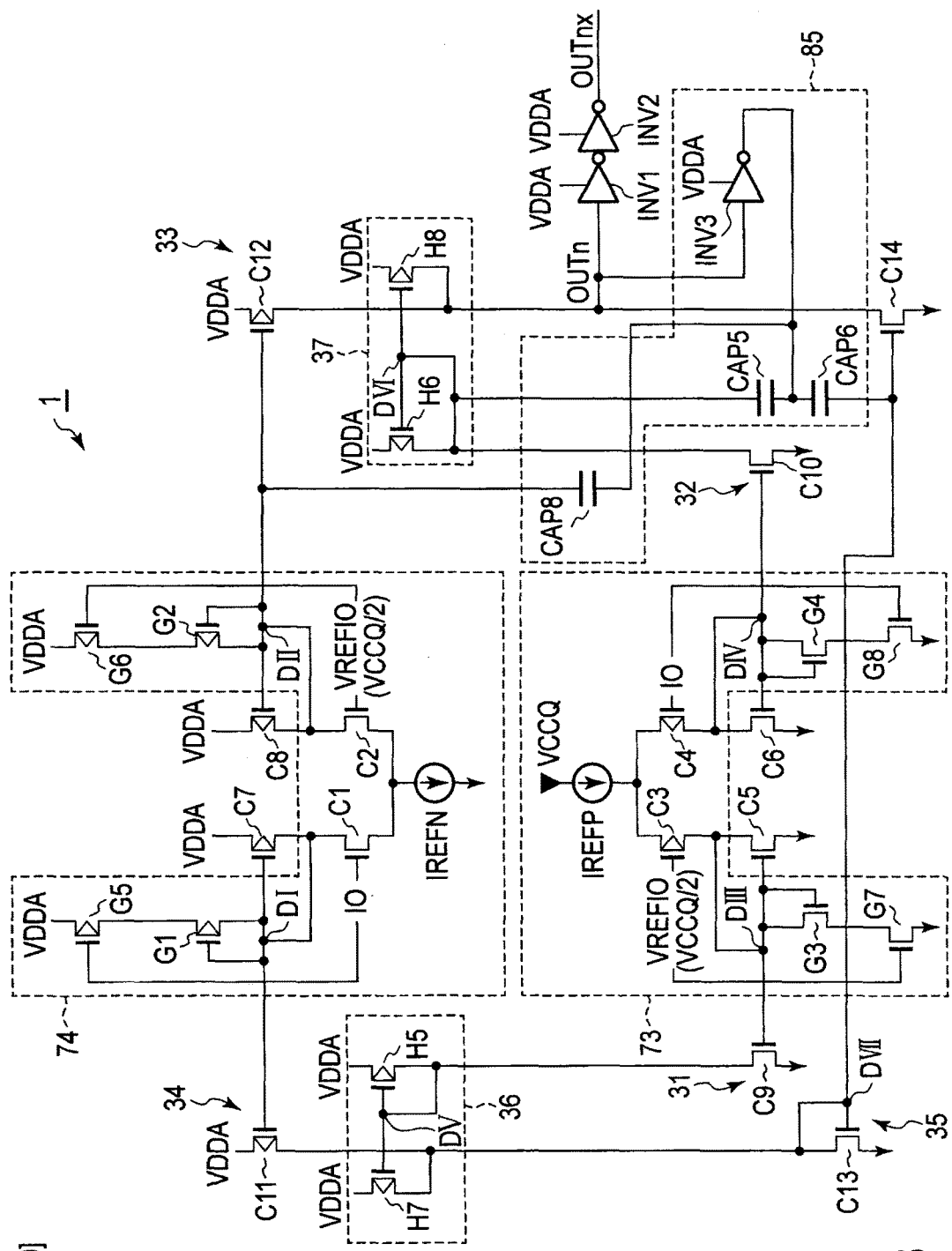
F I G. 31B

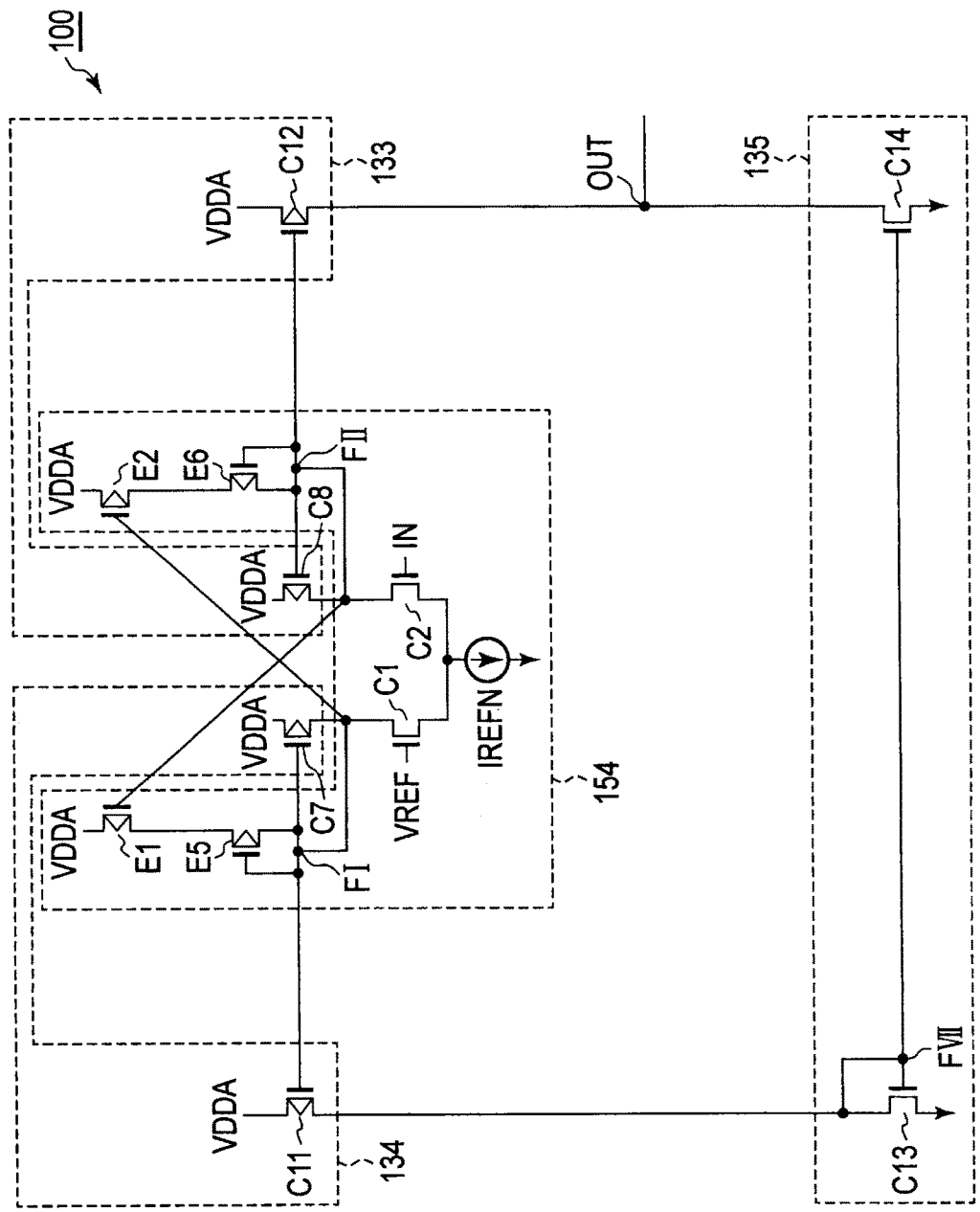
[Embodiment 8-2]
F I G. 32B

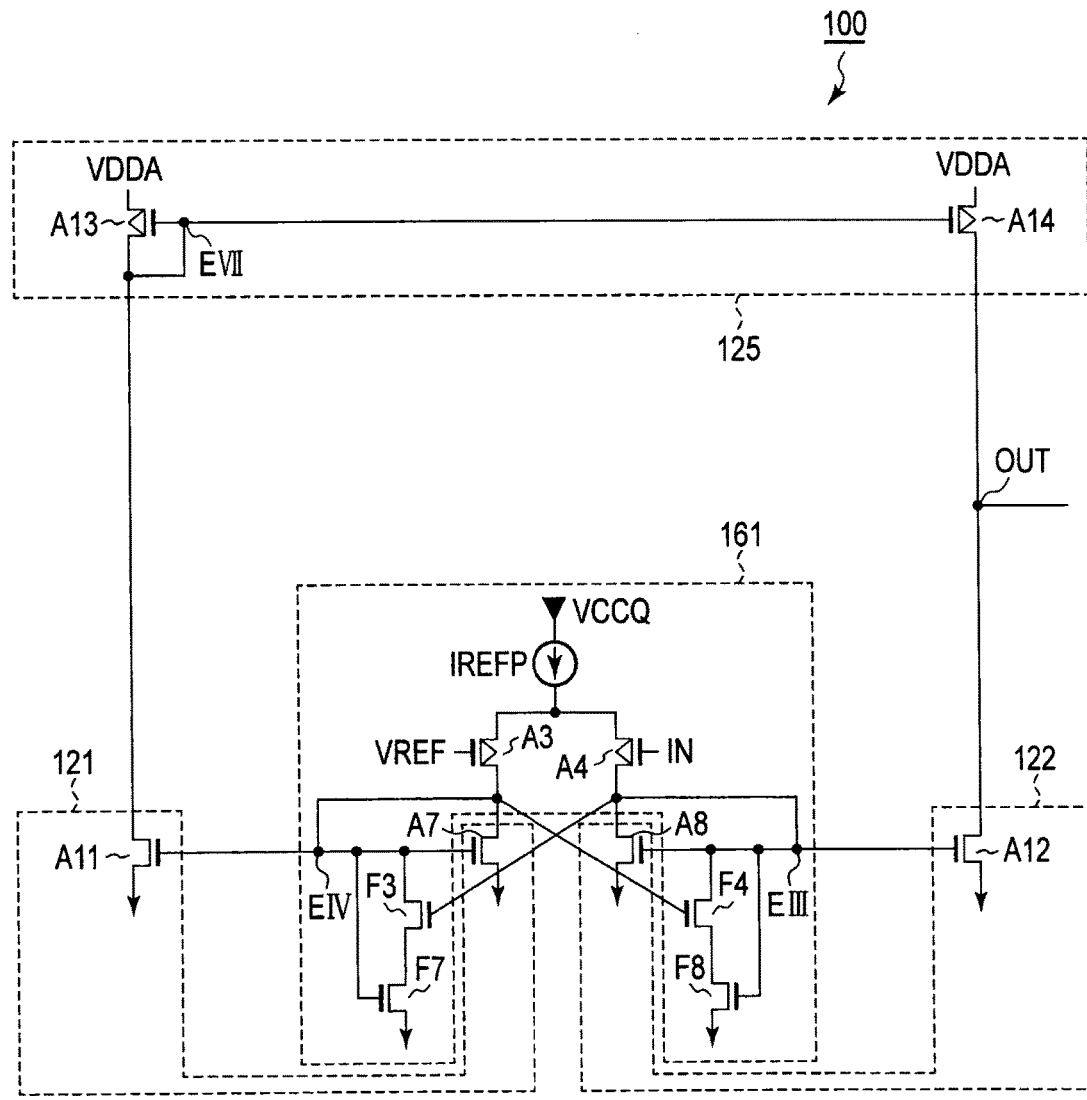
F I G. 33A

[Embodiment 8-4]
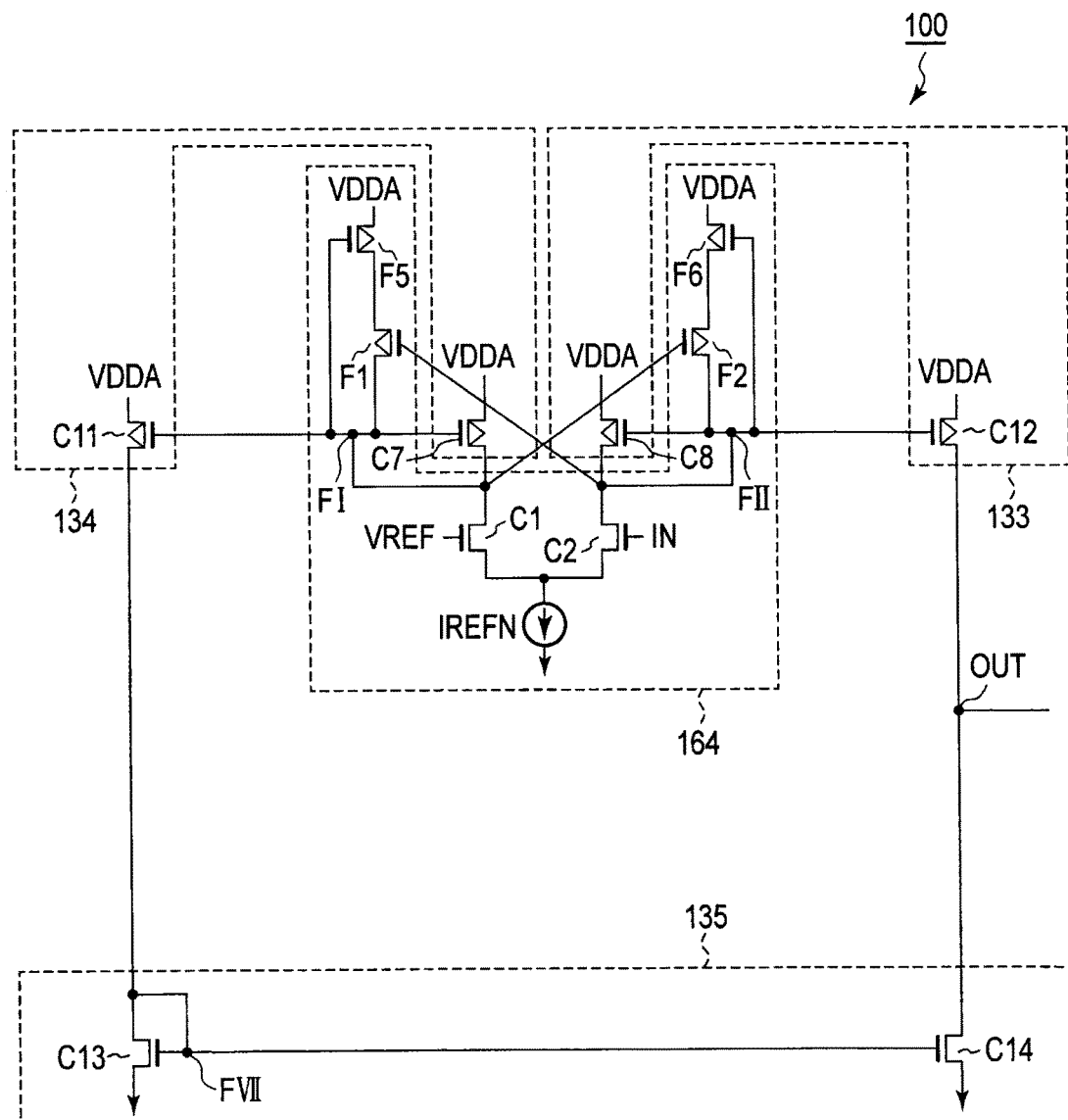
F I G. 33B

[Embodiment 8-5]
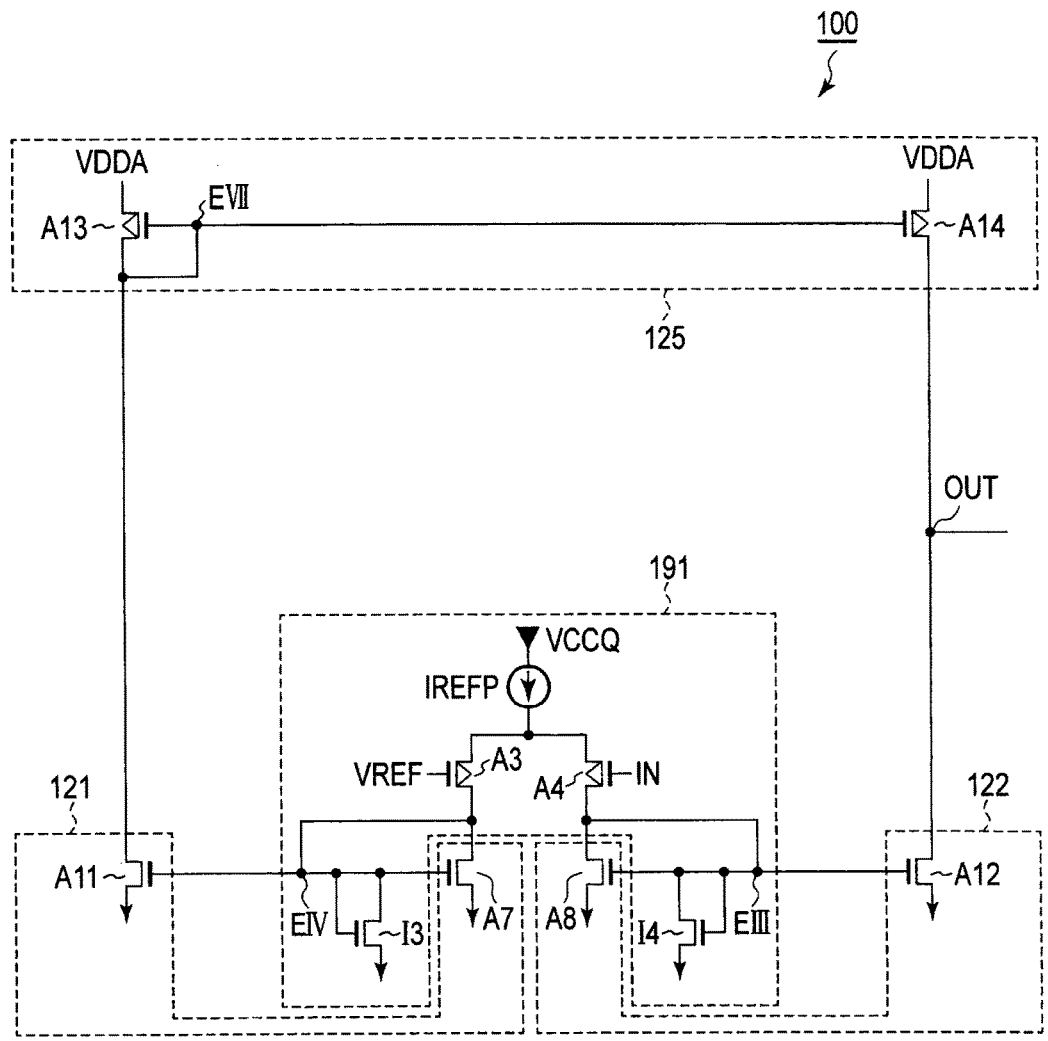
F I G. 34A

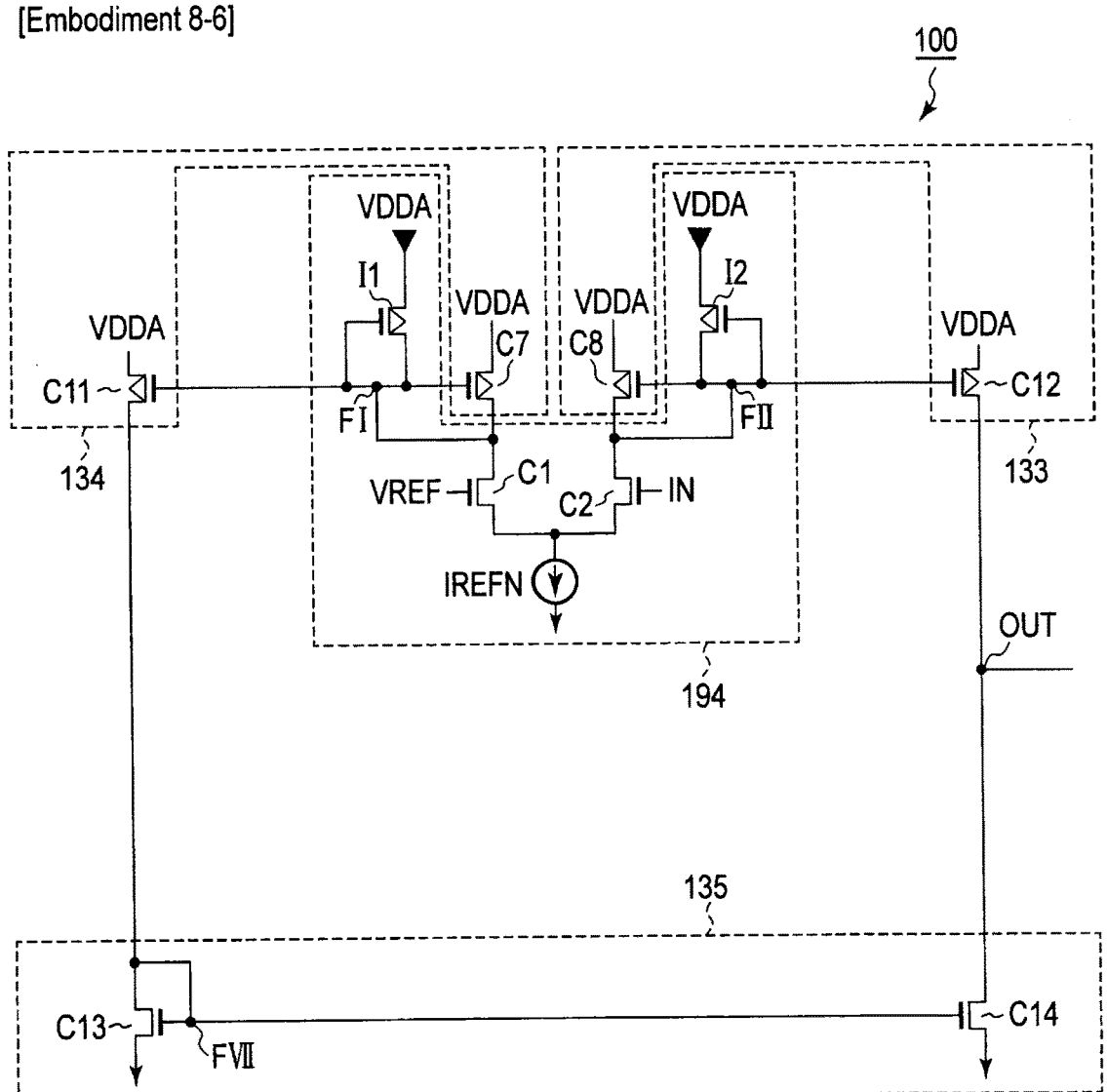
F I G. 34B

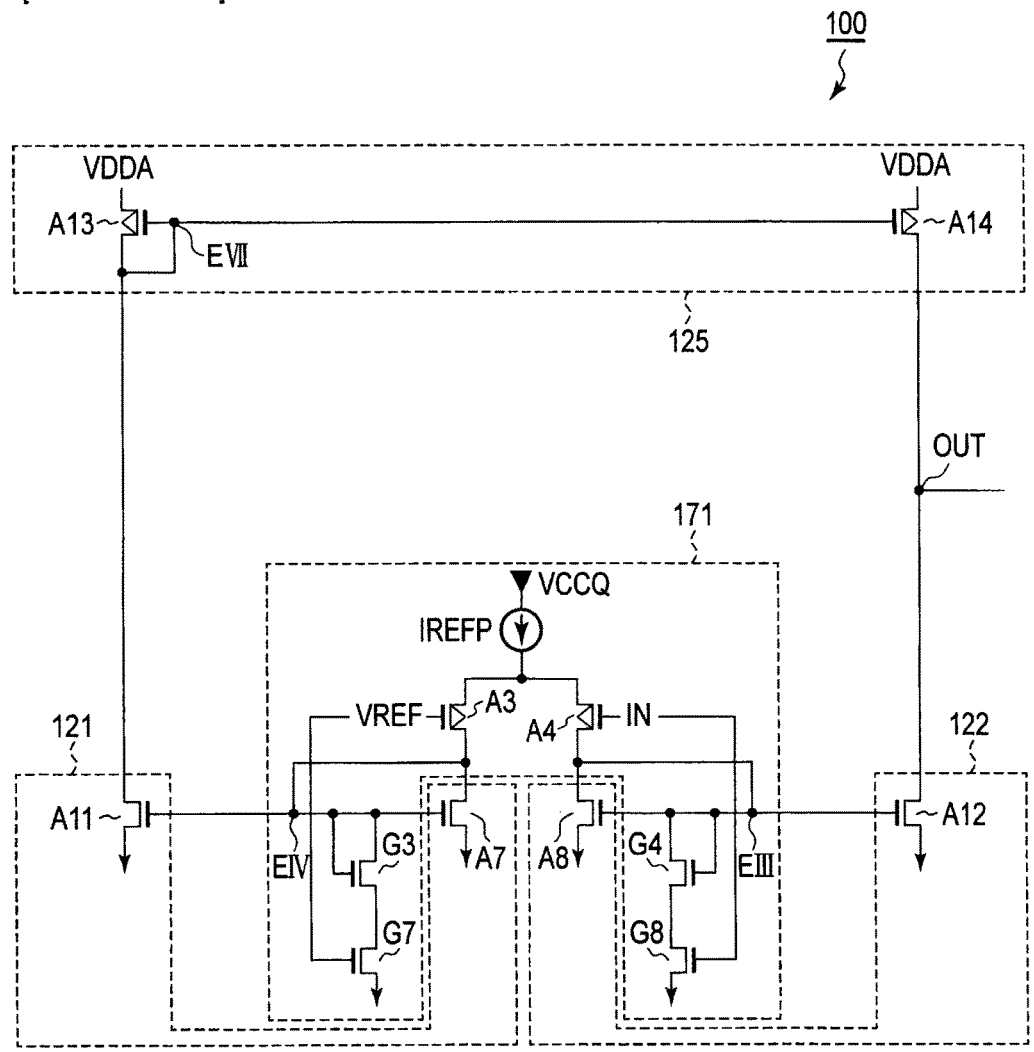
F I G. 35A

US 9,634,629 B2

SEMICONDUCTOR AMPLIFIER CIRCUIT

CROSS-REFERENCE TO RELATED APPLICATIONS

This application claims the benefit of U.S. Provisional Application No. 62/031,515, filed Jul. 31, 2014, the entire contents of which are incorporated herein by reference.

FIELD

Embodiments described herein relate generally to a semiconductor amplifier circuit.

BACKGROUND

In a nonvolatile semiconductor memory device, an input buffer circuit is used.

BRIEF DESCRIPTION OF THE DRAWINGS

FIG. 2 is an operational conceptual view of the semiconductor amplifier circuit according to the first embodiment;

FIG. 3A and FIG. 3B are circuit diagrams of a semiconductor amplifier circuit according to a second embodiment;

FIG. 5, FIG. 6A and FIG. 6B are circuit diagrams of the semiconductor amplifier circuit according to the third embodiment;

FIG. 9, FIG. 10A and FIG. 10B are circuit diagrams of a semiconductor amplifier circuit according to a fifth embodiment;

FIG. 11 is an operational conceptual view of the semiconductor amplifier circuit according to the fifth embodiment;

FIG. 12, FIG. 13A and FIG. 13B are circuit diagrams of a semiconductor amplifier circuit according to a sixth embodiment;

FIG. 14, FIG. 15A, FIG. 15B, FIG. 16A, FIG. 16B, FIG. 17, FIG. 18A, FIG. 18B, FIG. 19A, FIG. 19B, FIG. 20, FIG. 21A, FIG. 21B, FIG. 22A, FIG. 22B, FIG. 23, FIG. 24A, FIG. 24B, FIG. 25A, FIG. 25B, FIG. 26, FIG. 27A, FIG. 27B, FIG. 28A, FIG. 28B, FIG. 29, FIG. 30A, FIG. 30B, FIG. 31A and FIG. 31B are circuit diagrams of a semiconductor amplifier circuit according to a seventh embodiment; and FIG. 32A, FIG. 32B, FIG. 33A, FIG. 33B, FIG. 34A, FIG. 34B, FIG. 35A and FIG. 35B are circuit diagrams of a voltage generator circuit according to an eighth embodiment.

DETAILED DESCRIPTION

In general, according to one embodiment, a semiconductor amplifier circuit includes: a first amplifier circuit including first and second P-type transistors to which an input signal from an outside and a reference voltage are supplied, respectively; a second amplifier circuit including first and second N-type transistors to which the input signal and reference voltage are supplied, respectively; and first to seventh current mirror circuits.

The first current mirror circuit is connected to a drain of the first P-type transistor. The second current mirror circuit is connected to a drain of the second P-type transistor. The third current mirror circuit is connected to a drain of the first N-type transistor. The fourth current mirror circuit is connected to a drain of the second N-type transistor. The sixth current mirror circuit is connected to the first, fourth and fifth current mirror circuits. The seventh current mirror circuit is connected to the second, third and fifth current mirror circuits.

[1] First Embodiment

In a first embodiment, there are provided current mirror circuits which separate and independently control mirror circuits configured to mirror an output of an amplifier circuit which accepts an external input by a P-type transistor, and mirror circuits configured to mirror an output of an amplifier circuit which accepts the external input by an N-type transistor.

[1-1] Structure

[1-1-1] Embodiment 1-1

Figure 1A:
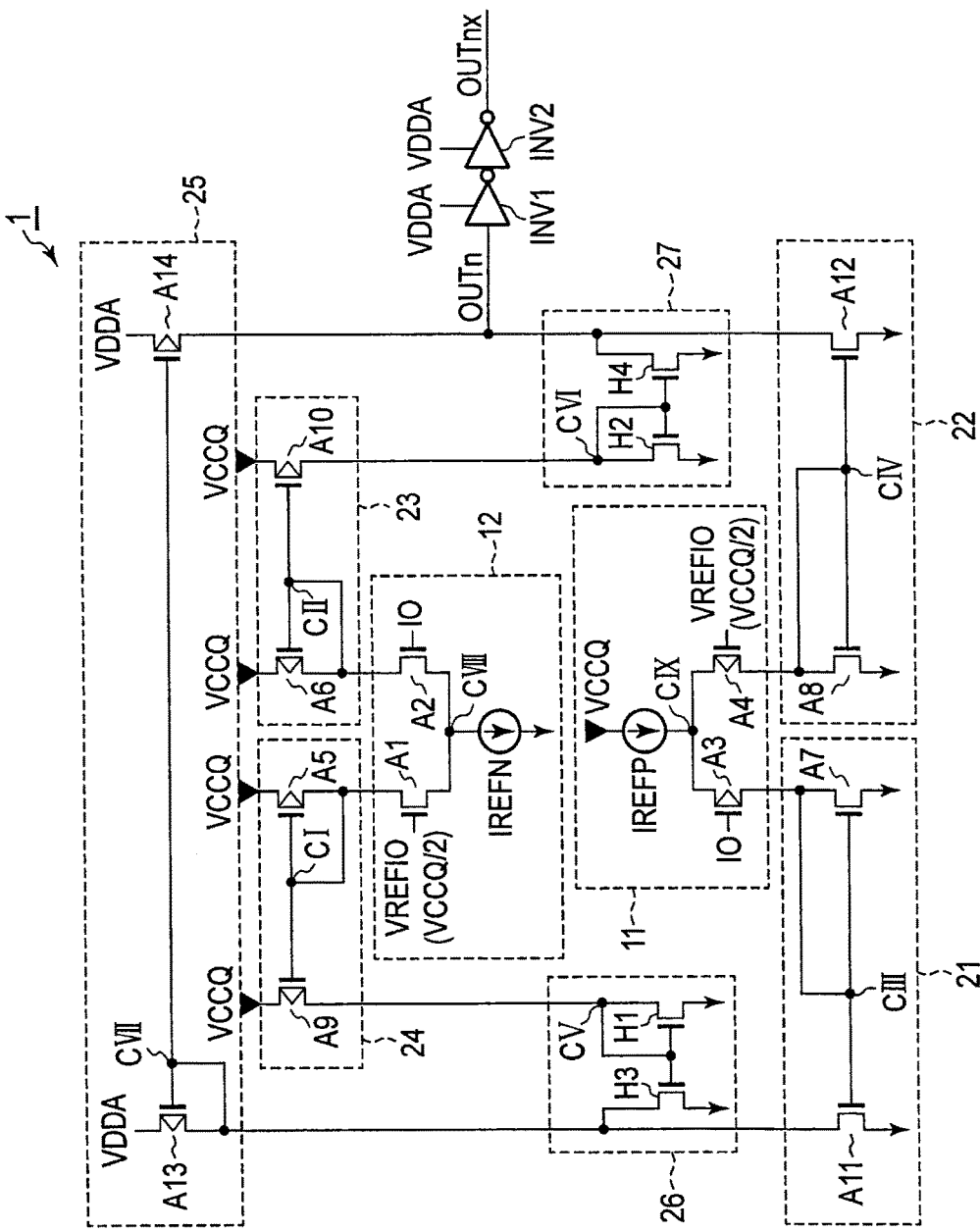
FIG. 1A and FIG. 1B are circuit diagrams of a semiconductor amplifier circuit according to a first embodiment.

Referring to FIG. 1A, a description is given of a structure embodiment 1-1 of a semiconductor amplifier circuit 1 according to the first embodiment. This semiconductor amplifier circuit 1 is used, for example, as an input buffer circuit of a nonvolatile memory.

As illustrated in FIG. 1A, the semiconductor amplifier circuit 1 includes an amplifier circuit 11 which accepts an external input by a P-type transistor (e.g. MOS transistor) A3, an amplifier circuit 12 which accepts the external input by an N-type transistor (e.g. MOS transistor) A2, and current mirror circuits 21 to 27.

The amplifier circuit 11 includes a P-type transistor A3 which receives an input signal IO from the outside, a P-type transistor A4 which receives a reference (comparative, standard) voltage VREFIO, and a constant current source IREFP. The constant current source IREFP has one end connected to a power supply terminal, and the other end connected to a source of the P-type transistor A3 and a source of the P-type transistor A4. The amplifier circuit 11 differential-amplifies the input signal IO.

The amplifier circuit 12 includes an N-type transistor A2 which receives the input signal IO from the outside, an N-type transistor A1 which receives the reference voltage VREFIO, and a constant current source IREFN. The constant current source IREFN has one end connected to a ground terminal, and the other end connected to a source of the N-type transistor A1 and a source of the N-type transistor A2. The amplifier circuit 12 differential-amplifies the input signal IO.

The current mirror circuit 21 includes an N-type transistor A7 and an N-type transistor A11. The N-type transistor A7 has a gate and a drain connected to a drain of the P-type transistor A3, and has a source connected to the ground terminal. The N-type transistor A11 has a gate connected to the gate of the N-type transistor A7, and has a source connected to the ground terminal.

The current mirror circuit 22 includes an N-type transistor A8 and an N-type transistor A12. The N-type transistor A8 has a gate and a drain connected to a drain of the P-type transistor A4, and has a source connected to the ground terminal. The N-type transistor A12 has a gate connected to the gate of the N-type transistor A8, and has a source connected to the ground terminal.

The current mirror circuit 23 includes a P-type transistor A6 and a P-type transistor A10. The P-type transistor A6 has a gate and a drain connected to a drain of the N-type transistor A2, and has a source connected to a power supply terminal. The P-type transistor A10 has a gate connected to the gate of the P-type transistor A6, and has a source connected to the power supply terminal.

The current mirror circuit 24 includes a P-type transistor A5 and a P-type transistor A9. The P-type transistor A5 has a gate and a drain connected to a drain of the N-type transistor A1, and has a source connected to the power supply terminal. The P-type transistor A9 has a gate connected to the gate of the P-type transistor A5, and has a source connected to the power supply terminal.

The current mirror circuit 25 includes a P-type transistor A13 and a P-type transistor A14. The P-type transistor A13 has a gate and a drain connected to a drain of the N-type transistor A11, and has a source connected to the power supply terminal. The P-type transistor A14 has a gate connected to the gate of the P-type transistor A13, has a source connected to the power supply terminal, and has a drain connected to a drain of the N-type transistor A12.

The current mirror circuit 26 includes an N-type transistor H1 and an N-type transistor H3. The N-type transistor H1 has a gate and a drain connected to a drain of the P-type transistor A9, and has a source connected to the ground terminal. The N-type transistor H3 has a gate connected to the gate of the N-type transistor H1, has a drain connected to the drain of the N-type transistor A11, and has a source connected to the ground terminal.

The current mirror circuit 27 includes an N-type transistor H2 and an N-type transistor H4. The N-type transistor H2 has a gate and a drain connected to a drain of the P-type transistor A10, and has a source connected to the ground terminal. The N-type transistor H4 has a gate connected to the gate of the N-type transistor H2, has a drain connected to the drain of the N-type transistor A12, and has a source connected to the ground terminal.

An input terminal of an inverter INV1 is connected to the drain of the N-type transistor H4, and an output terminal of the inverter INV1 is connected to an input terminal of an inverter INV2.

In this structure embodiment 1-1, the current mirror circuits 26 and 27, which are composed of the N-type transistors H1 to H4, separate and independently control the current mirror circuits 21 and 22 configured to mirror the output of the amplifier circuit 11 which accepts the external input by the P-type transistor A3, and the current mirror circuits 23 and 24 configured to mirror the output of the amplifier circuit 12 which accepts the external input by the N-type transistor A2.

In the meantime, the voltage value of the power supply terminal, which is connected to the constant current source IREFP, and the power supply terminals, which are connected to the sources of the P-type transistors A5, A6, A9 and A10, is, for example, VCCQ. The voltage value of the power supply terminal, which is connected to the sources of the P-type transistors A13 and A14, and power supply terminals of the inverters INV1 and INV2 is, for example, VDDA. The voltage value of the reference voltage VREFIO is, for example, VCCQ/2. However, the voltage values VCCQ, VDDA and VCCQ/2 are not limited to these embodiments, and may be variously altered.

[1-1-2] Embodiment 1-2

Figure 1B:
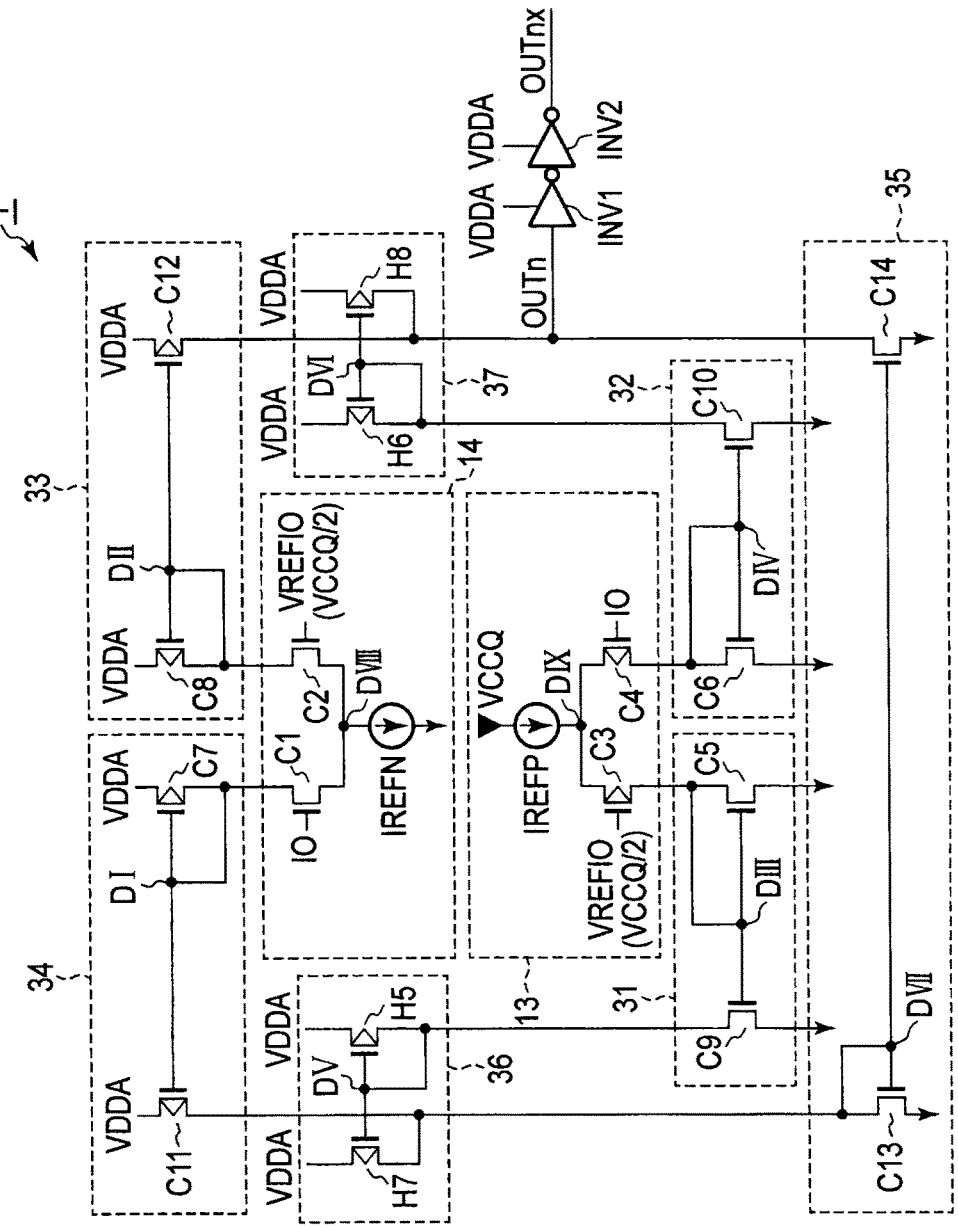

Referring to FIG. 1B, a description is given of a structure embodiment 1-2 of the semiconductor amplifier circuit 1 according to the first embodiment. Incidentally, in the structure embodiment 1-1, the current mirror circuits 26 and 27, which are composed of the N-type transistors, are used in order to independently control the current mirror circuits 21 and 22 and the current mirror circuits 23 and 24. By contrast, in the structure embodiment 1-2, current mirror circuits 36 and 37, which are composed of P-type transistors, are used.

As illustrated in FIG. 1B, the semiconductor amplifier circuit 1 includes an amplifier circuit 13 which accepts an external input by a P-type transistor C4, an amplifier circuit 14 which accepts the external input by an N-type transistor C1, and current mirror circuits 31 to 37.

The amplifier circuit 13 includes a P-type transistor C4 which receives an input signal IO from the outside, a P-type transistor C3 which receives a reference voltage VREFIO, and a constant current source IREFP. The constant current source IREFP has one end connected to a power supply terminal, and the other end connected to a source of the P-type transistor C3 and a source of the P-type transistor C4.

The amplifier circuit 14 includes the N-type transistor C1 which receives the input signal IO from the outside, a N-type transistor C2 which receives the reference voltage VREFIO, and a constant current source IREFN. The constant current source IREFN has one end connected to a ground terminal, and the other end connected to a source of the N-type transistor C1 and a source of the N-type transistor C2.

The current mirror circuit 31 includes an N-type transistor C5 and an N-type transistor C9. The N-type transistor C5 has a gate and a drain connected to a drain of the P-type transistor C3, and has a source connected to the ground terminal. The N-type transistor C9 has a gate connected to the gate of the N-type transistor C5, and has a source connected to the ground terminal.

The current mirror circuit 32 includes an N-type transistor C6 and an N-type transistor C10. The N-type transistor C6 has a gate and a drain connected to a drain of the P-type transistor C4, and has a source connected to the ground terminal. The N-type transistor C10 has a gate connected to the gate of the N-type transistor C6, and has a source connected to the ground terminal.

The current mirror circuit 33 includes a P-type transistor C8 and a P-type transistor C12. The P-type transistor C8 has a gate and a drain connected to a drain of the N-type transistor C2, and has a source connected to the power supply terminal. The P-type transistor C12 has a gate connected to the gate of the P-type transistor C8, and has a source connected to the power supply terminal.

The current mirror circuit 34 includes a P-type transistor C7 and a P-type transistor C11. The P-type transistor C7 has a gate and a drain connected to a drain of the N-type transistor C1, and has a source connected to the power supply terminal. The P-type transistor C11 has a gate connected to the gate of the P-type transistor C7, and has a source connected to the power supply terminal.

The current mirror circuit 35 includes an N-type transistor C13 and an N-type transistor C14. The N-type transistor C13 has a gate and a drain connected to a drain of the P-type transistor C11, and has a source connected to the ground terminal. The N-type transistor C14 has a gate connected to the gate of the N-type transistor C13, has a source connected to the ground terminal, and has a drain connected to a drain of the P-type transistor C12.

The current mirror circuit 36 includes a P-type transistor H5 and a P-type transistor H7. The P-type transistor H5 has a gate and a drain connected to a drain of the N-type transistor C9, and has a source connected to the power supply terminal. The P-type transistor H7 has a gate connected to the gate of the P-type transistor H5, has a drain connected to the drain of the P-type transistor C11, and has a source connected to the power supply terminal.

The current mirror circuit 37 includes a P-type transistor H6 and a P-type transistor H8. The P-type transistor H6 has a gate and a drain connected to a drain of the N-type transistor C10, and has a source connected to the power supply terminal. The P-type transistor H8 has a gate connected to the gate of the P-type transistor H6, has a drain connected to the drain of the P-type transistor C12, and has a source connected to the power supply terminal.

An input terminal of an inverter INV1 is connected to the drain of the P-type transistor H8, and an output terminal of the inverter INV1 is connected to an input terminal of an inverter INV2.

In this structure embodiment 1-2, the current mirror circuits 36 and 37, which are composed of the P-type transistors H5 to H8, separate and independently control the current mirror circuits 31 and 32 configured to mirror the output of the amplifier circuit 13 which accepts the external input by the P-type transistor C4, and the current mirror circuits 33 and 34 configured to mirror the output of the amplifier circuit 14 which accepts the external input by the N-type transistor C1.

In the meantime, the voltage value of the power supply terminal, which is connected to the constant current source IREFP, is, for example, VCCQ. The voltage value of the power supply terminal, which is connected to the sources of the P-type transistors C7, C8, C11, C12, H5, H6, H7 and H8, and power supply terminals of the inverters INV1 and INV2 is, for example, VDDA. The voltage value of the reference voltage VREFIO is, for example, VCCQ/2. However, the voltage values VCCQ, VDDA and VCCQ/2 are not limited to these embodiments, and may be variously altered.

[1-2] Operation

[1-2-1] Embodiment 1-1

Referring to FIG. 1A and FIG. 2, a description is given of the operation of the structure embodiment 1-1 of the semiconductor amplifier circuit 1 according to the first embodiment.

In the amplifier circuit 11, when a signal, which is input to the P-type transistor A3, has changed from "H" to "L", the P-type transistor A3 enters an ON state. Thus, the charge of a node CIII is charged and goes to "H" level. If the node CIII changes to "H" level, the N-type transistor A11 enters an ON state. Thus, the charge of a node CVII is discharged and goes to "L" level. If the node CVII goes to "L" level, the P-type transistor A14 enters an ON state. If the P-type transistor A3 enters the ON state, a current flowing in the P-type transistor A4 decreases. Thus, the charge of a node CIV is discharged and goes to "L" level. If the node CIV changes to "L" level, the N-type transistor A12 enters an OFF state. Thus, the charge of a node OUTn is charged and goes to "H" level.

On the other hand, when the signal, which is input to the P-type transistor A3, has changed from "L" to "H", the P-type transistor A3 enters an OFF state. Thus, the charge of the node CIII is discharged and goes to "L" level. If the node CIII changes to "L" level, the N-type transistor A11 enters an OFF state. Thus, the charge of the node CVII is charged and goes to "H" level. If the node CVII goes to "H" level, the P-type transistor A14 enters an OFF state. If the P-type transistor A3 enters the OFF state, a current flowing in the P-type transistor A4 increases. Thus, the charge of the node CIV is charged and goes to "H" level. If the node CIV changes to "H" level, the N-type transistor A12 enters an ON state. Thus, the charge of the node OUTn is discharged and goes to "L" level.

In the amplifier circuit 12, when a signal, which is input to the N-type transistor A2, has changed from "H" to "L", the N-type transistor A2 enters an OFF state. Thus, the charge of a node CII is charged and goes to "H" level. If the node CII changes to "H" level, the P-type transistor A10 enters an OFF state. Thus, the charge of a node CVI is discharged and goes to "L" level. If the node CVI goes to "L" level, the N-type transistor H4 enters an OFF state. If the N-type transistor A2 enters the OFF state, a current flowing in the N-type transistor A1 increases. Thus, the charge of a node CI is discharged and goes to "L" level. If the node CI goes to "L" level, the P-type transistor A9 enters an ON state. Thus, the charge of a node CV is charged and goes to "H" level. If the node CV goes to "H" level, the N-type transistor H3 enters an ON state, and the charge of the node CVII is discharged and goes to "L" level. If the node CVII goes to "L" level, the P-type transistor A14 enters an ON state, and the charge of the node OUTn is charged and goes to "H" level.

On the other hand, when the signal, which is input to the N-type transistor A2, has changed from "L" to "H", the N-type transistor A2 enters an ON state. Thus, the charge of the node CII is discharged and goes to "L" level. If the node CII goes to "L" level, the P-type transistor A10 enters an ON state. Thus, the charge of the node CVI is charged and goes to "H" level. If the node CVI goes to "H" level, the N-type transistor H4 enters an ON state, and the charge of the node OUTn is discharged and goes to "L" level. If the N-type transistor A2 enters the ON state, a current flowing in the N-type transistor A1 decreases. Thus, the charge of the node CI is charged and goes to "H" level. If the node CI changes to "H" level, the P-type transistor A9 enters an OFF state. Thus, the charge of the node CV is discharged and goes to "L" level. If the node CV goes to "L" level, the N-type transistor H3 enters an OFF state, and the charge of the node CVII is charged and goes to "H" level. If the node CVII goes to "H" level, the P-type transistor A14 enters an OFF state, and the charge of the node OUTn is charged and goes to "H" level.

[1-2-2] Embodiment 1-2

Referring to FIG. 1B, a description is given of the operation of the structure embodiment 1-2 of the semiconductor amplifier circuit 1 according to the first embodiment.

In the amplifier circuit 13, when a signal, which is input to the P-type transistor C4, has changed from "H" to "L", the P-type transistor C4 enters an ON state. Thus, the charge of a node DIV is charged and goes to "H" level. If the node DIV goes to "H" level, the N-type transistor C10 enters an ON state. Thus, the charge of a node DVI is discharged and goes to "L" level. If the P-type transistor C4 enters the ON state, a current flowing in the P-type transistor C3 decreases. Thus, the charge of a node DIII is discharged and goes to "L" level. If the node CIII changes to "L" level, the N-type transistor C9 enters an OFF state. Thus, the charge of a node DV is charged and goes to "H" level. If the node DV goes to "H" level, the P-type transistor H7 enters an OFF state, and the charging from the P-type transistor H7 stops.

On the other hand, when the signal, which is input to the P-type transistor C4, has changed from "L" to "H", the P-type transistor C4 enters an OFF state. Thus, the charge of the node DIV is discharged and goes to "L" level. If the node DIV goes to "L" level, the N-type transistor C10 enters an OFF state. Thus, the charge of the node DVI is charged and goes to "H" level. If the node DVI goes to "H" level, the P-type transistor H8 enters an OFF state, and the charging from the P-type transistor H8 stops. If the P-type transistor C4 enters the OFF state, a current flowing in the P-type transistor C3 increases. Thus, the charge of the node DIII is charged and goes to "H" level. If the node DIII goes to "H" level, the N-type transistor C9 enters an ON state. Thus, the charge of the node DV is discharged and goes to "L" level. If the node DV goes to "L" level, the P-type transistor H7 enters an ON state, and a node DVII is charged and goes to "H" level. If the node DVII goes to "H" level, the N-type transistor C14 enters an ON state, and the node OUTn is discharged and goes to "L" level.

In the amplifier circuit 14, when a signal, which is input to the N-type transistor C1, has changed from "H" to "L", the N-type transistor C1 enters an OFF state. Thus, the charge of a node DI is charged and goes to "H" level. If the node DI goes to "H" level, the P-type transistor C11 enters an OFF state. Thus, the charge of a node DVII is discharged and goes to "L" level. If the node DVII goes to "L" level, the N-type transistor C14 enters an OFF state, and the discharging from the N-type transistor C14 stops. If the N-type transistor C1 enters the OFF state, a current flowing in the N-type transistor C2 increases. Thus, the charge of a node DII is discharged and goes to "L" level. If the node DII changes to "L" level, the P-type transistor C12 enters an ON state. Thus, the charge of the node OUTn is charged and goes to "H" level.

On the other hand, when the signal, which is input to the N-type transistor C1, has changed from "L" to "H", the N-type transistor C1 enters an ON state. Thus, the charge of the node DI is discharged and goes to "L" level. If the node DI goes to "L" level, the P-type transistor C11 enters an ON state. Thus, the charge of a node DVII is charged and goes to "H" level. If the node DVII goes to "H" level, the N-type transistor C14 enters an ON state, and the node OUTn is discharged and goes to "L" level. If the N-type transistor C1 enters the ON state, a current flowing in the N-type transistor C2 decreases. Thus, the charge of the node DII is charged and goes to "H" level. If the node DII goes to "H" level, the P-type transistor C12 enters an OFF state. Thus, the charging from the P-type transistor C12 stops.

[1-3] Advantageous Effects of the First Embodiment

In the structure embodiment 1-1 of the semiconductor amplifier circuit 1 according to the first embodiment, as illustrated in FIG. 1A, the current mirror circuit 26, which is composed of the N-type transistors H1 and H3, and the current mirror circuit 27, which is composed of the N-type transistors H2 and H4, are added. Thereby, the current mirror circuits 21 and 22, which are connected to the amplifier circuit 11, and the current mirror circuits 26 and 27, which are connected to the amplifier circuit 12, can be separated and independently controlled.

Specifically, the current mirror circuit 26, which receives, by the N-type transistors H1 and H3, one output (the drain of P-type transistor A9) of the amplifier circuit 12 side which accepts the external input by the N-type transistor A2, and the current mirror circuit 21, which receives, by the N-type transistors A7 and A11, one output (the drain of P-type transistor A3, the drain and gate of P-type transistor A7) of the amplifier circuit 11 side which accepts the external input by the P-type transistor A3, are separated and can be independently controlled. Thereby, even if the potential level of the node CIII, which is determined by the amplifier circuit 11 (the constant current source IREFP and the ON resistance of P-type transistor A3 and N-type transistor A7), rises, in particular, when the external input is "L", no such effect occurs as to decrease the source-drain voltage of the P-type transistor A9. Thus, the P-type transistor A9 can correctly mirror the current of the P-type transistor A5. In addition, the current mirror circuit 27, which receives, by the N-type transistors H2 and H4, the other output (the drain of P-type transistor A10) of the amplifier circuit 12 side which accepts the external input by the N-type transistor A2, and the current mirror circuit 22, which receives, by the N-type transistors A8 and A12, the other output (the drain of P-type transistor A4, the drain and gate of P-type transistor A8) of the amplifier circuit 11 side which accepts the external input by the P-type transistor A3, are separated and can be independently controlled. Thereby, even if the potential level of the node CIV, which is determined by the amplifier circuit 11 (the constant current source IREFP and the ON resistance of P-type transistor A4 and N-type transistor A8), rises, in particular, when the external input is "H", no such effect occurs as to decrease the source-drain voltage of the P-type transistor A10. Thus, the P-type transistor A10 can correctly mirror the current of the P-type transistor A6. As a result, a response to the external input IO becomes quicker, and a high-speed operation is enabled.

Similarly, in the structure embodiment 1-2 of the semiconductor amplifier circuit 1 according to the first embodiment, as illustrated in FIG. 1B, the current mirror circuit 36, which is composed of the P-type transistors H5 and H7, and the current mirror circuit 37, which is composed of the P-type transistors H6 and H8, are added. Thereby, the current mirror circuits 36 and 37, which are connected to the amplifier circuit 13, and the current mirror circuit 33 and 34, which are connected to the amplifier circuit 14, can be separated and independently controlled. Thereby, the source-drain voltage of the N-type transistor C9 is not affected by a variation in potential level of the node DI, and the source-drain voltage of the N-type transistor C10 is not affected by a variation in potential level of the node DII. Thus, the N-type transistor C9 can correctly mirror the current of the N-type transistor C5, and the N-type transistor C10 can correctly mirror the current of the N-type transistor C6. As a result, a response to the external input IO becomes quicker, and a high-speed operation is enabled.

Furthermore, in the structure embodiment 1-1 and structure embodiment 1-2 of the semiconductor amplifier circuit 1 according to the first embodiment, as described above, the current mirror circuits 26, 27, 36 and 37 are provided so that the outputs of the amplifier circuits 11 and 13, which accept the external input by the P-type transistors, and the outputs of the amplifier circuits 12 and 14, which accept the external input by the N-type transistors, can be independently controlled. Thereby, since the operation voltage of the semiconductor amplifier circuit 1 can be lowered, it becomes possible to adapt to a low voltage.

As has been described above, by using the semiconductor amplifier circuit 1 according to the first embodiment, it becomes possible to realize a higher speed of an interface (I/F) and a lower power consumption of a chip, for example, in a nonvolatile semiconductor memory device.

[2] Second Embodiment

In a second embodiment, a cross-coupling circuit is provided in each of amplifier circuits which receive an external input by a P-type transistor and an N-type transistor, thereby detecting a potential variation on a circuit side which receives the external input, charging and discharging a potential on a circuit side which receives a reference voltage, and increasing, in particular, an amplitude of a node on a reference voltage side. In the description below, only the points different from the first embodiment will be described.

[2-1] Structure

[2-1-1] Embodiment 2-1

Figure 3A:
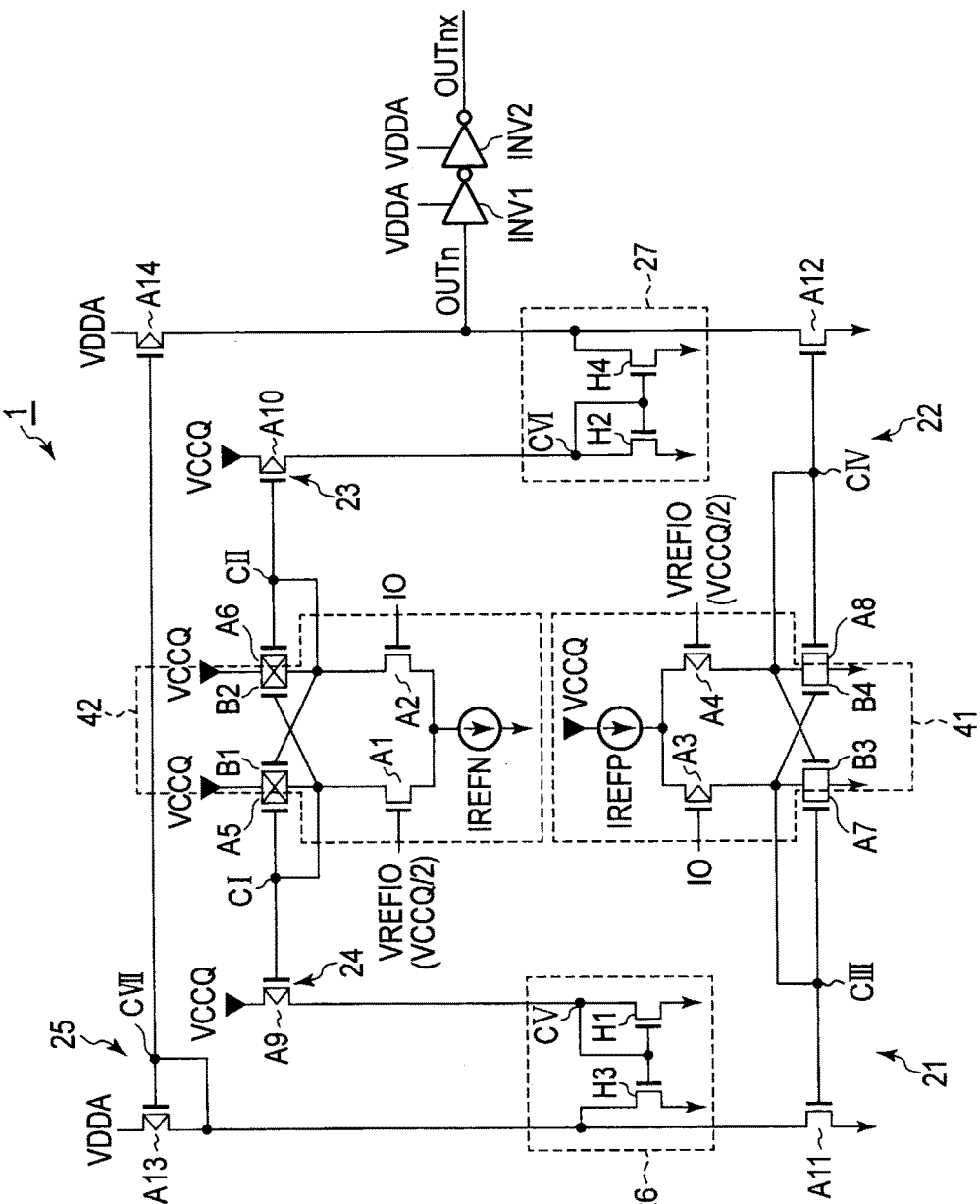

Referring to FIG. 3A, a description is given of a structure embodiment 2-1 of a semiconductor amplifier circuit 1 according to the second embodiment. This structure embodiment 2-1 is a modification of the structure embodiment 1-1.

As illustrated in FIG. 3A, the structure embodiment 2-1 differs from the structure embodiment 1-1 with respect to the structure of amplifier circuits 41, 42 which accept the external input, and in that the amplifier circuits 41, 42 include cross-coupling circuits.

Specifically, the amplifier circuit 41 includes a cross-coupling circuit including a P-type transistor A3, a P-type transistor A4, an N-type transistor B3 and an N-type transistor B4, and the amplifier circuit 42 includes a cross-coupling circuit including an N-type transistor A1, an N-type transistor A2, a P-type transistor B1 and a P-type transistor B2.

In this case, the N-type transistor B3 has a gate connected to a drain of the P-type transistor A4, has a drain connected to a drain of the P-type transistor A3, and has a source connected to a ground terminal.

The N-type transistor B4 has a gate connected to the drain of the P-type transistor A3, has a drain connected to the drain of the P-type transistor A4, and has a source connected to the ground terminal.

The P-type transistor B1 has a gate connected to a drain of the N-type transistor A2, has a drain connected to a drain of the N-type transistor A1, and has a source connected to a power supply terminal.

The P-type transistor B2 has a gate connected to the drain of the N-type transistor A1, has a drain connected to the drain of the N-type transistor A2, and has a source connected to a power supply terminal.

In this structure embodiment 2-1, the transistors B1, B2, B3 and B4, which constitute the cross-coupling circuits, detect potential variations of the N-type transistor A2 which receives an external input IO, the N-type transistor A1 which receives a reference voltage VREFIO, the P-type transistor A4 which receives the reference voltage VREFIO, and the P-type transistor A3 which receives the external input IO, charge the nodes CI and CII up to a power supply voltage VCCQ ("H" level) and discharge the nodes CIII and CIV to a ground potential VSS ("L" level), thereby increasing the amplitudes of the nodes CI, CII, CIII and CIV.

[2-1-2] Embodiment 2-2

Referring to FIG. 3B, a description is given of a structure embodiment 2-2 of the semiconductor amplifier circuit 1 according to the second embodiment. This structure embodiment 2-2 is a modification of the structure embodiment 1-2.

As illustrated in FIG. 3B, the structure embodiment 2-2 differs from the structure embodiment 1-2 with respect to the structure of amplifier circuits 43, 44 which accept an external input, and in that the amplifier circuits 43, 44 include cross-coupling circuits.

Specifically, the amplifier circuit 43 includes a cross-coupling circuit including a P-type transistor C3, a P-type transistor C4, an N-type transistor B3 and an N-type transistor B4, and the amplifier circuit 44 includes a cross-coupling circuit including an N-type transistor C1, an N-type transistor C2, a P-type transistor B1 and a P-type transistor B2.

In this case, the N-type transistor B3 has a gate connected to a drain of the P-type transistor C4, has a drain connected to a drain of the P-type transistor C3, and has a source connected to a ground terminal.

The N-type transistor B4 has a gate connected to the drain of the P-type transistor C3, has a drain connected to the drain of the P-type transistor C4, and has a source connected to the ground terminal.

The P-type transistor B1 has a gate connected to a drain of the N-type transistor C2, has a drain connected to a drain of the N-type transistor C1, and has a source connected to a power supply terminal.

The P-type transistor B2 has a gate connected to the drain of the N-type transistor C1, has a drain connected to the drain of the N-type transistor C2, and has a source connected to the power supply terminal.

In this structure embodiment 2-2, the transistors B1, B2, B3 and B4, which constitute the cross-coupling circuits, detect potential variations of the N-type transistor C2 which receives a reference voltage VREFIO, the N-type transistor C1 which receives an external input IO, the P-type transistor C4 which receives the external input IO, and the P-type transistor C3 which receives the reference voltage VREFIO, charge the nodes DI and DII up to a power supply voltage VCCQ ("H" level) and discharge the nodes DIII and DIV to a ground potential VSS ("L" level), thereby increasing the amplitudes.

[2-2] Operation

Figure 4:
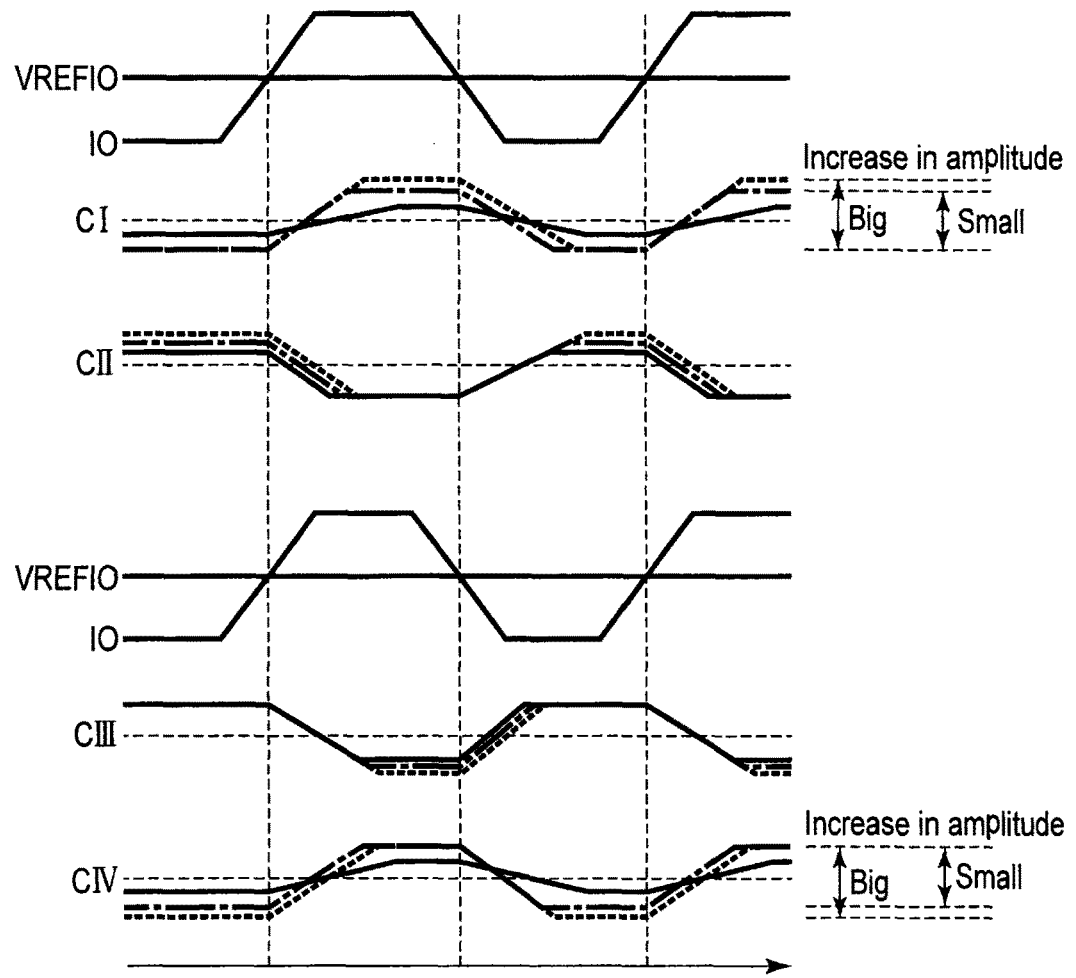
FIG. 4 is an operational conceptual view of the semiconductor amplifier circuits according to the second embodiment and a third embodiment.

Referring to FIG. 3A and FIG. 4, a description is given of the operation of the structure embodiment 2-1 of the semiconductor amplifier circuit 1 according to the second embodiment. Incidentally, FIG. 4 illustrates potential variations of the respective nodes in the structure embodiment 1-1, structure embodiment 2-1 and structure embodiment 3-1.

In the amplifier circuit 41, when a signal, which is input to the P-type transistor A3, has changed from "H" to "L", the P-type transistor A3 enters an ON state. Thus, the charge of a node CIII is charged, and goes to "H" level. If the node CIII goes to "H" level, the N-type transistor B4 enters an ON state, and discharges a node CIV to a ground voltage VSS ("L" level). If the node CIV goes to "L" level, the N-type transistor A12 enters a cut-off state. The N-type transistor A12 enters the cut-off state, and the discharging from the N-type transistor A12 stops. If the node CIII goes to "H" level, the N-type transistor A11 enters an ON state, and a node CVII is discharged and goes to "L" level. If the node CVII goes to "L" level, the P-type transistor A14 enters an ON state, and a node OUTn is charged and goes to "H" level.

On the other hand, when the signal, which is input to the P-type transistor A3, has changed from "L" to "H", the P-type transistor A3 enters an OFF state, and a current flowing in the P-type transistor A4 increases. Thus, the charge of the node CIV is charged and goes to "H" level. If the node CIV goes to "H" level, the P-type transistor B3 enters an ON state, and discharges the node CIII to the ground voltage VSS ("L" level). If the node CIII goes to "L" level, the N-type transistor A11 enters a cut-off state. If the N-type transistor A11 enters the cut-off state, the charge of the node CVII is charged and goes to "H" level. If the node CVII goes to "H" level, the P-type transistor A14 enters an OFF state, and the charging from the P-type transistor A14 stops. If the node CIV goes to "H" level, the N-type transistor A12 enters an ON state, and the charge of the node OUTn is discharged and goes to "L" level.

In the amplifier circuit 42, when a signal, which is input to the N-type transistor A2, has changed from "H" to "L", the N-type transistor A2 enters an ON state, and a current flowing in the N-type transistor A1 increases. Thus, the charge of a node CI is discharged and goes to "L" level. If the node CI goes to "L" level, the P-type transistor B2 enters an ON state, and charges a node CII up to a power supply voltage VCCQ ("H" level). If the node CII goes to "H" level, the P-type transistor A10 enters a cut-off state. If the P-type transistor A10 enters the cut-off state, the charge of the node CVI is discharged and goes to "L" level. If the node CVI goes to "L" level, the N-type transistor H4 enters an OFF state, and the discharging from the N-type transistor H4 stops. If the node CI goes to "L" level, the P-type transistor A9 enters an ON state, and a node CV is charged and goes to "H" level. If the node CV goes to "H" level, the N-type transistor H3 enters an ON state, the node CVII is discharged, and goes to "L" level. If the node CVII goes to "L" level, the P-type transistor A14 enters an ON state, and the charge of the node OUTn is charged and goes to "H" level.

On the other hand, when the signal, which is input to the N-type transistor A2, has changed from "L" to "H", the N-type transistor A2 enters an ON state. Thus, the charge of the node CII is discharged and goes to "L" level. If the node CII goes to "L" level, the P-type transistor B1 enters an ON state, and charges the node CI up to the power supply voltage VCCQ ("H" level). If the node CI goes to "H" level, the P-type transistor A9 enters a cut-off state. If the P-type transistor A9 enters the cut-off state, the charge of the node CV is discharged and goes to "L" level. If the node CV goes to "L" level, the N-type transistor H3 enters an OFF state, and the charge of the node CVII is charged and goes to "H" level. If the node CVII does to "H" level, the P-type transistor A14 enters an OFF state, the charging from the P-type transistor A14 stops. If the node CII goes to "L" level, the P-type transistor A10 enters an ON state, and the node CVI is charged and goes to "H" level. If the node CVI goes to "H" level, the N-type transistor H4 enters an ON state, and the node OUTn is discharged and goes to "L" level.

[2-3] Advantageous Effects of the Second Embodiment

For example, in the case of the structure embodiment 1-1 illustrated in FIG. 4, in particular, amplitudes at the nodes CI, CIV on the circuit side which receives the reference voltage VREFIO are smaller than amplitudes at the nodes CII, CIII on the circuit side which receives the external input IO. When the amplitude at the node CI, CII, CIII, CIV (mainly, the node CI, CIV on the reference voltage VREFIO side) is small, there is a case in which the cut-off of the transistors A9, A10, A11 and A12 delays at a time of a high-speed operation.

Thus, in the present embodiment, cross-couple transistors of B1, B2, B3 and B4 are added to the first embodiment. Thereby, the amplitudes of the nodes CI, CII, CIII and CIV (mainly, the amplitudes of the nodes CI, CIV) can be increased, the transistors A9, A10, A11 and A12 can be quickly set in the cut-off state, and a high-speed operation can be achieved.

Specifically, in the case of the structure embodiment 2-1 illustrated in FIG. 3A, the amplifier circuit 41 is equipped with the cross-coupling circuit including the P-type transistor A3, P-type transistor A4, N-type transistor B3 and N-type transistor B4, and the amplifier circuit 42 is equipped with the cross-coupling circuit including the N-type transistor A1, N-type transistor A2, P-type transistor B1 and P-type transistor B2.

Thereby, in the amplifier circuit 42 which receives the external output IO by the N-type transistor A2, when the signal that is input to the N-type transistor A2 has changed from "L" to "H", the added P-type transistor B1 is turned on, and the node CI is charged up to the power supply voltage VCCQ ("H" level). Thereby, the amplitude at the node CI increases, and the P-type transistor A9 quickly enters the cut-off state.

On the other hand, when the signal that is input to the N-type transistor A2 has changed from "H" to "L", the added P-type transistor B2 is turned on, and the node CII is charged up to the power supply voltage VCCQ ("H" level). Thereby, the amplitude at the node CII increases, and the P-type transistor A10 quickly enters the cut-off state.

Similarly, as regards the amplifier circuit 41 which receives the external output IO by the P-type transistor, the potential of the node CIV is detected by the N-type transistor B3, the node CIII is discharged to the ground voltage VSS ("L" level), and the amplitude at the node CIII is increased. Thereby, the N-type transistor A11 can quickly be set in the cut-off state. In addition, the potential of the node CIII is detected by the N-type transistor B4, the node CIV is discharged to the ground voltage VSS ("L" level), and the amplitude at the node CIV is increased. Thereby, the N-type transistor A12 can quickly be set in the cut-off state.

As has been described above, the high-speed operation can be realized by adding the cross-couple transistors of B1, B2, B3 and B4, increasing the amplitudes of the nodes CI, CII, CIII and CIV, and quickly cutting off the transistors A9, A10, A11 and A12.

Incidentally, in the structure embodiment 2-2 of the semiconductor amplifier circuit 1 of FIG. 3B, the same advantageous effects as in the structure embodiment 2-1 of FIG. 3A can be obtained.

[3] Third Embodiment

In a third embodiment, cross-coupling circuits and diode-connected transistors are added to respective amplifier circuits which receive an external input by a P-type transistor and an N-type transistor, and thereby an amplitude within a cycle is realized even in a high-speed operation region. In the description below, only the points different from the first and second embodiments will be described.

[3-1] Structure

[3-1-1] Embodiment 3-1

Figure 5:
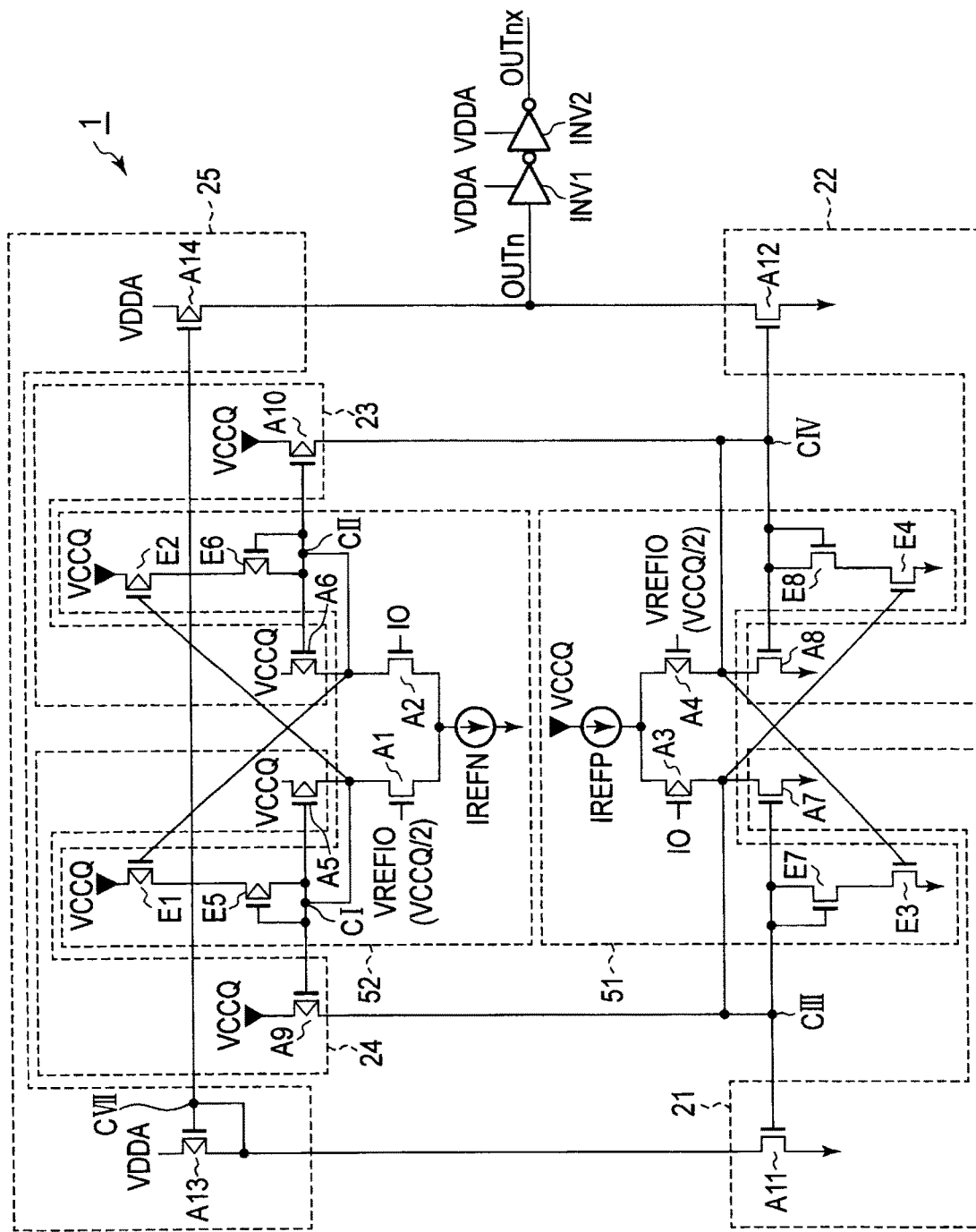

Referring to FIG. 5, a description is given of a structure embodiment 3-1 of a semiconductor amplifier circuit 1 according to the third embodiment.

As illustrated in FIG. 5, the semiconductor amplifier circuit 1 includes an amplifier circuit 51 which accepts an external input by a P-type transistor A3, an amplifier circuit 52 which accepts the external input by an N-type transistor A2, and current mirror circuits 21 to 25.

The amplifier circuit 51 includes the P-type transistor A3 which receives an input signal IO from the outside, a P-type transistor A4 which receives a reference voltage VREFIO, a constant current source IREFP, and N-type transistors E3, E4, E7 and E8.

The amplifier circuit 51 includes a cross-coupling circuit including the P-type transistor A3, P-type transistor A4, N-type transistor E3, and N-type transistor E4.

In this case, the N-type transistor E3 has a gate connected to a drain of the P-type transistor A4, and has a source connected to a ground terminal. The N-type transistor E4 has a gate connected to a drain of the P-type transistor A3, and has a source connected to the ground terminal.

The N-type transistor E7 has a gate and a drain connected to the drain of the P-type transistor A3, and has a source connected to a drain of the N-type transistor E3. The N-type transistor E7 is a diode-connected transistor which connects the P-type transistor A3 and N-type transistor E3.

The N-type transistor E8 has a gate and a drain connected to the drain of the P-type transistor A4, and has a source connected to a drain of the N-type transistor E4. The N-type transistor E8 is a diode-connected transistor which connects the P-type transistor A4 and N-type transistor E4.

The amplifier circuit 52 includes the N-type transistor A2 which receives the input signal IO from the outside, an N-type transistor A1 which receives the reference voltage VREFIO, a constant current source IREFN, and P-type transistors E1, E2, E5 and E6.

The amplifier circuit 52 includes a cross-coupling circuit including the N-type transistor A1, N-type transistor A2, P-type transistor E1, and P-type transistor E2.

In this case, the P-type transistor E1 has a gate connected to a drain of the N-type transistor A2, and has a source connected to a power supply terminal.

The P-type transistor E2 has a gate connected to a drain of the N-type transistor A1, and has a source connected to the power supply terminal.

The P-type transistor E5 has a gate and a drain connected to the drain of the N-type transistor A1, and has a source connected to a drain of the P-type transistor E1. The P-type transistor E5 is a diode-connected transistor which connects the N-type transistor A1 and P-type transistor E1.

The P-type transistor E6 has a gate and a drain connected to the drain of the N-type transistor A2, and has a source connected to a drain of the P-type transistor E2. The P-type transistor E6 is a diode-connected transistor which connects the N-type transistor A2 and P-type transistor E2.

In the current mirror circuit 21, an N-type transistor A7 has a gate and a drain connected to the drain of the P-type transistor A3, and has a source connected to the ground terminal. An N-type transistor A11 has a gate connected to the gate of the N-type transistor A7, and has a source connected to the ground terminal.

In the current mirror circuit 22, an N-type transistor A8 has a gate and a drain connected to the drain of the P-type transistor A4, and has a source connected to the ground terminal. An N-type transistor A12 has a gate connected to the gate of the N-type transistor A8, and has a source connected to the ground terminal.

In the current mirror circuit 23, a P-type transistor A6 has a gate and a drain connected to the drain of the N-type transistor A2, and has a source connected to the power supply terminal. A P-type transistor A10 has a gate connected to the gate of the P-type transistor A6, has a drain connected to the gate of the N-type transistor A12, and has a source connected to the power supply terminal.

In the current mirror circuit 24, a P-type transistor A5 has a gate and a drain connected to the drain of the N-type transistor A1, and has a source connected to the power supply terminal. A P-type transistor A9 has a gate connected to the gate of the P-type transistor A5, has a drain connected to the gate of the N-type transistor A11, and has a source connected to the power supply terminal.

In the current mirror circuit 25, a P-type transistor A13 has a gate and a drain connected to a drain of the N-type transistor A11, and has a source connected to the power supply terminal. A P-type transistor A14 has a gate connected to the gate of the P-type transistor A13, has a drain connected to the drain of the N-type transistor A12, and has a source connected to the power supply terminal.

In this structure embodiment 3-1, in the amplifier circuit 51, from the ground terminal side, the N-type transistors E3 and E4, which constitute the cross-couple transistors, and the diode-connected N-type transistors E7 and E8 are connected. In the amplifier circuit 52, from the power supply terminal side, the P-type transistors E1 and E2, which constitute the cross-couple transistors, and the diode-connected P-type transistors E5 and E6 are connected.

[3-1-2] Embodiment 3-2

Referring to FIG. 6A, a description is given of a structure embodiment 3-2 of the semiconductor amplifier circuit 1 according to the third embodiment.

As illustrated in FIG. 6A, the structure embodiment 3-2 differs from the structure embodiment 3-1 in that current mirror circuits 26 and 27, which are composed of N-type transistors H1, H2, H3 and H4, are provided so as to be able to independently control an output of the amplifier circuit 51, which receives the external input by the P-type transistor A3, and an output of the amplifier circuit 52, which receives the external input by the N-type transistor A2.

Incidentally, the structures and the relations in connection of the current mirror circuits 26 and 27 are the same as in the above-described structure embodiment 1-1 and structure embodiment 2-1.

[3-1-3] Embodiment 3-3

Referring to FIG. 6B, a description is given of a structure embodiment 3-3 of the semiconductor amplifier circuit 1 according to the third embodiment.

As illustrated in FIG. 6B, the structure embodiment 3-3 differs from the structure embodiment 3-2 in that current mirror circuits 36 and 37, which are provided so as to be able to independently control an output of the amplifier circuit 53, which receives an external input by a P-type transistor C4, and an output of the amplifier circuit 54, which receives the external input by an N-type transistor C1, are composed of P-type transistors H5, H6, H7 and H8.

Incidentally, the structures and the relations in connection of the current mirror circuits 36 and 37 are the same as in the above-described structure embodiment 2-2.

[3-2] Operation

Referring to FIG. 4, a description is given of the operation of the structure embodiment 3-1 of the semiconductor amplifier circuit 1 according to the third embodiment.

In the amplifier circuit 51, when a signal, which is input to the P-type transistor A3, has changed from "H" to "L", the P-type transistor A3 enters an ON state. Thus, the charge of a node CIII is charged, and goes to "H" level. If the node CIII goes to "H" level, the N-type transistor E4 enters an ON state, and a node CIV is discharged to a potential level ("L" level) at which a threshold voltage of the N-type transistor E8 is added to a ground voltage VSS. If the node CIV goes to "L" level, the N-type transistor A12 enters a cut-off state. If the N-type transistor A12 enters the cut-off state, the discharging from the node OUTn from the N-type transistor A12 stops. If the node CIII goes to "H" level, the N-type transistor A11 enters an ON state, a node CVII goes to "L" level, the P-type transistor A14 enters an ON state, and the charge of the node OUTn is charged and goes to "H" level.

On the other hand, when the signal, which is input to the P-type transistor A3, has changed from "L" to "H", the P-type transistor A3 enters an OFF state, and a current flowing in the P-type transistor A4 increases. Thus, the charge of the CIV is charged and goes to "H" level. If the node CIV goes to "H" level, the N-type transistor E3 enters an ON state, and the node CIII is discharged to a potential level ("L" level) at which a threshold voltage of the N-type transistor E7 is added to the ground voltage VSS. If the node CIII goes to "L" level, the N-type transistor A11 enters a cut-off state. If the N-type transistor A11 enters the cut-off state, the charge of the node CVII is charged and goes to "H" level. If the node CVII goes to "H" level, the P-type transistor A14 enters an OFF state and the discharging from the P-type transistor A14 stops. If the node CIV goes to "H" level, the N-type transistor A12 enters an ON state, and the charge of the node OUTn is discharged and goes to "L" level.

In the amplifier circuit 52, when a signal, which is input to the N-type transistor A2, has changed from "H" to "L", the N-type transistor A2 enters an OFF state, and a current flowing to the N-type transistor A1 side increases. Thus, the charge of a node CI is discharged, and goes to "L" level. If the node CI goes to "L" level, the P-type transistor E2 enters an ON state, and a node CII is charged to a potential level ("H" level) at which a threshold voltage of the P-type transistor E6 is subtracted from a power supply voltage VCCQ. If the node CII goes to "H" level, the P-type transistor A10 enters a cut-off state. If the P-type transistor A10 enters the cut-off state, the charge of the node CIV is discharged, and goes to "L" level. If the node CIV goes to "L" level, the N-type transistor A12 enters an OFF state, and the discharging from the N-type transistor A12 stops. If the node CI goes to "L" level, the P-type transistor A9 enters an ON state, and a node CIII goes to "H" level. If the node CIII goes to "H" level, the N-type transistor A11 enters an ON state, and the node CVII is discharged and goes to "L" level. If the node CVII goes to "L" level, the P-type transistor A14 enters an ON state, and the charge of the node OUTn is charged and goes to "H" level.

On the other hand, when the signal, which is input to the N-type transistor A2, has changed from "L" to "H", the N-type transistor A2 enters an ON state. Thus, the charge of the CII is discharged and goes to "L" level. If the node CII goes to "L" level, the P-type transistor E1 enters an ON state, and the node CI is charged to a potential level ("H" level) at which a threshold voltage of the P-type transistor E5 is subtracted from the power supply voltage VCCQ. If the node CI goes to "H" level, the P-type transistor A9 enters a cut-off state. If the P-type transistor A9 enters the cut-off state, the charge of the node CIII is discharged and goes to "L" level. If the node CIII goes to "L" level, the N-type transistor A11 enters an OFF state, and the charge of the node CVII is charged and goes to "H" level. If the node CVII goes to "H" level, the P-type transistor A14 enters an OFF state, and the discharging from the P-type transistor A14 stops. If the node CII goes to "L" level, the P-type transistor A10 enters an ON state, and the node CIV goes to "H" level. If the node CIV goes to "H" level, the N-type transistor A12 enters an ON state, and the charge of the node OUTn is discharged.

[3-3] Advantageous Effects of the Third Embodiment

If the amplitude of the node CI, CII, CIII, CIV is too large, there is a case in which the amplitude fails to be in time with the cycle at a time of a high-speed operation. In this case, an error occurs in the timing of a response to the external input IO, and the duty of the internal signal deteriorates, so a high-speed operation becomes difficult.

Thus, in the present embodiment, the diode-connected transistors E5, E6, E7 and E8 are added to the amplifier circuits 51 and 52, and the amplitudes of the nodes CI, CII, CIII and CIV are adjusted.

Specifically, in the case of the structure embodiment 3-1 illustrated in FIG. 5, in the amplifier circuit 52 which accepts the external input IO by the N-type transistor A2, with the addition of the diode-connected P-type transistor E5, the "H" level of the node CI is charged only up to the potential level at which the threshold voltage of the P-type transistor E5 is subtracted from the power supply voltage VCCQ. As a result, compared to the case in which the diode-connected P-type transistor E5 is absent, the amplitude of the node CI can be suppressed. Similarly, with the addition of the diode-connected P-type transistor E6, the "H" level of the node CII is charged only up to the potential level at which the threshold voltage of the P-type transistor E6 is subtracted from the power supply voltage VCCQ. As a result, compared to the case in which the diode-connected P-type transistor E6 is absent, the amplitude of the node CII can be suppressed.

On the other hand, in the amplifier circuit 51 which accepts the external input IO by the P-type transistor A3, with the addition of the diode-connected N-type transistor E7, the "L" level of the node CIII is discharged only down to the potential level at which the threshold voltage of the N-type transistor E7 is added to the ground potential VSS. As a result, compared to the case in which the diode-connected N-type transistor E7 is absent, the amplitude of the node CIII can be suppressed. Similarly, with the addition of the diode-connected N-type transistor E8, the "L" level of the node CIV is discharged only down to the potential level at which the threshold voltage of the N-type transistor E8 is added to the ground potential VSS. As a result, compared to the case in which the diode-connected N-type transistor E8 is absent, the amplitude of the node CIV can be suppressed.

In this manner, in the third embodiment, with the addition of the diode-connected transistors E5, E6, E7 and E8, as regards the charging of the nodes CI and CII, this charging can be suppressed to the value which is lower than the power supply voltage VCCQ by the threshold voltage of the P-type transistor E5 and E6. As regards the discharging of the nodes CIII and CIV, this discharging can be controlled to the value which is higher than the ground potential VSS by the threshold voltage of the N-type transistor E7 and E8. As a result, even in a high-speed operation region, the amplitude of the node CI, CII, CIII, CIV can be made to control within the cycle, the degradation of the duty of the internal signal can be suppressed to a minimum, and the high-speed operation can be realized.

Furthermore, in the third embodiment, the transistors E1, E2, E3 and E4, which constitute the cross-couple transistors, are disposed on the power supply terminal side and ground terminal side. Thereby, compared to a fourth embodiment in which diode-connected transistors F5, F6, F7 and F8 are disposed on the power supply terminal side and ground terminal side, charging is executed to a lower level as regards the node CI, CII, and discharging is executed to a higher level as regards the node CIII, CIV, and the amplitude can be suppressed.

Incidentally, in the structure embodiment 3-2 illustrated in FIG. 6A, the same advantageous effects as in the structure embodiment 3-1 illustrated in FIG. 5 and the structure embodiment 1-1 illustrated in FIG. 1A can be obtained. In the structure embodiment 3-3 illustrated in FIG. 6B, the same advantageous effects as in the structure embodiment 3-1 illustrated in FIG. 5 and the structure embodiment 1-2 illustrated in FIG. 1B can be obtained.

[4] Fourth Embodiment

A fourth embodiment differs from the semiconductor amplifier circuit of the third embodiment with respect to the order of connection of the diode-connected transistors and the cross-coupling transistors. In the description below, only the points different from the first to third embodiments will be described.

[4-1] Structure

[4-1-1] Embodiment 4-1

Figure 7:
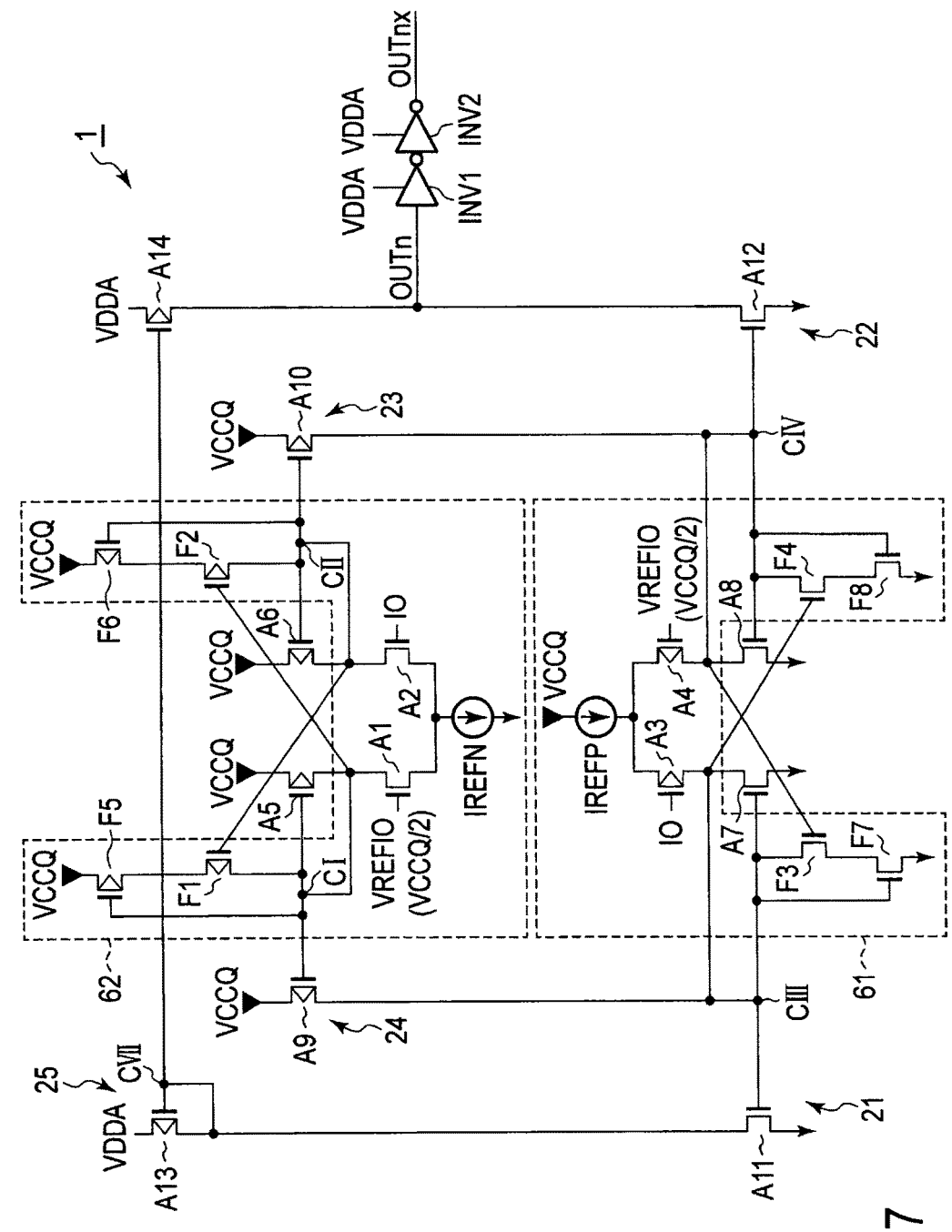
FIG. 7, FIG. 8A and FIG. 8B are circuit diagrams of a semiconductor amplifier circuit according to a fourth embodiment.

Referring to FIG. 7, a description is given of a structure embodiment 4-1 of a semiconductor amplifier circuit 1 according to the fourth embodiment.

As illustrated in FIG. 7, the structure embodiment 4-1 differs from the structure embodiment 3-1 of FIG. 5 with respect to the order of connection of N-type transistors F3 and F4, which constitute cross-couple transistors, and diode-connected N-type transistors F7 and F8, and the order of connection of P-type transistors F1 and F2, which constitute cross-couple transistors, and diode-connected P-type transistors F5 and F6. Specifically, in an amplifier circuit 61, from the ground terminal side, the diode-connected N-type transistors F7 and F8 and the N-type transistors F3 and F4, which constitute the cross-couple transistors, are connected. In an amplifier circuit 62, from the power supply terminal side, the diode-connected P-type transistors F5 and F6 and the P-type transistors F1 and F2, which constitute the cross-couple transistors, are connected.

Specifically, the N-type transistor F3 has a gate connected to a drain of the P-type transistor A4, and has a drain connected to a drain of the P-type transistor A3.

The N-type transistor F4 has a gate connected to the drain of the P-type transistor A3, and has a drain connected to the drain of the P-type transistor A4.

The N-type transistor F7 has a gate connected to the drain of the P-type transistor A3, has a drain connected to a source of the N-type transistor F3, and has a source connected to a ground terminal.

The N-type transistor F8 has a gate connected to the drain of the P-type transistor A4, has a drain connected to a source of the N-type transistor F4, and has a source connected to the ground terminal.

The P-type transistor F1 has a gate connected to a drain of the N-type transistor A2, and has a drain connected to a drain of the N-type transistor A1.

The P-type transistor F2 has a gate connected to the drain of the N-type transistor A1, and has a drain connected to the drain of the N-type transistor A2.

The P-type transistor F5 has a gate connected to the drain of the N-type transistor A1, has a drain connected to a source of the P-type transistor F1, and has a source connected to a power supply terminal.

The P-type transistor F6 has a gate connected to the drain of the N-type transistor A2, has a drain connected to a source of the P-type transistor F2, and has a source connected to a power supply terminal.

[4-1-2] Embodiment 4-2

Figure 8A:
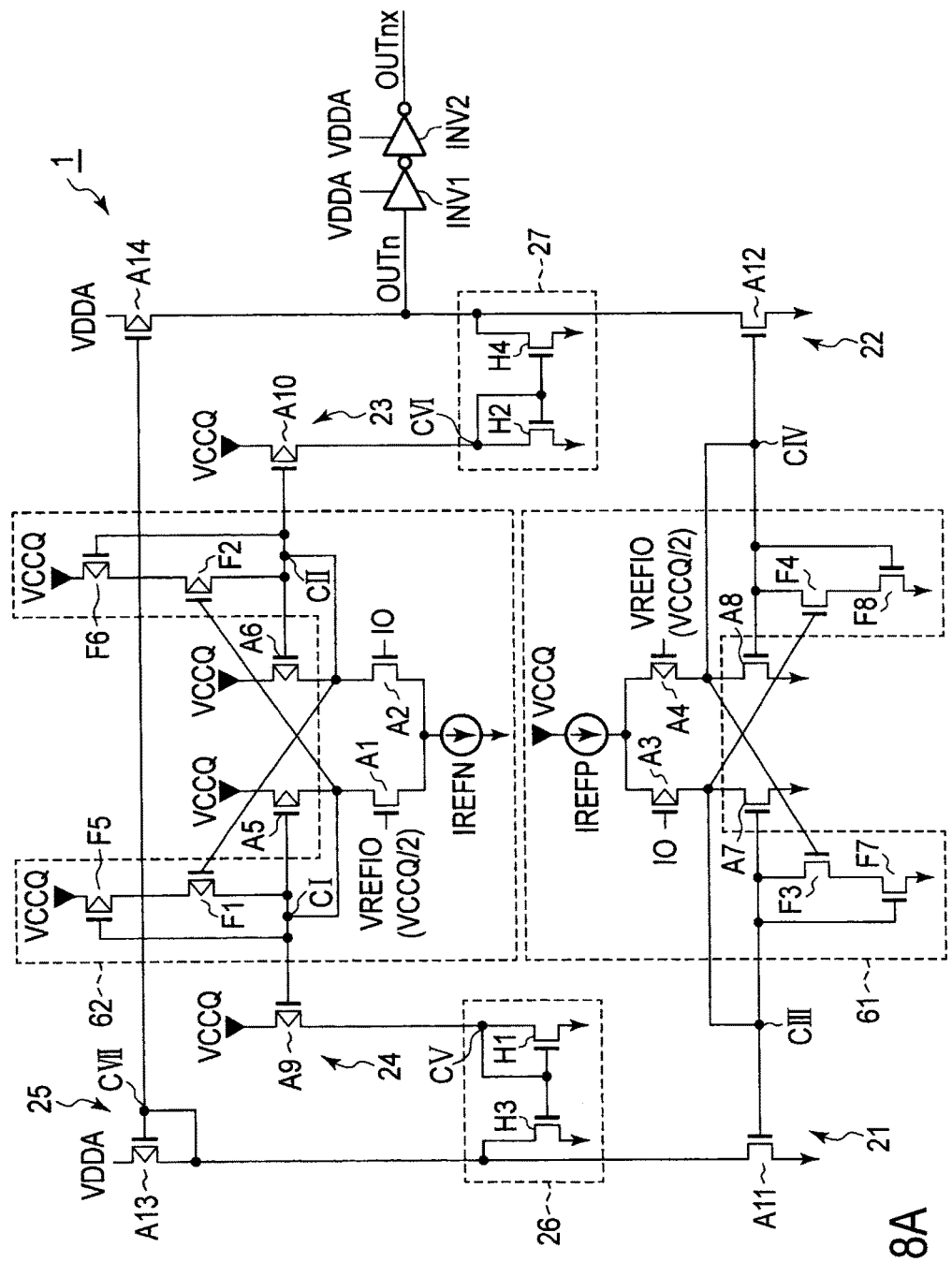

Referring to FIG. 8A, a description is given of a structure embodiment 4-2 of the semiconductor amplifier circuit 1 according to the fourth embodiment.

As illustrated in FIG. 8A, the structure embodiment 4-2 differs from the structure embodiment 3-2 of FIG. 6A with respect to the order of connection of N-type transistors F3 and F4, which constitute cross-couple transistors, and diode-connected N-type transistors F7 and F8, and the order of connection of P-type transistors F1 and F2, which constitute cross-couple transistors, and diode-connected P-type transistors F5 and F6. Specifically, in an amplifier circuit 61, from the ground terminal side, the diode-connected N-type transistors F7 and F8 and the N-type transistors F3 and F4, which constitute the cross-couple transistors, are connected. In an amplifier circuit 62, from the power supply terminal side, the diode-connected P-type transistors F5 and F6 and the P-type transistors F1 and F2, which constitute the cross-couple transistors, are connected.

Incidentally, in, the semiconductor amplifier circuit 1 of the structure embodiment 4-2, the other structures and the relations in connection are the same as in the above-described structure embodiment 3-2.

[4-1-3] Embodiment 4-3

Figure 8B:
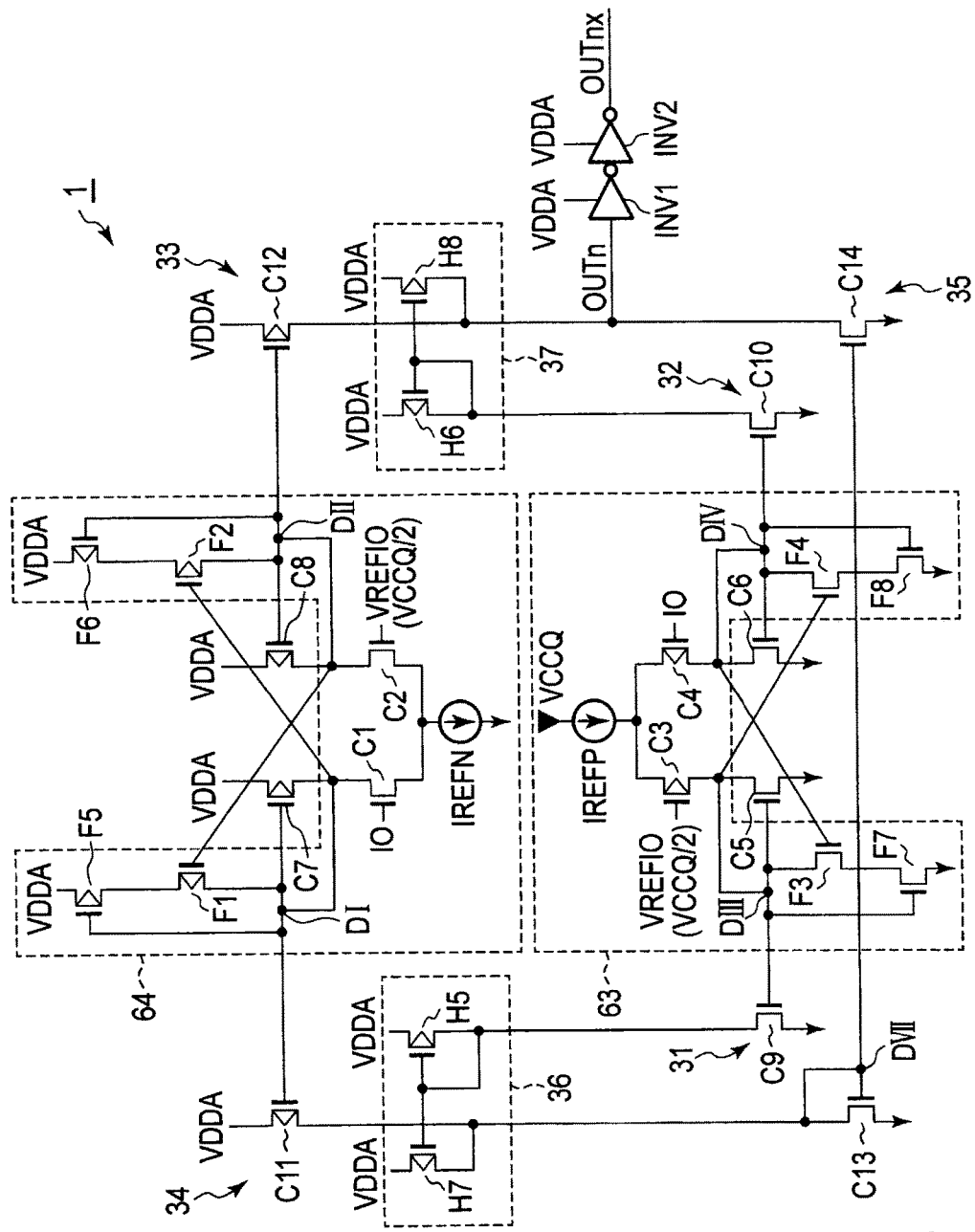

Referring to FIG. 8B, a description is given of a structure embodiment 4-3 of the semiconductor amplifier circuit 1 according to the fourth embodiment.

As illustrated in FIG. 8B, the structure embodiment 4-3 differs from the structure embodiment 3-3 of FIG. 6B with respect to the order of connection of N-type transistors F3 and F4, which constitute cross-couple transistors, and diode-connected N-type transistors F7 and F8, and the order of connection of P-type transistors F1 and F2, which constitute cross-couple transistors, and diode-connected P-type transistors F5 and F6. Specifically, in an amplifier circuit 61, from the ground terminal side, the diode-connected N-type transistors F7 and F8 and the N-type transistors F3 and F4, which constitute the cross-couple transistors, are connected. In an amplifier circuit 62, from the power supply terminal side, the diode-connected P-type transistors F5 and F6 and the P-type transistors F1 and F2, which constitute the cross-couple transistors, are connected.

Incidentally, in the semiconductor amplifier circuit 1 of the structure embodiment 4-3, the other structures and the relations in connection are the same as in the above-described structure embodiment 3-3.

[4-2] Operation

Referring to FIG. 7, a description is given of the operation of the structure embodiment 4-1 of the semiconductor amplifier circuit 1 according to the fourth embodiment.

In the amplifier circuit 61, when a signal, which is input to the P-type transistor A3, has changed from "H" to "L", the P-type transistor A3 enters an ON state. Thus, the charge of a node CIII is charged, and goes to "H" level. If the node CIII goes to "H" level, the N-type transistor F4 enters an ON state, and a node CIV is discharged to a potential level ("L" level) at which a threshold voltage of the N-type transistor F8 is added to a ground voltage VSS. If the node CIV goes to "L" level, the N-type transistor A12 enters a cut-off state. If the N-type transistor A12 enters the cut-off state, the discharging from the N-type transistor A12 stops. If the node CIII goes to "H" level, the N-type transistor A11 enters an ON state, and a node CVII is discharged and goes to "L" level. If the node CVII goes to "L" level, the P-type transistor A14 enters an ON state, and the charge of the node OUTn is charged and goes to "H" level.

On the other hand, when the signal, which is input to the P-type transistor A3, has changed from "L" to "H", the P-type transistor A3 enters an OFF state, and a current flowing in the P-type transistor A4 increases. Thus, the charge of the CIV is charged and goes to "H" level. If the node CIV goes to "H" level, the N-type transistor F3 enters an ON state, and the node CIII is discharged to a potential level ("L" level) at which a threshold voltage of the N-type transistor F7 is added to the ground voltage VSS. If the node CIII goes to "L" level, the N-type transistor A11 enters a cut-off state. If the N-type transistor A11 enters the cut-off state, the charge of the node CVII is charged and goes to "H" level. If the node CVII goes to "H" level, the P-type transistor A14 enters an OFF state and the discharging from the P-type transistor A14 stops. If the node CIV goes to "H" level, the N-type transistor A12 enters an ON state, and the charge of the node OUTn is discharged and goes to "L" level.

In the amplifier circuit 62, when a signal, which is input to the N-type transistor A2, has changed from "H" to "L", the N-type transistor A2 enters an OFF state, and a current flowing to the N-type transistor A1 side increases. Thus, the charge of a node CI is discharged, and goes to "L" level. If the node CI goes to "L" level, the P-type transistor F2 enters an ON state, and a node CII is charged to a potential level ("H" level) at which a threshold voltage of the P-type transistor F6 is subtracted from a power supply voltage VCCQ. If the node CII goes to "H" level, the P-type transistor A10 enters a cut-off state. If the P-type transistor A10 enters the cut-off state, the charge of the node CIV is discharged, and goes to "L" level. If the node CIV goes to "L" level, the N-type transistor A12 enters an OFF state, and the discharging from the N-type transistor A12 stops. If the node CI goes to "L" level, the P-type transistor A9 enters an ON state, and a node CIII is charged and goes to "H" level. If the node CIII goes to "H" level, the N-type transistor A11 enters an ON state, and the node CVII is discharged and goes to "L" level. If the node CVII goes to "L" level, the P-type transistor A14 enters an ON state, and the charge of the node OUTn is charged and goes to "H" level.

On the other hand, when the signal, which is input to the N-type transistor A2, has changed from "L" to "H", the N-type transistor A2 enters an ON state. Thus, the charge of the CII is discharged and goes to "L" level. If the node CII goes to "L" level, the P-type transistor F1 enters an ON state, and the node CI is charged to a potential level ("H" level) at which a threshold voltage of the P-type transistor F5 is subtracted from the power supply voltage VCCQ. If the node CI goes to "H" level, the P-type transistor A9 enters a cut-off state. If the P-type transistor A9 enters the cut-off state, the charge of the node CIII is discharged and goes to "L" level. If the node CIII goes to "L" level, the N-type transistor A11 enters an OFF state, and the charge of the node CVII is charged and goes to "H" level. If the node CVII goes to "H" level, the P-type transistor A14 enters an OFF state, and the discharging from the P-type transistor A14 stops. If the node CII goes to "L" level, the P-type transistor A10 enters an ON state, and the node CIV is charged and goes to "H" level. If the node CIV goes to "H" level, the N-type transistor A12 enters an ON state, and the charge of the node OUTn is discharged and goes to "L" level.

[4-3] Advantageous Effects of the Fourth Embodiment

In the present embodiment, like the third embodiment, the diode-connected transistors F5, F6, F7 and F8 are added to the amplifier circuits 61 and 62. Thereby, as regards the charging of the nodes CI and CII, this charging can be suppressed to the value which is lower than the power supply voltage VCCQ by the threshold voltage of the P-type transistor F5 and F6. As regards the discharging of the nodes CIII and CIV, this discharging can be controlled to the value which is higher than the ground potential VSS by the threshold voltage of the N-type transistor F7 and F8. As a result, even in a high-speed operation region, the amplitude of the node CI, CII, CIII, CIV can be made to control within the cycle, and the high-speed operation can be realized.

Furthermore, in the fourth embodiment, the diode-connected transistors F5, F6, F7 and F8 are disposed on the power supply terminal side and ground terminal side. Thereby, compared to the third embodiment in which the transistors E1, E2, E3 and E4, which constitute the cross-couple transistors, are disposed on the power supply terminal side and ground terminal side, charging can be executed to a higher level as regards the node CI, CII, and discharging can be executed to a lower level as regards the node CIII, CIV.

Incidentally, in the structure embodiment 4-2 illustrated in FIG. 8A, the same advantageous effects as in the structure embodiment 4-1 illustrated in FIG. 7 and the structure embodiment 1-1 illustrated in FIG. 1A can be obtained. In the structure embodiment 4-3 illustrated in FIG. 8B, the same advantageous effects as in the structure embodiment 4-1 illustrated in FIG. 7 and the structure embodiment 1-2 illustrated in FIG. 1B can be obtained.

[5] Fifth Embodiment

In a fifth embodiment, diode-connected transistors and assist transistors are added to each of amplifier circuits which receive the external input by a P-type transistor and an N-type transistor. Thereby, a potential variation on a circuit side, which receives the external input, is detected, a potential on a circuit side, which receives the external voltage, is charged and discharged, and, in particular, an amplitude of a node on an external input side is increased. In the description below, only the points different from the first to fourth embodiments will be described.

[5-1] Structure

[5-1-1] Embodiment 5-1

Figure 9:
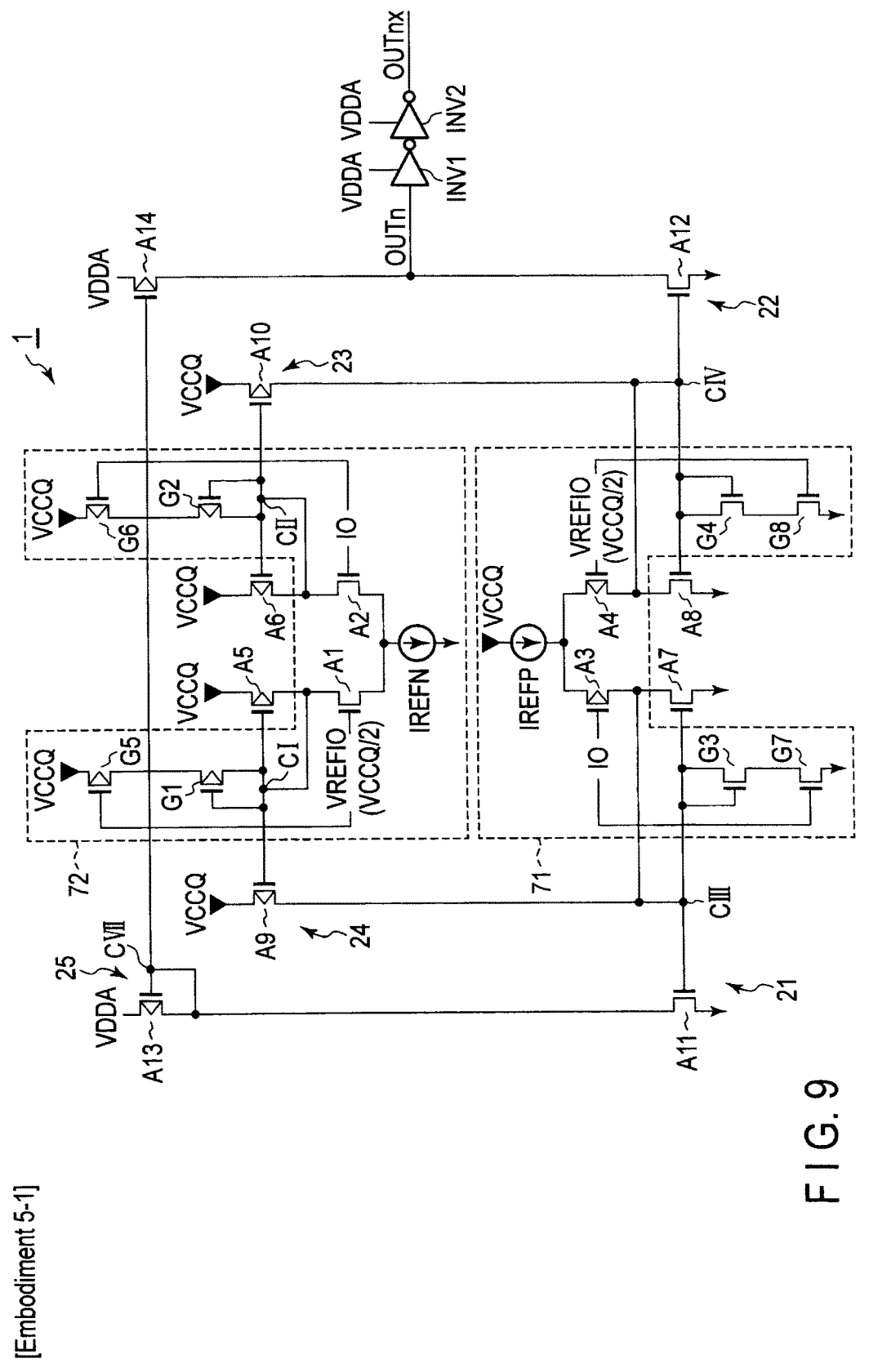

Referring to FIG. 9, a description is given of a structure embodiment 5-1 of a semiconductor amplifier circuit 1 according to the fifth embodiment.

As illustrated in FIG. 9, an amplifier circuit 71 includes a P-type transistor A3 which receives an input signal IO from the outside, a P-type transistor A4 which receives a reference voltage VREFIO, and N-type transistors G3, G4, G7 and G8.

In this case, the N-type transistor G3 has a gate and a drain connected to a drain of the P-type transistor A3, the N-type transistor G4 has a gate and a drain connected to a drain of the P-type transistor A4, and the N-type transistor G3 and N-type transistor G4 are configured as diode-connected transistors.

The N-type transistor G7 has a drain connected to a source of the N-type transistor G3, and has a source connected to a ground terminal.

The N-type transistor G8 has a drain connected to a source of the N-type transistor G4, and has a source connected to the ground terminal.

The N-type transistor G7 has a gate supplied with an input signal IO from the outside, and the N-type transistor G8 has a gate supplied with the reference voltage VREFIO.

An amplifier circuit 72 includes an N-type transistor A2 which receives the input signal IO from the outside, an N-type transistor A1 which receives the reference voltage VREFIO, and P-type transistors G1, G2, G5 and G6.

In this case, the P-type transistor G1 has a gate and a drain connected to a drain of the N-type transistor A1, the P-type transistor G2 has a gate and a drain connected to a drain of the N-type transistor A2, and the P-type transistor G1 and P-type transistor G2 are configured as diode-connected transistors.

The P-type transistor G5 has a drain connected to a source of the P-type transistor G1, and has a source connected to a power supply terminal.

The N-type transistor G6 has a drain connected to a source of the P-type transistor G2, and has a source connected to a power supply terminal.

The P-type transistor G6 has a gate supplied with the input signal IO from the outside, and the P-type transistor G5 has a gate supplied with the reference voltage VREFIO.

[5-1-2] Embodiment 5-2

Referring to FIG. 10A, a description is given of a structure embodiment 5-2 of the semiconductor amplifier circuit 1 according to the fifth embodiment.

As illustrated in FIG. 10A, the structure embodiment 5-2 differs from the structure embodiment 5-1 in that current mirror circuits 26 and 27, which are composed of N-type transistors H1, H2, H3 and H4, are provided so as to be able to independently control an output of the amplifier circuit 71, which receives the external input by the P-type transistor A3, and an output of the amplifier circuit 72, which receives the external input by the N-type transistor A2.

Incidentally, the structures and the relations in connection of the current mirror circuits 26 and 27 are the same as in the above-described structure embodiment 1-1, structure embodiment 2-1, structure embodiment 3-2 and structure embodiment 4-2.

[5-1-3] Embodiment 5-3

Figure 10B:
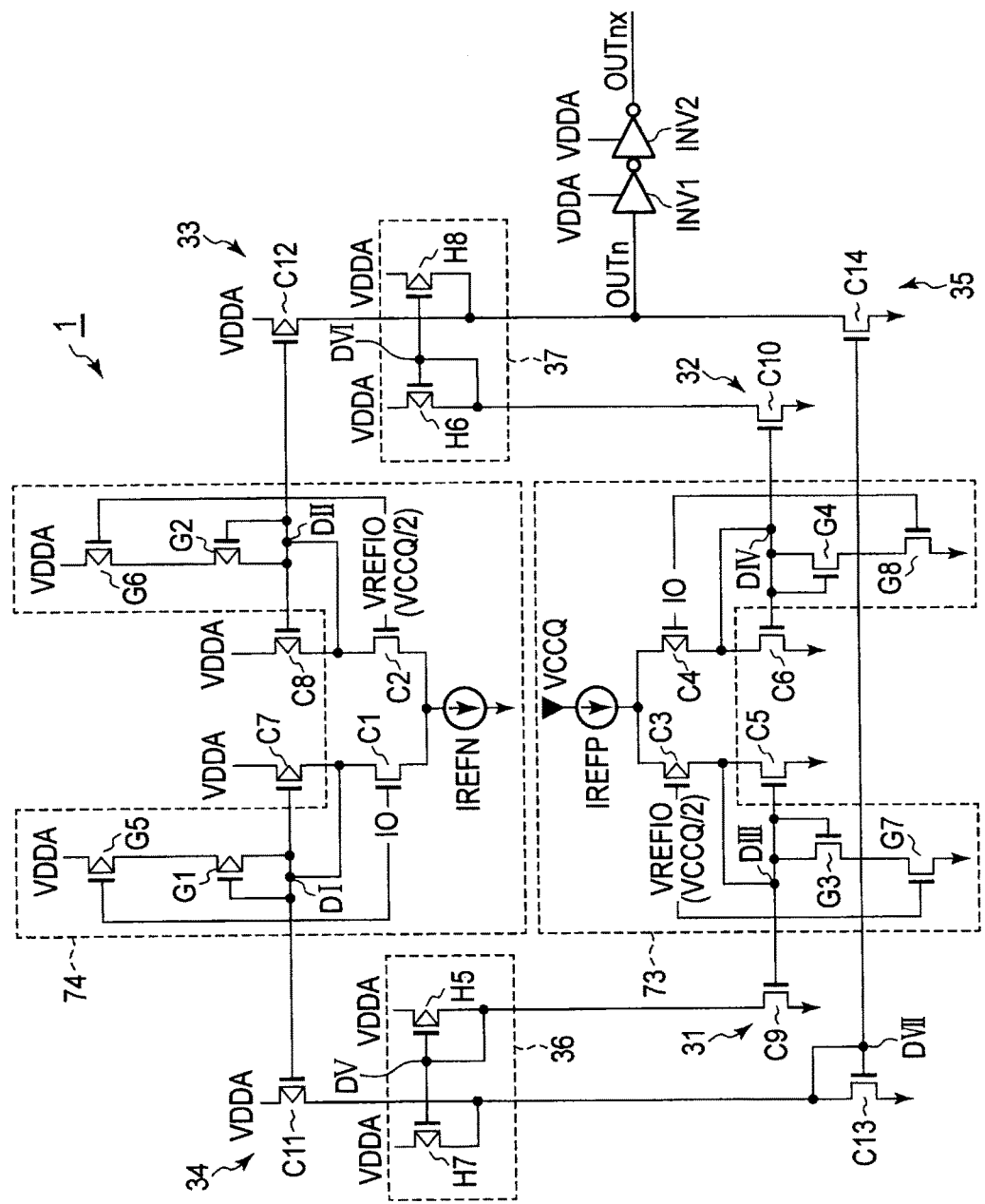

Referring to FIG. 10B, a description is given of a structure embodiment 5-3 of the semiconductor amplifier circuit 1 according to the fifth embodiment.

As illustrated in FIG. 10B, the structure embodiment 5-3 differs from the structure embodiment 5-2 in that current mirror circuits 36 and 37, which are provided so as to be able to independently control an output of an amplifier circuit 73, which receives the external input by a P-type transistor C4, and an output of an amplifier circuit 74, which receives the external input by an N-type transistor C1, are composed of P-type transistors H5, H6, H7 and H8.

Incidentally, the structures and the relations in connection of the current mirror circuits 36 and 37 are the same as in the above-described structure embodiment 1-2, structure embodiment 2-2, structure embodiment 3-3 and structure embodiment 4-3.

[5-2] Operation

Referring to FIG. 9 and FIG. 11, a description is given of the operation of the structure embodiment 5-1 of the semiconductor amplifier circuit 1 according to the fifth embodiment.

In the amplifier circuit 71, when a signal, which is input to the P-type transistor A3, is "H" level, the N-type transistor G7 is in an ON state and the P-type transistor A3 is in an OFF state. When the signal, which is input to the P-type transistor A3, has changed from "H" to "L", the N-type transistor G7 enters an OFF state and the P-type transistor A3 enters an ON state. At this time, a level, at which discharging from the N-type transistor A7 and charging from the P-type transistor A3 are balanced, corresponds to "H" level of a node CIII. Thus, compared to the case in which the N-type transistor G7 is absent, the node CIII has a higher level. If the node CIII goes to "H" level, the N-type transistor A11 enters an ON state, and the charge of a node CVII is discharged and goes to "L" level. If the node CVII goes to "L" level, the P-type transistor A14 enters an ON state, and the charge of the node OUTn is charged and goes to "H" level.

On the other hand, when the signal, which is input to the P-type transistor A3, has changed from "L" to "H", the N-type transistor G7 enters the ON state and the P-type transistor A3 enters the OFF state. At this time, the node CIII is discharged to "L" level in a shorter time, compared to the case in which the N-type transistors G3 and G7 are absent. If the node CIII goes to "L" level, the N-type transistor A11 enters an OFF state, and the charge of the node CVII is charged and goes to "H" level. If the node CVII goes to "H" level, the P-type transistor A14 enters an OFF state, and the charging from the P-type transistor A14 stops. If the P-type transistor A3 enters the OFF state, the P-type transistor A4 begins to cause a current to flow, and the node CIV is charged to "H" level. If the node CIV goes to "H" level, the N-type transistor A12 enters an ON state, the charge of the node OUTn is discharged and goes to "L" level.

In the amplifier circuit 72, when a signal, which is input to the N-type transistor A2, is "L" level, the P-type transistor G6 is in an ON state and the N-type transistor A2 is in an OFF state. When the signal, which is input to the N-type transistor A2, has changed from "L" to "H", the P-type transistor G6 enters an OFF state and the N-type transistor A2 enters an ON state. At this time, at a node CII, compared to the case in which the P-type transistor G6 is absent, the discharge time becomes shorter, and the "L" level becomes lower. If the node CII enters "L" level, the P-type transistor A10 enters an ON state, and the charge of the node CIV is charged and goes to "H" level. If the node CIV goes to "H" level, the N-type transistor A12 enters an ON state, and the charge of the node OUTn is discharged and goes to "L" level.

On the other hand, when the signal, which is input to the N-type transistor A2, has changed from "H" to "L", the P-type transistor G6 enters the ON state and the N-type transistor A2 enters the OFF state. At this time, at the node CII, the charging time becomes shorter by the charging from the P-type transistor G6 in addition to the charging from the P-type transistor A6, compared to the case in which the P-type transistors G2, G6 are absent. Further, since the "H" level becomes higher, the P-type transistor A10 quickly enters a cut-off state. If the node CII goes to "H" level, the P-type transistor A10 enters an OFF state, and the charge of the node CIV is discharged and goes to "L" level. If the node CIV goes to "L" level, the N-type transistor A12 enters an OFF state, and the discharging from the N-type transistor A12 stops. If the N-type transistor A2 enters the OFF state, the N-type transistor A1 begins to cause a current to flow, and the node CI is discharged and goes to "L" level. If the node CI goes to "L" level, the P-type transistor A9 enters an ON state, and the node CIII goes to "H" level. If the node CIII goes to "H" level, the N-type transistor A11 enters an ON state, the node CVII goes to "L" level, the P-type transistor A14 enters an ON state, and the charge of the node OUTn is charged and goes to "H" level.

[5-3] Advantageous Effects of the Fifth Embodiment

In the second embodiment, the amplitude of the node CI, CIV on the circuit side, which receives the reference voltage VREFIO, is increased, thereby realizing the high-speed operation. By contrast, in the present embodiment, the high-speed operation is realized by adding the diode-connected transistors G1, G2 and G3 and G4 and assist transistors G5, G6, G7 and G8 to the amplifier circuits 71 and 72, and increasing the amplitude of the node CIII, CII on the circuit side which receives the external input IO.

Specifically, in the case of the structure embodiment 5-1 illustrated in FIG. 9 and FIG. 11, in the amplifier circuit 72 which accepts the external input by the N-type transistor A2, when the signal that is input to the N-type transistor A2 has changed from "L" to "H", the "L" level of the potential of the node CII becomes lower and the discharging time becomes shorter, compared to the case in which the P-type transistor G6 is absent. On the other hand, when the signal that is input to the N-type transistor A2 has changed from "H" to "L", the potential of the node CII is charged to "H" level in a shorter charging time, compared to the case in which P-type transistor G2, G6 is absent. Thereby, the amplitude of the node CII increases.

Similarly, in the amplifier circuit 71 which accepts the external input by the P-type transistor A3, when the signal that is input to the P-type transistor A3 has changed from "H" to "L", the "H" level of the potential of the node CIII becomes higher and the charging time becomes shorter, compared to the case in which the N-type transistor G7 is absent. On the other hand, when the signal that is input to the P-type transistor A3 has changed from "L" to "H", the potential of the node CIII is discharged to "L" level in a shorter discharging time, compared to the case in which N-type transistor G3, G7 is absent. Thereby, the amplitude of the node CIII increases.

As has been described above, by adding the transistors G1 to G8, the amplitude of the node CII, CIII on the circuit side, which receives the external input IO, can be increased. Thereby, the charging time and discharging time of the transistor becomes shorter, and the high-speed operation is enabled.

Incidentally, in the structure embodiment 5-2 illustrated in FIG. 10A, the same advantageous effects as in the structure embodiment 5-1 illustrated in FIG. 9 and the structure embodiment 1-1 illustrated in FIG. 1A can be obtained. In the structure embodiment 5-3 illustrated in FIG. 10B, the same advantageous effects as in the structure embodiment 5-1 illustrated in FIG. 9 and the structure embodiment 1-2 illustrated in FIG. 1B can be obtained.

[6] Sixth Embodiment

In a sixth embodiment, diode-connected transistors are added to respective amplifier circuits which receive the external input by a P-type transistor and an N-type transistor, and thereby an amplitude within a cycle is realized even in a high-speed operation region. In the description below, only the points different from the first to fifth embodiments will be described.

[6-1] Structure

[6-1-1] Embodiment 6-1

Figure 12:
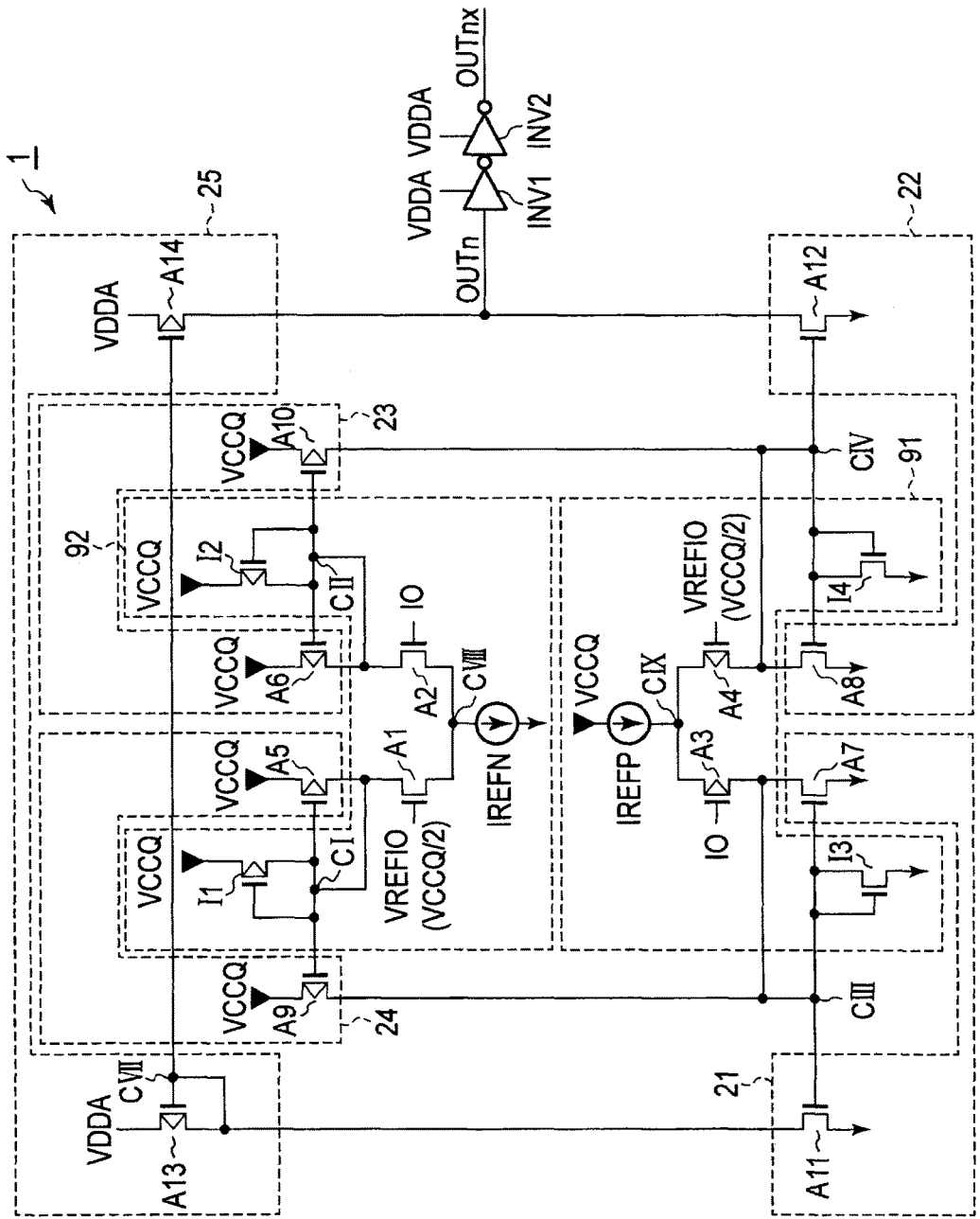

Referring to FIG. 12, a description is given of a structure embodiment 6-1 of a semiconductor amplifier circuit 1 according to the sixth embodiment.

As illustrated in FIG. 12, the semiconductor amplifier circuit 1 includes an amplifier circuit 91 which accepts an external input by a P-type transistor A3, an amplifier circuit 92 which accepts the external input by an N-type transistor A2, and current mirror circuits 21 to 25.

The amplifier circuit 91 includes the P-type transistor A3 which receives an input signal IO from the outside, a P-type transistor A4 which receives a reference voltage VREFIO, a constant current source IREFP, and diode-connected N-type transistors I3, I4.

In this case, the N-type transistor I3 has a gate and a drain connected to the drain of the P-type transistor A3, and has a source connected to a ground terminal.

The N-type transistor I4 has a gate and a drain connected to the drain of the P-type transistor A4, and has a source connected to the ground terminal.

The amplifier circuit 92 includes the N-type transistor A2 which receives the input signal IO from the outside, an N-type transistor A1 which receives the reference voltage VREFIO, a constant current source IREFN, and diode-connected P-type transistors I1, I2.

In this case, the P-type transistor I1 has a gate and a drain connected to the drain of the N-type transistor A1, and has a source connected to a power supply terminal.

The P-type transistor I2 has a gate and a drain connected to the drain of the N-type transistor A2, and has a source connected to the power supply terminal.

[6-1-2] Embodiment 6-2

Figure 13A:
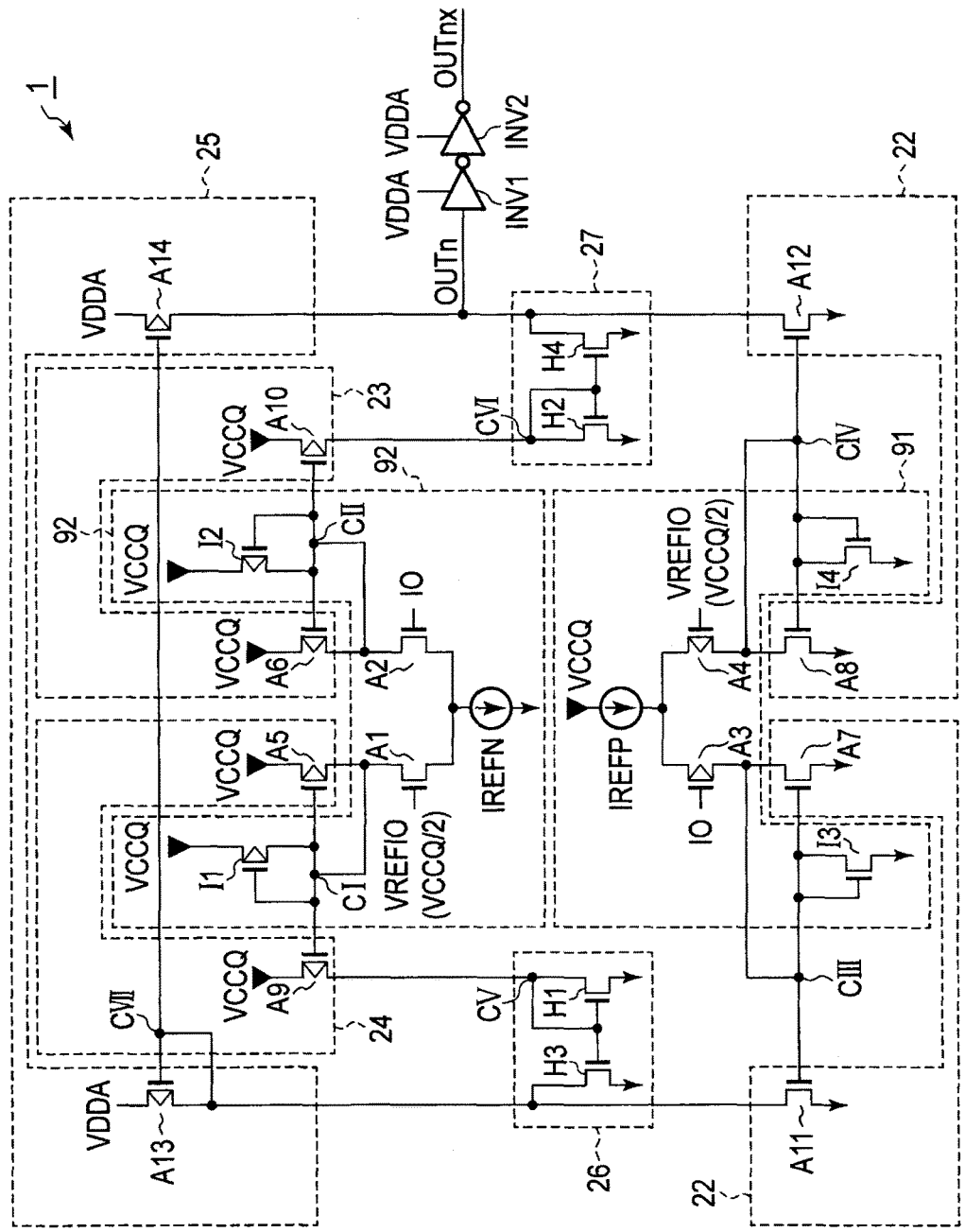

Referring to FIG. 13A, a description is given of a structure embodiment 6-2 of the semiconductor amplifier circuit 1 according to the sixth embodiment.

As illustrated in FIG. 13A, the structure embodiment 6-2 differs from the structure embodiment 6-1 in that current mirror circuits 26 and 27, which are composed of N-type transistors H1, H2, H3 and H4, are provided so as to be able to independently control an output of the amplifier circuit 91, which receives the external input by the P-type transistor A3, and an output of the amplifier circuit 92, which receives the external input by the N-type transistor A2.

Incidentally, the structures and the relations in connection of the current mirror circuits 26 and 27 are the same as in the above-described structure embodiment 1-1, structure embodiment 2-1, structure embodiment 3-2, structure embodiment 4-2, and structure embodiment 5-2.

[6-1-3] Embodiment 6-3

Referring to FIG. 13B, a description is given of a structure embodiment 6-3 of the semiconductor amplifier circuit 1 according to the sixth embodiment.

As illustrated in FIG. 13B, the structure embodiment 6-3 differs from the structure embodiment 6-2 in that current mirror circuits 36 and 37, which are provided so as to be able to independently control an output of an amplifier circuit 93, which receives an external input by a P-type transistor C4, and an output of an amplifier circuit 94, which receives the external input by an N-type transistor C1, are composed of P-type transistors H5, H6, H7 and H8.

Incidentally, the structures and the relations in connection of the current mirror circuits 36 and 37 are the same as in the above-described structure embodiment 2-2, structure embodiment 3-3, structure embodiment 4-3, and structure embodiment 5-3.

[6-2] Operation

Referring to FIG. 12, a description is given of the operation of the structure embodiment 6-1 of the semiconductor amplifier circuit 1 according to the sixth embodiment.

In the amplifier circuit 91, when a signal, which is input to the P-type transistor A3, has changed from "H" to "L", the P-type transistor A3 enters an ON state, and a node CIII is charged up to "H" level.

On the other hand, when the signal, which is input to the P-type transistor A3, has changed from "L" to "H", the P-type transistor A3 enters an OFF state, and the node CIII is discharged to a potential level ("L" level) at which a threshold voltage of the N-type transistor I3 is added to a ground voltage VSS. If the node CIII goes to "L" level, the N-type transistor A11 enters a cut-off state.

In the amplifier circuit 92, when a signal, which is input to the N-type transistor A2, has changed from "H" to "L", the N-type transistor A2 enters an OFF state, and a node CII is charged to a potential level ("H" level) at which a threshold voltage of the P-type transistor I2 is subtracted from a power supply voltage VCCQ. If the node CII goes to "H" level, the P-type transistor A10 enters a cut-off state.

On the other hand, when the signal, which is input to the N-type transistor A2, has changed from "L" to "H", the N-type transistor A2 enters an ON state, and the node CII is discharged to "L" level.

[6-3] Advantageous Effects of the Sixth Embodiment

In the sixth embodiment, by adding the diode-connected transistors I1, I2, I3 and I4 to the amplifier circuits 91 and 92, the same advantageous effects as in the above-described third embodiment can be obtained.

Specifically, in the case of the structure embodiment 6-1 illustrated in FIG. 12, in the amplifier circuit 92 which accepts the external input IO by the N-type transistor A2, when the signal that is input to the N-type transistor A2 has changed from "L" to "H", the potential of the node CII is discharged to "L" level. On the other hand, when the signal that is input to the N-type transistor A2 has changed from "H" to "L", the potential of the node CII is charged to "H" level. The "H" level becomes lower than the power supply voltage VCCQ by the threshold voltage of the P-type transistor I2, and the amplitude at the node CII becomes smaller.

Similarly, in the amplifier circuit 91 which accepts the external input IO by the P-type transistor A3, when the signal that is input to the P-type transistor A3 has changed from "H" to "L", the potential of the node CIII is charged to "H" level. On the other hand, when the signal that is input to the P-type transistor A3 has changed from "L" to "H", the potential of the node CIII is discharged to "L" level. The "L" level becomes higher than the ground voltage VSS by the threshold voltage of the N-type transistor I3, and the amplitude at the node CIII becomes smaller.

In this manner, in the present embodiment, by decreasing the amplitude of the node CII, CIII, the charging/discharging time can be made shorter, and the response speed can be increased.

Incidentally, in the structure embodiment 6-2 illustrated in FIG. 13A, the same advantageous effects as in the structure embodiment 6-1 illustrated in FIG. 12 and the structure embodiment 1-1 illustrated in FIG. 1A can be obtained. In the structure embodiment 6-3 illustrated in FIG. 13B, the same advantageous effects as in the structure embodiment 6-1 illustrated in FIG. 12 and the structure embodiment 1-2 illustrated in FIG. 1B can be obtained.

[7] Seventh Embodiment

In a seventh embodiment, a parasitic capacitance cancel circuit, which is composed of capacitors and an inverter, is added to the semiconductor amplifier circuits according to the first to sixth embodiments. In the description below, only the points different from the first to sixth embodiments will be described.

[7-1] Structure

[7-1-1] Embodiment 7-1

Figure 14:
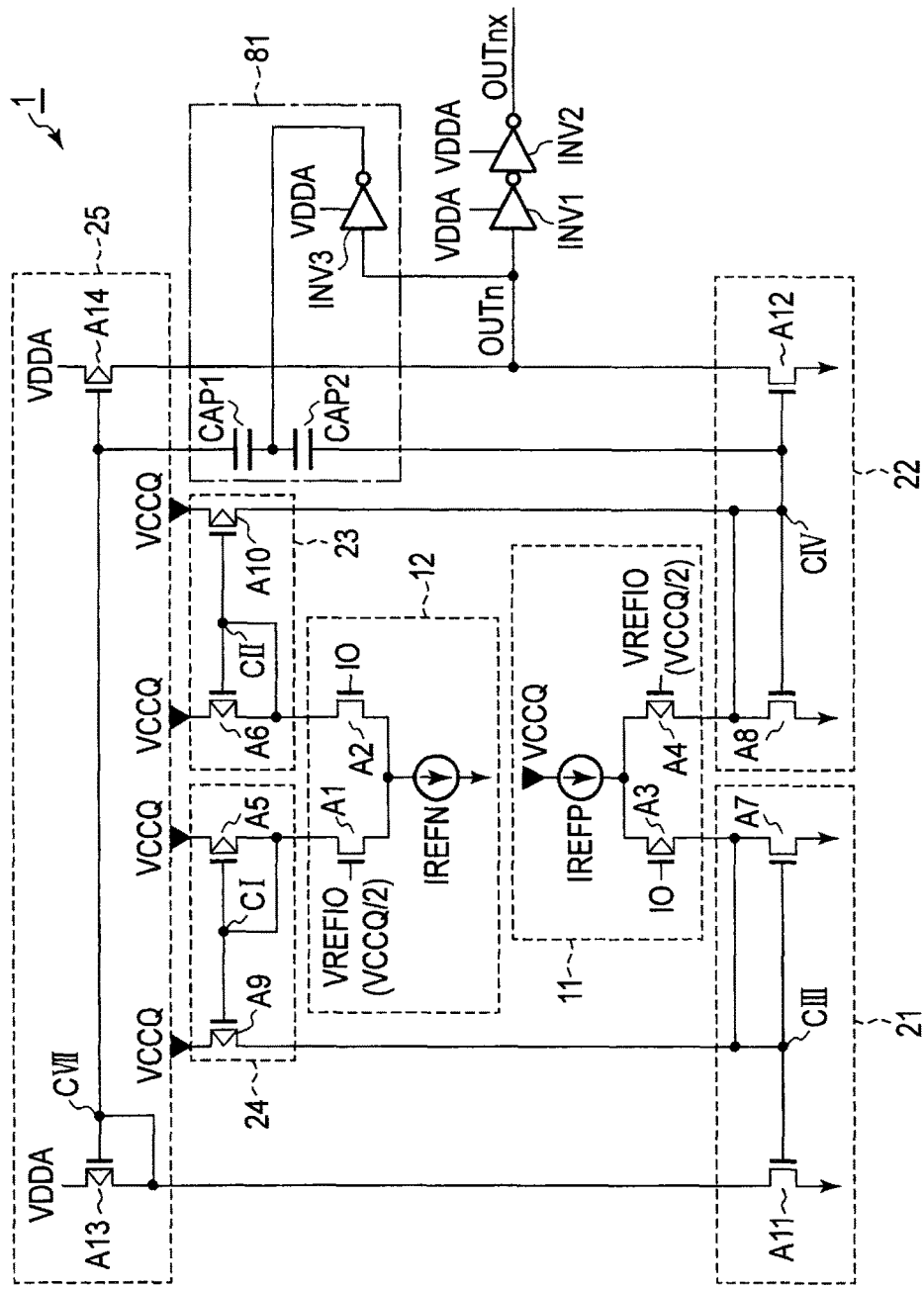

As illustrated in FIG. 14, a semiconductor amplifier circuit 1 of an embodiment 7-1 includes an amplifier circuit 11 which accepts an external input by a P-type transistor A3, an amplifier circuit 12 which accepts the external input by an N-type transistor A2, current mirror circuits 21 to 25, and a parasitic capacitance cancel circuit 81.

The parasitic capacitance cancel circuit 81 includes a capacitor CAP1, a capacitor CAP2 and an inverter INV3. The capacitor CAP1 has one end connected to one end of the capacitor CAP2, and has the other end connected to the gate of the P-type transistor A14. The other end of the capacitor CAP2 is connected to the gate of the N-type transistor A12. The inverter INV3 has an input terminal connected to the drain of the P-type transistor A14, and has an output terminal connected to the one end of the capacitor CAP1. The voltage value of a power supply terminal of the inverter INV3 is, for example, VDDA.

Incidentally, the amplifier circuits 11 and 12 and current mirror circuits 21 to 25 are similar to those in the above-described structure embodiment 1-1. However, in the structure embodiment 7-1, the drain of the P-type transistor A9 is connected to the drain of the P-type transistor A3, and the drain of the P-type transistor A10 is connected to the drain of the P-type transistor A4.

[7-1-2] Embodiment 7-2

Figure 15A:
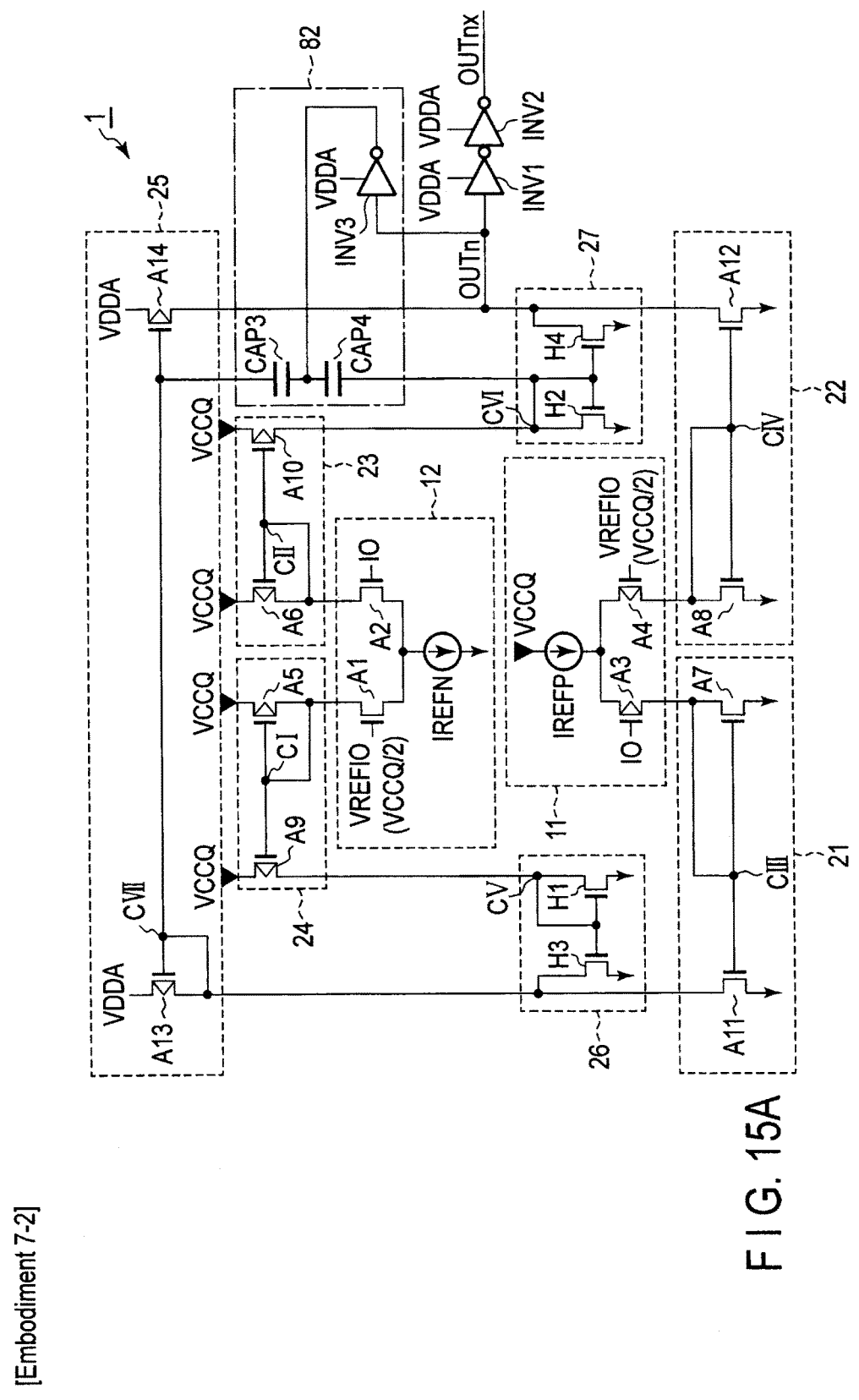

As illustrated in FIG. 15A, a semiconductor amplifier circuit 1 of a structure embodiment 7-2 is configured such that a parasitic capacitance cancel circuit 82 is added to the semiconductor amplifier circuit 1 of the structure embodiment 1-1.

The parasitic capacitance cancel circuit 82 includes a capacitor CAP3, a capacitor CAP4 and an inverter INV3. The capacitor CAP3 has one end connected to one end of the capacitor CAP4, and has the other end connected to the gate of the P-type transistor A14. The other end of the capacitor CAP4 is connected to the gate of the N-type transistor H4. The inverter INV3 has an input terminal connected to the drain of the P-type transistor A14, and has an output terminal connected to the one end of the capacitor CAP3.

[7-1-3] Embodiment 7-3

Figure 15B:
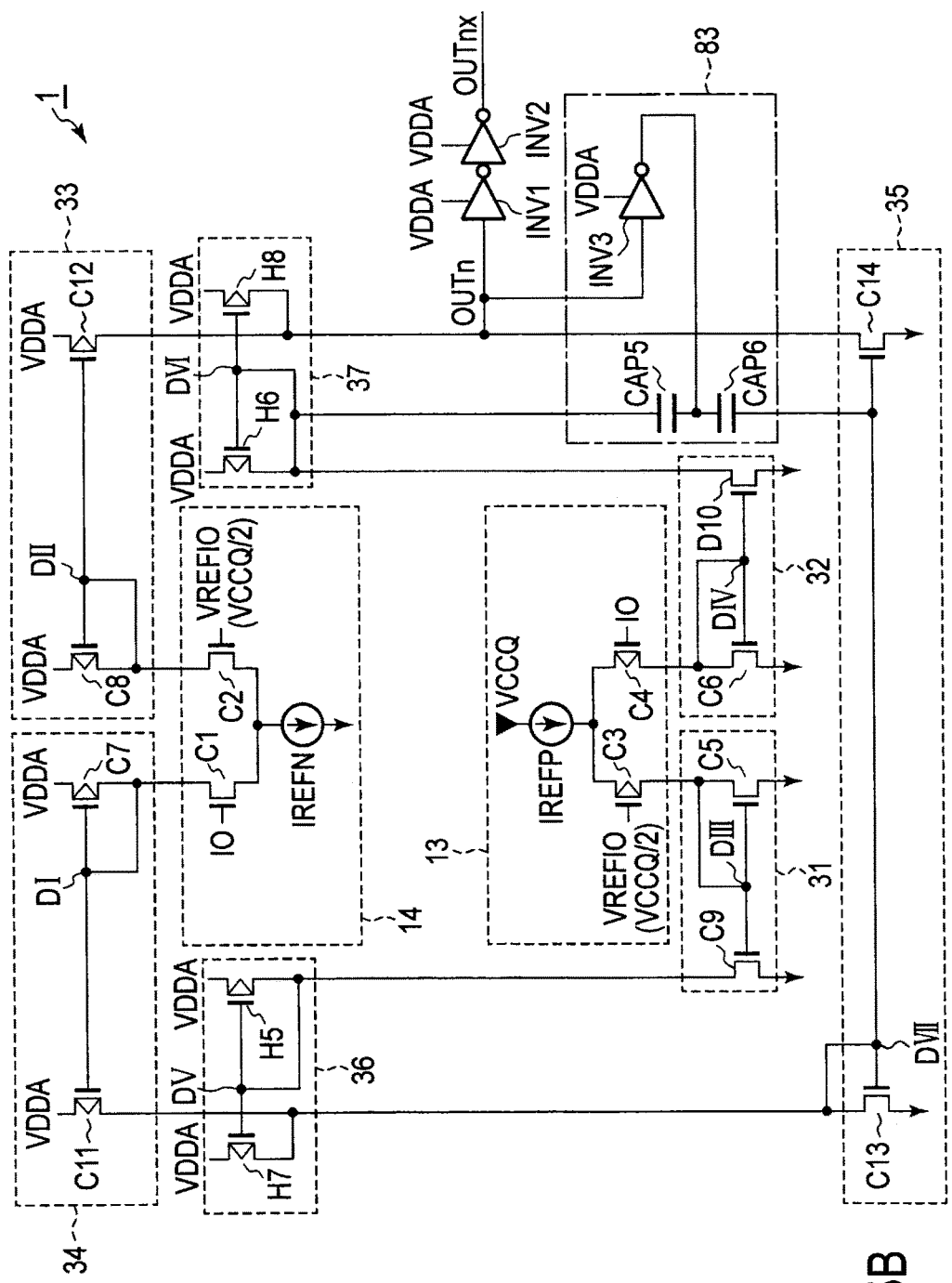

As illustrated in FIG. 15B, a semiconductor amplifier circuit 1 of a structure embodiment 7-3 is configured such that a parasitic capacitance cancel circuit 83 is added to the semiconductor amplifier circuit 1 of the structure embodiment 1-2.

The parasitic capacitance cancel circuit 83 includes a capacitor CAP5, a capacitor CAP6 and an inverter INV3. The capacitor CAP5 has one end connected to one end of the capacitor CAP6, and has the other end connected to the gate of the P-type transistor H8. The other end of the capacitor CAP6 is connected to the gate of the N-type transistor C14. The inverter INV3 has an input terminal connected to the drain of the N-type transistor C14, and has an output terminal connected to the one end of the capacitor CAP5.

[7-1-4] Embodiment 7-4

Figure 16A:
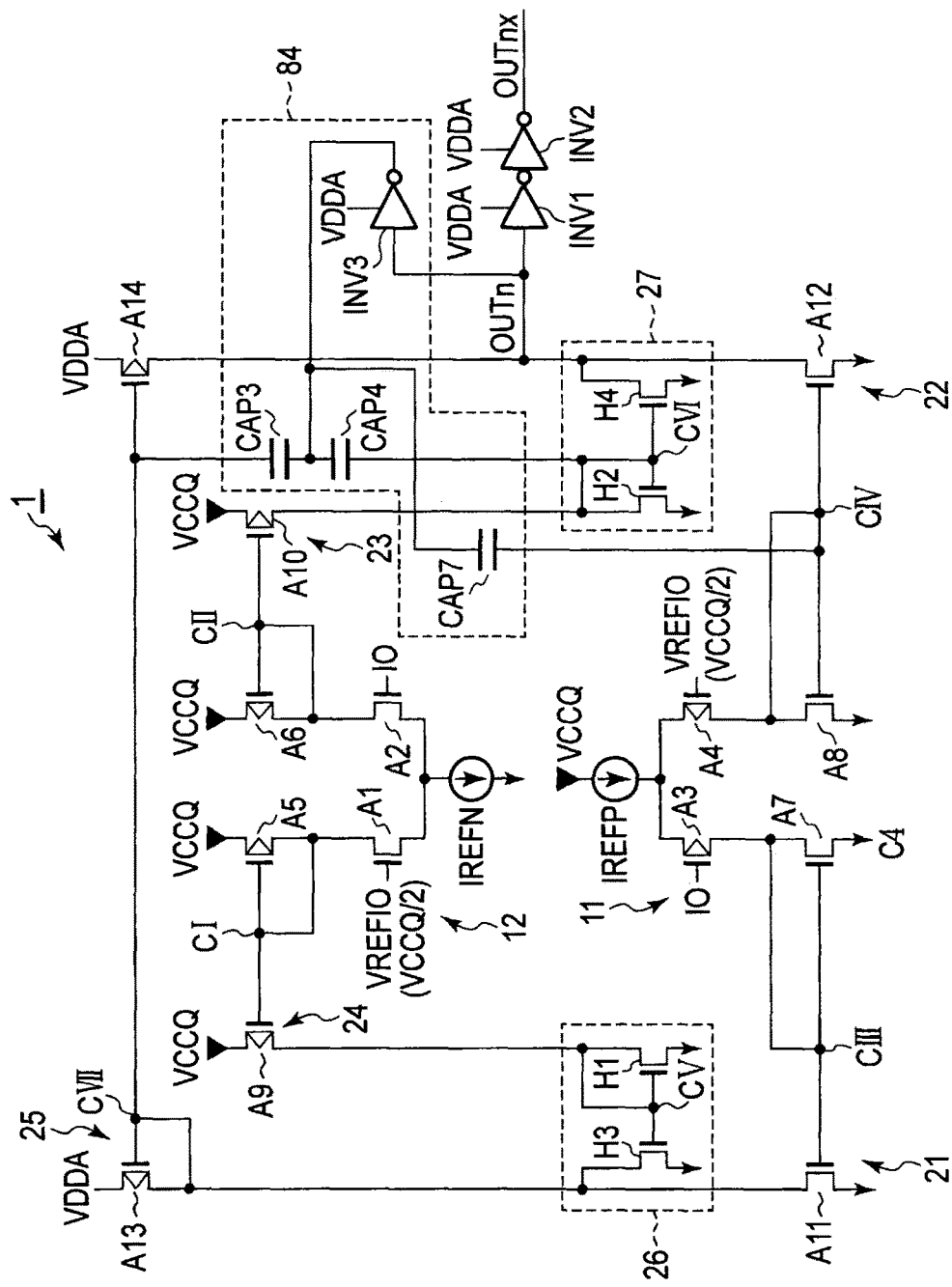

As illustrated in FIG. 16A, a parasitic capacitance cancel circuit 84 of a structure embodiment 7-4 is configured such that a capacitor CAP7 is added to the parasitic capacitance cancel circuit 82 of the structure embodiment 7-2. The capacitor CAP7 has one end connected to the one end of the capacitor CAP3, and has the other end connected to the gate of the N-type transistor A12.

[7-1-5] Embodiment 7-5

As illustrated in FIG. 16B, a parasitic capacitance cancel circuit 85 of a structure embodiment 7-5 is configured such that a capacitor CAP8 is added to the parasitic capacitance cancel circuit 83 of the structure embodiment 7-3. The capacitor CAP8 has one end connected to the one end of the capacitor CAP5, and has the other end connected to the gate of the N-type transistor C12.

[7-1-6] Embodiment 7-6

As illustrated in FIG. 17, a semiconductor amplifier circuit 1 of a structure embodiment 7-6 is configured such that a parasitic capacitance cancel circuit 81 is added to the semiconductor amplifier circuit 1 of the structure embodiment 2-1, and the current mirror circuits 26 and 27 are omitted from the semiconductor amplifier circuit 1 of the structure embodiment 2-1.

[7-1-7] Embodiment 7-7

Figure 18A:
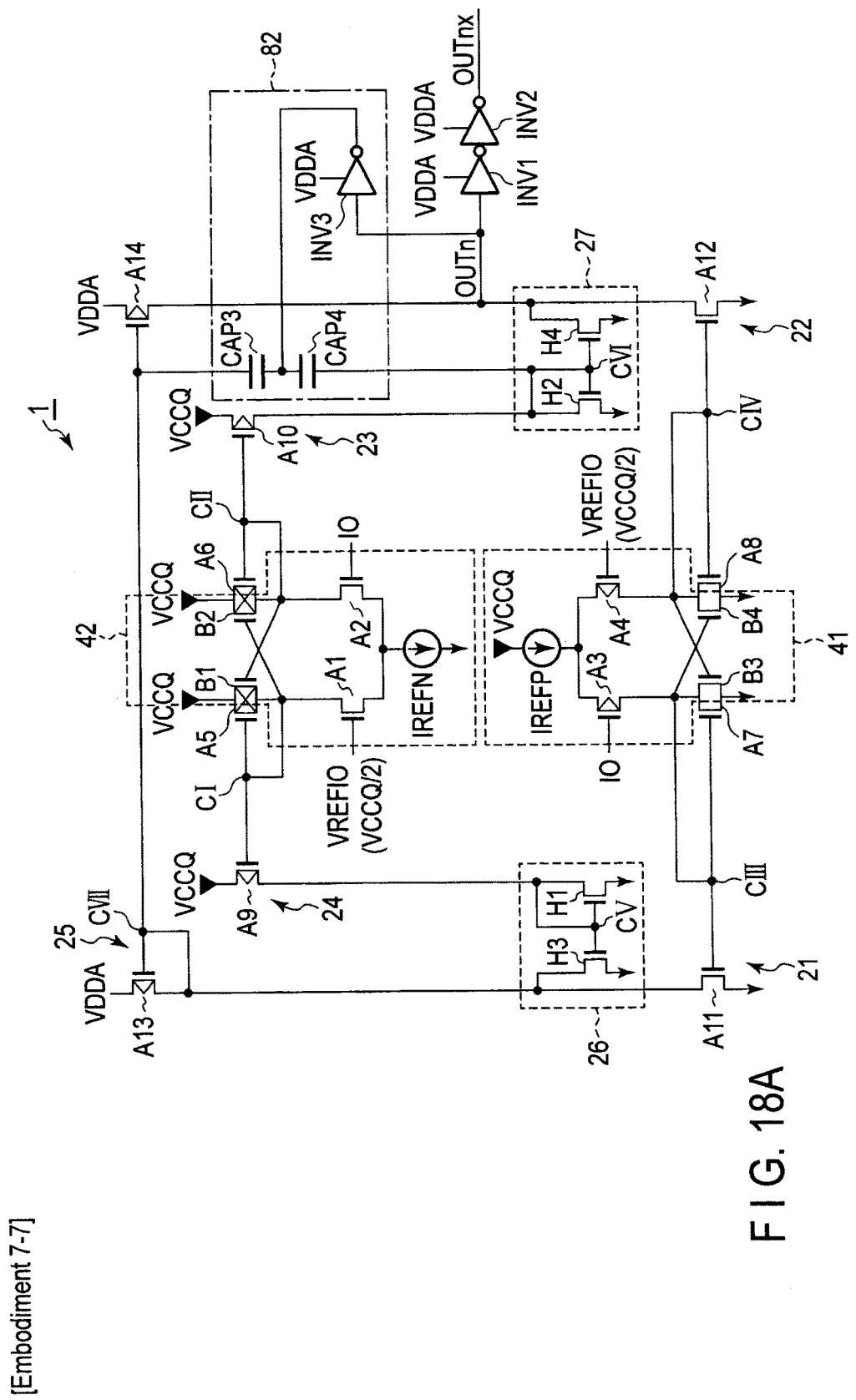

As illustrated in FIG. 18A, a semiconductor amplifier circuit 1 of a structure embodiment 7-7 is configured such that a parasitic capacitance cancel circuit 82 is added to the semiconductor amplifier circuit 1 of the structure embodiment 2-1.

[7-1-8] Embodiment 7-8

As illustrated in FIG. 18B, a semiconductor amplifier circuit 1 of a structure embodiment 7-8 is configured such that a parasitic capacitance cancel circuit 83 is added to the semiconductor amplifier circuit 1 of the structure embodiment 2-2.

[7-1-9] Embodiment 7-9

As illustrated in FIG. 19A, a semiconductor amplifier circuit 1 of a structure embodiment 7-9 is configured such that a parasitic capacitance cancel circuit 84 is added to the semiconductor amplifier circuit 1 of the structure embodiment 2-1.

[7-1-10] Embodiment 7-10

Figure 19B:
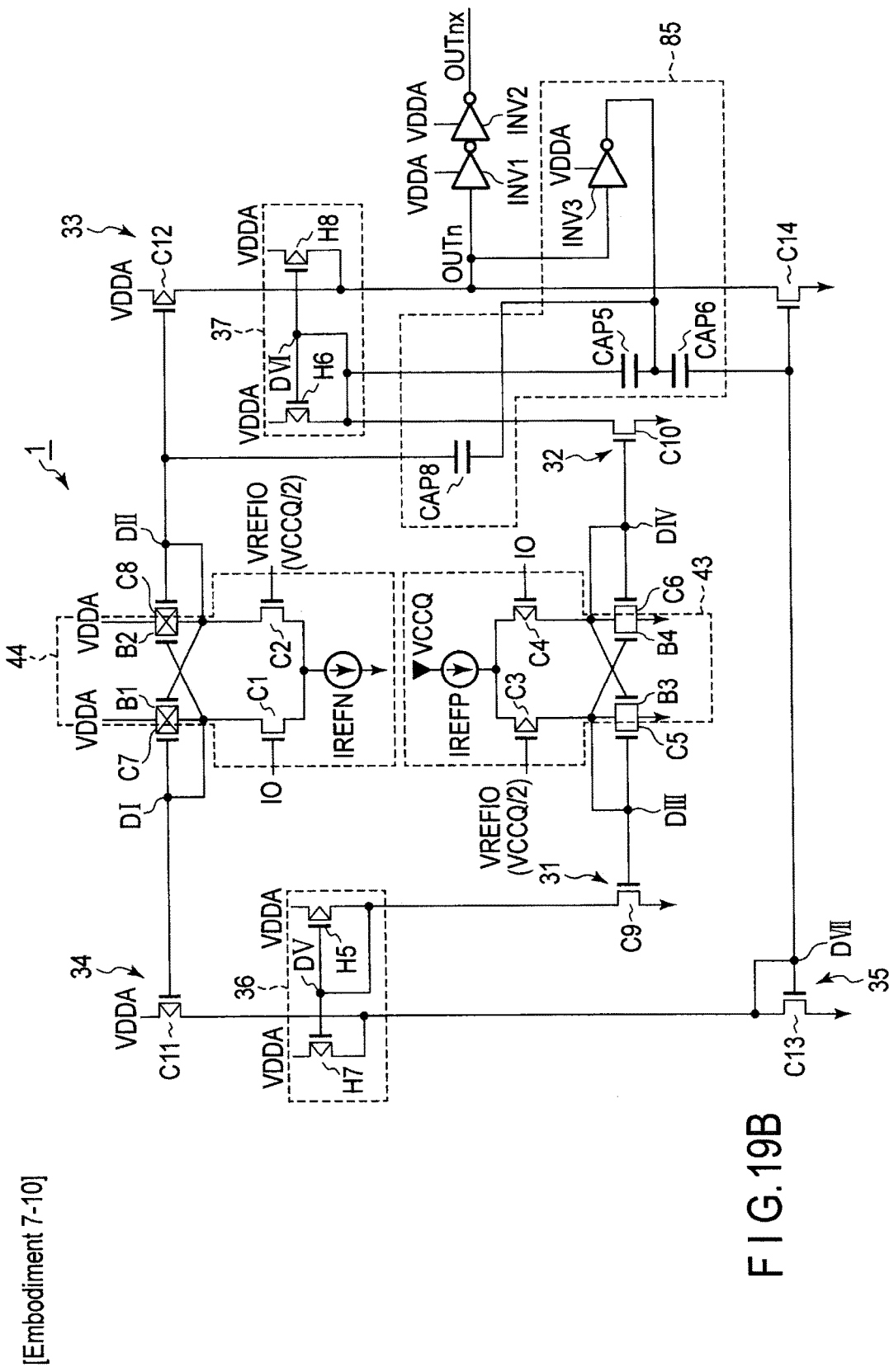

As illustrated in FIG. 19B, a semiconductor amplifier circuit 1 of a structure embodiment 7-10 is configured such that a parasitic capacitance cancel circuit 85 is added to the semiconductor amplifier circuit 1 of the structure embodiment 2-2.

[7-1-11] Embodiment 7-11

Figure 20:
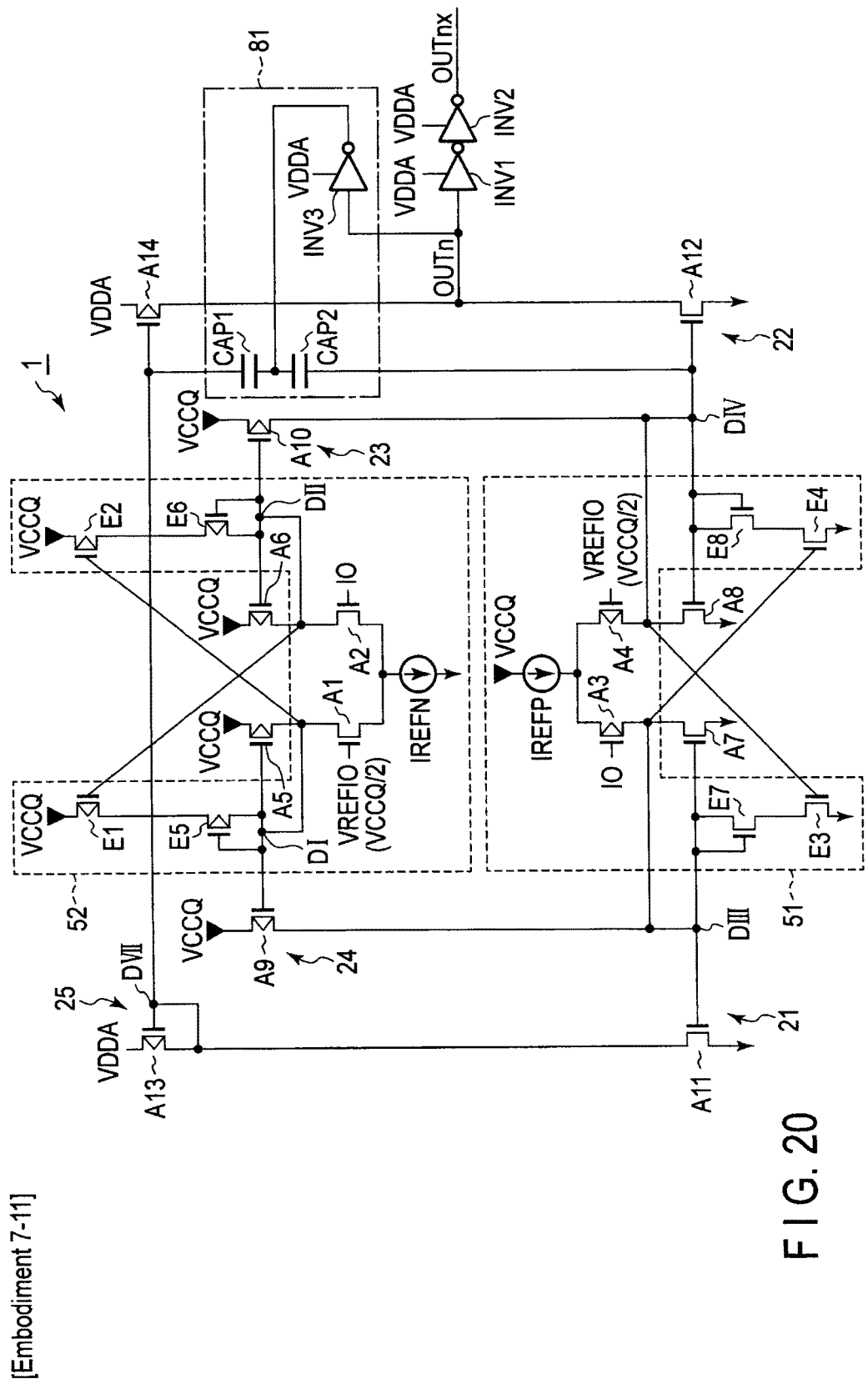

As illustrated in FIG. 20, a semiconductor amplifier circuit 1 of a structure embodiment 7-11 is configured such that a parasitic capacitance cancel circuit 81 is added to the semiconductor amplifier circuit 1 of the structure embodiment 3-1.

[7-1-12] Embodiment 7-12

As illustrated in FIG. 21A, a semiconductor amplifier circuit 1 of a structure embodiment 7-12 is configured such that a parasitic capacitance cancel circuit 82 is added to the semiconductor amplifier circuit 1 of the structure embodiment 3-2.

[7-1-13] Embodiment 7-13

As illustrated in FIG. 21B, a semiconductor amplifier circuit 1 of a structure embodiment 7-13 is configured such that a parasitic capacitance cancel circuit 83 is added to the semiconductor amplifier circuit 1 of the structure embodiment 3-3.

[7-1-14] Embodiment 7-14

As illustrated in FIG. 22A, a semiconductor amplifier circuit 1 of a structure embodiment 7-14 is configured such that a parasitic capacitance cancel circuit 84 is added to the semiconductor amplifier circuit 1 of the structure embodiment 3-2.

[7-1-15] Embodiment 7-15

As illustrated in FIG. 22B, a semiconductor amplifier circuit 1 of a structure embodiment 7-15 is configured such that a parasitic capacitance cancel circuit 85 is added to the semiconductor amplifier circuit 1 of the structure embodiment 3-3.

[7-1-16] Embodiment 7-16

Figure 23:
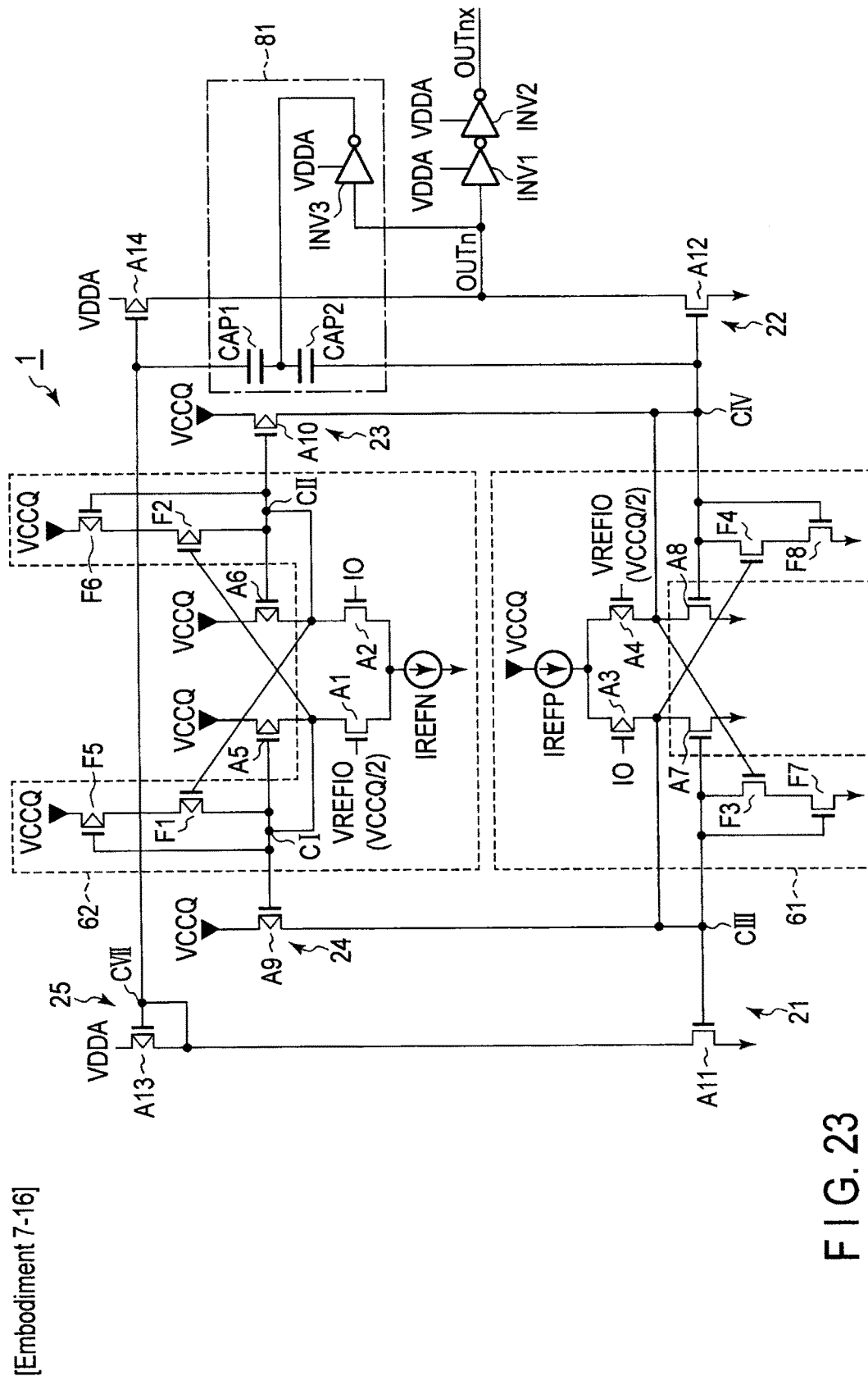

As illustrated in FIG. 23, a semiconductor amplifier circuit 1 of a structure embodiment 7-16 is configured such that a parasitic capacitance cancel circuit 81 is added to the semiconductor amplifier circuit 1 of the structure embodiment 4-1.

[7-1-17] Embodiment 7-17

Figure 24A:
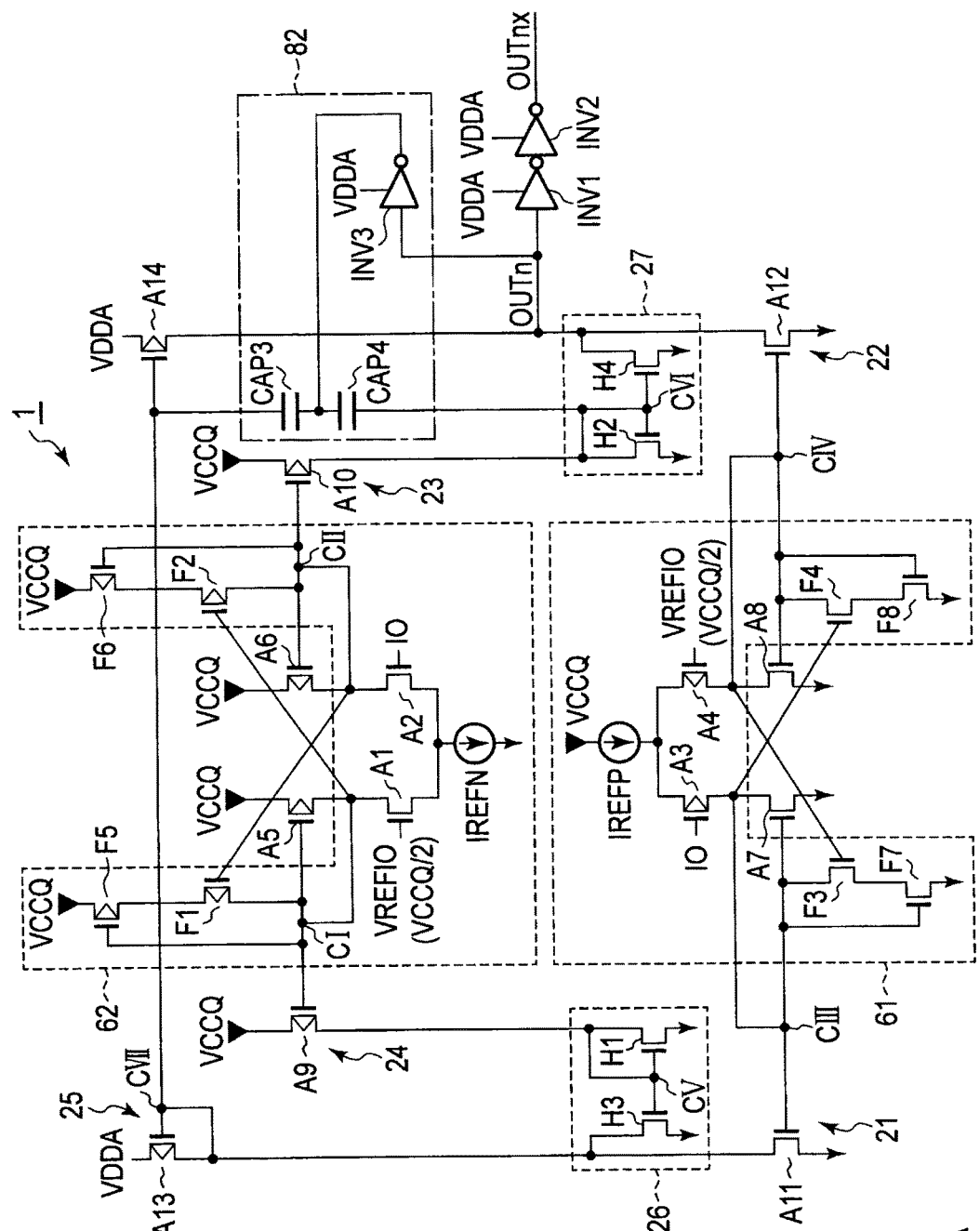

As illustrated in FIG. 24A, a semiconductor amplifier circuit 1 of a structure embodiment 7-17 is configured such that a parasitic capacitance cancel circuit 82 is added to the semiconductor amplifier circuit 1 of the structure embodiment 4-2.

[7-1-18] Embodiment 7-18

As illustrated in FIG. 24B, a semiconductor amplifier circuit 1 of a structure embodiment 7-18 is configured such that a parasitic capacitance cancel circuit 83 is added to the semiconductor amplifier circuit 1 of the structure embodiment 4-3.

[7-1-19] Embodiment 7-19

As illustrated in FIG. 25A, a semiconductor amplifier circuit 1 of a structure embodiment 7-19 is configured such that a parasitic capacitance cancel circuit 84 is added to the semiconductor amplifier circuit 1 of the structure embodiment 4-2.

[7-1-20] Embodiment 7-20

Figure 25B:
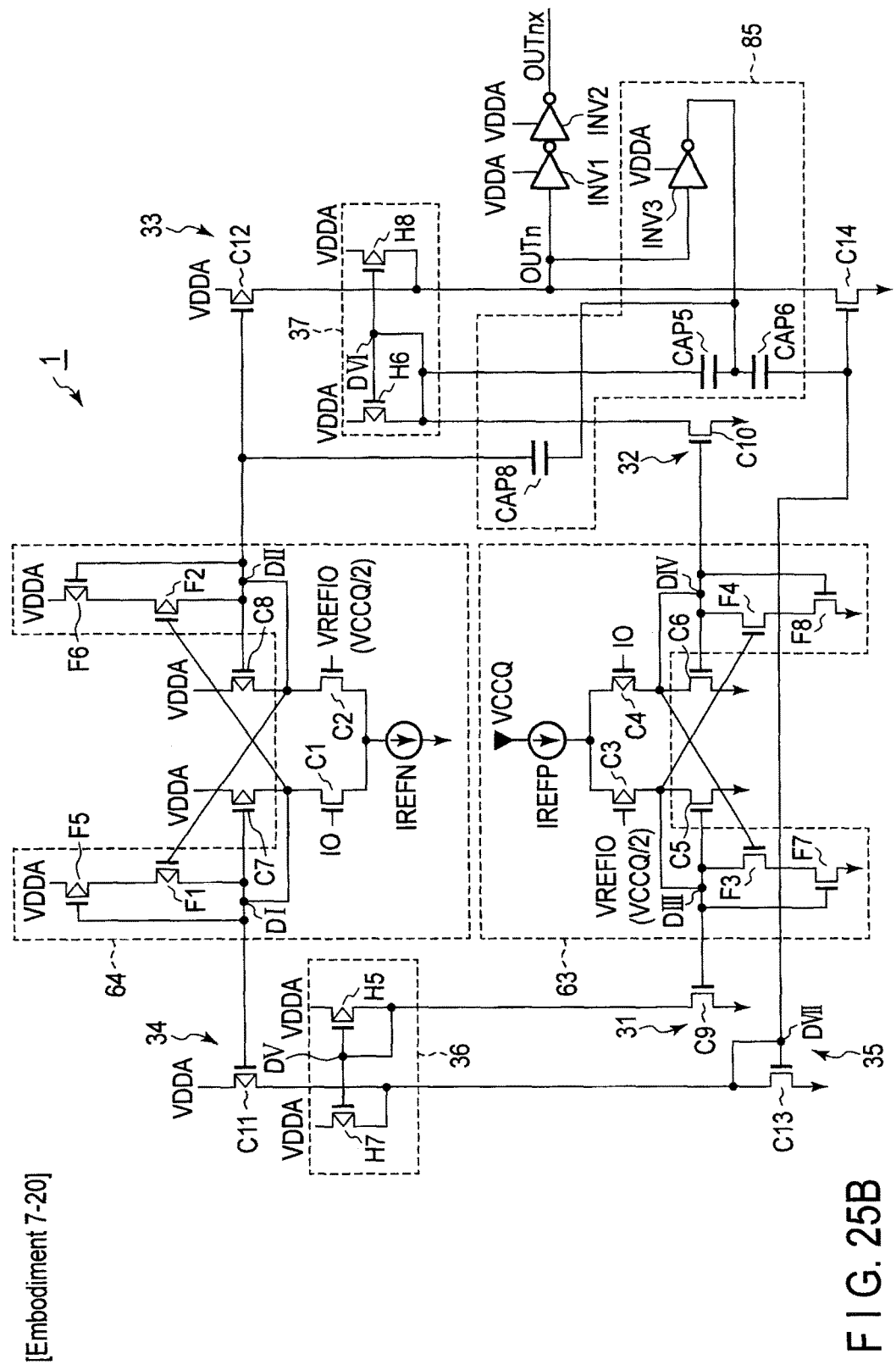

As illustrated in FIG. 25B, a semiconductor amplifier circuit 1 of a structure embodiment 7-20 is configured such that a parasitic capacitance cancel circuit 85 is added to the semiconductor amplifier circuit 1 of the structure embodiment 4-3.

[7-1-21] Embodiment 7-21

As illustrated in FIG. 26, a semiconductor amplifier circuit 1 of a structure embodiment 7-21 is configured such that a parasitic capacitance cancel circuit 81 is added to the semiconductor amplifier circuit 1 of the structure embodiment 6-1.

[7-1-22] Embodiment 7-22

As illustrated in FIG. 27A, a semiconductor amplifier circuit 1 of a structure embodiment 7-22 is configured such that a parasitic capacitance cancel circuit 82 is added to the semiconductor amplifier circuit 1 of the structure embodiment 6-2.

[7-1-23] Embodiment 7-23

Figure 27B:
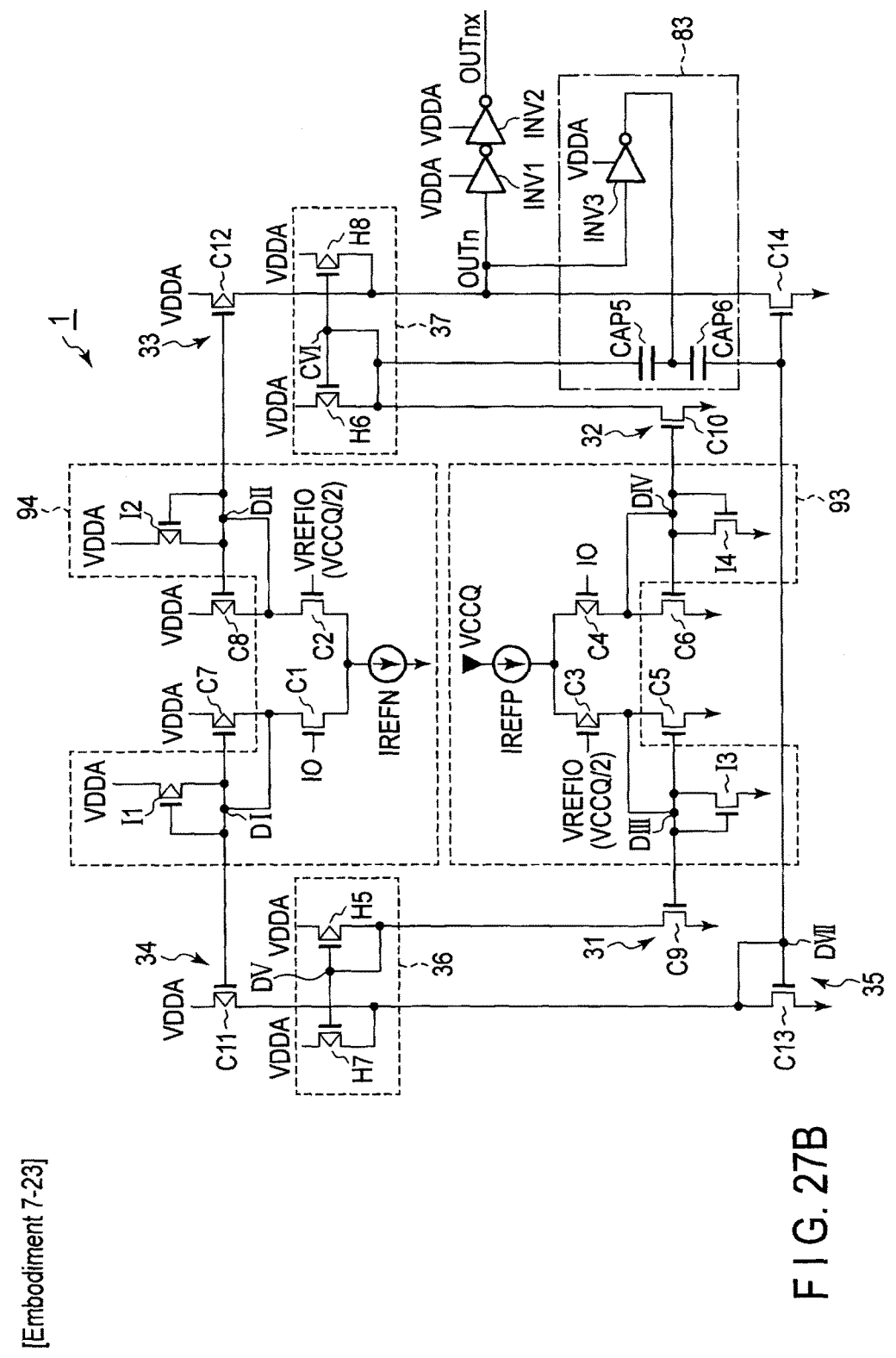

As illustrated in FIG. 27B, a semiconductor amplifier circuit 1 of a structure embodiment 7-23 is configured such that a parasitic capacitance cancel circuit 83 is added to the semiconductor amplifier circuit 1 of the structure embodiment 6-3.

[7-1-24] Embodiment 7-24

As illustrated in FIG. 28A, a semiconductor amplifier circuit 1 of a structure embodiment 7-24 is configured such that a parasitic capacitance cancel circuit 84 is added to the semiconductor amplifier circuit 1 of the structure embodiment 6-2.

[7-1-25] Embodiment 7-25

Figure 28B:
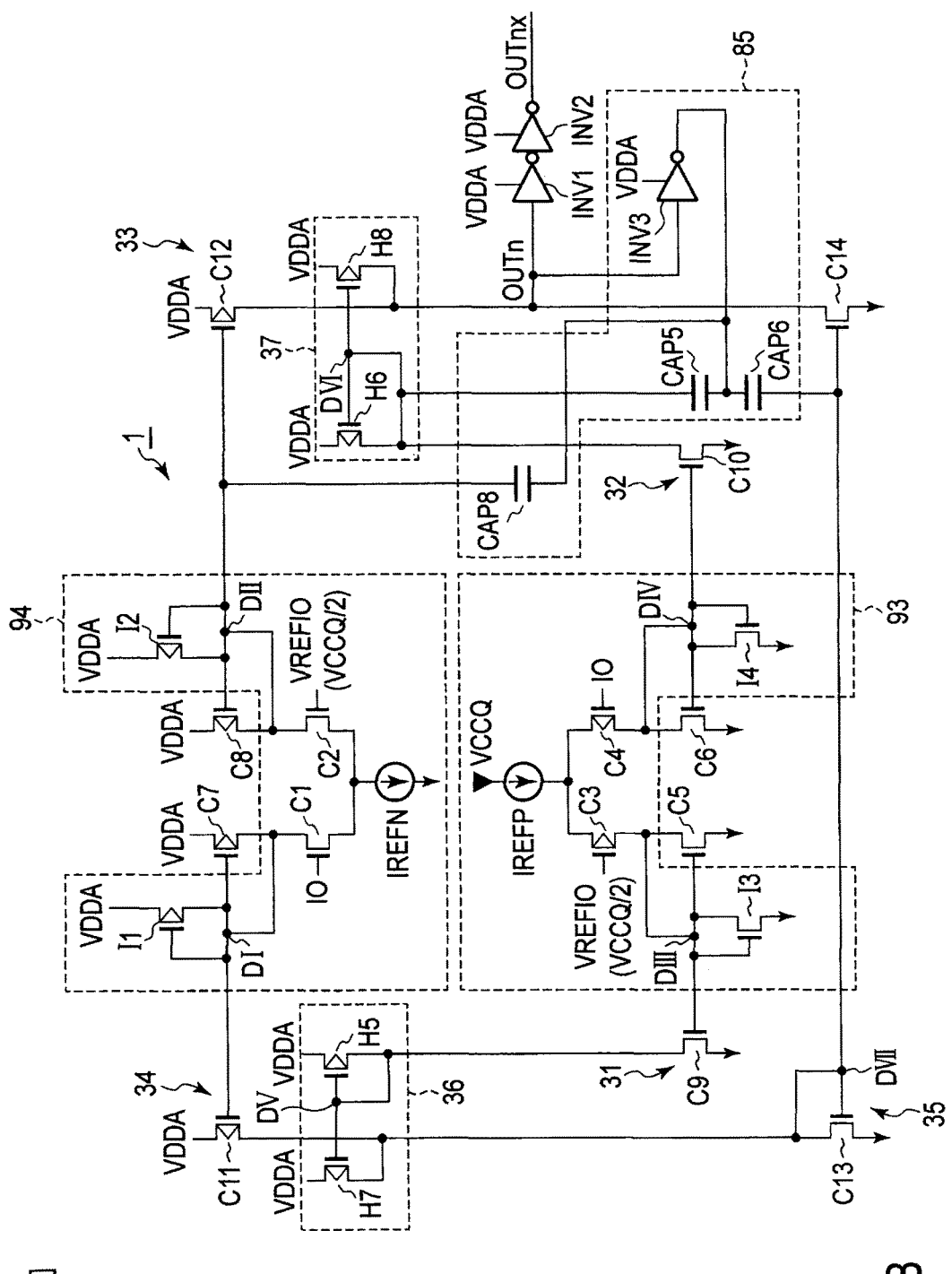

As illustrated in FIG. 28B, a semiconductor amplifier circuit 1 of a structure embodiment 7-25 is configured such that a parasitic capacitance cancel circuit 85 is added to the semiconductor amplifier circuit 1 of the structure embodiment 6-3.

[7-1-26] Embodiment 7-26

Figure 29:
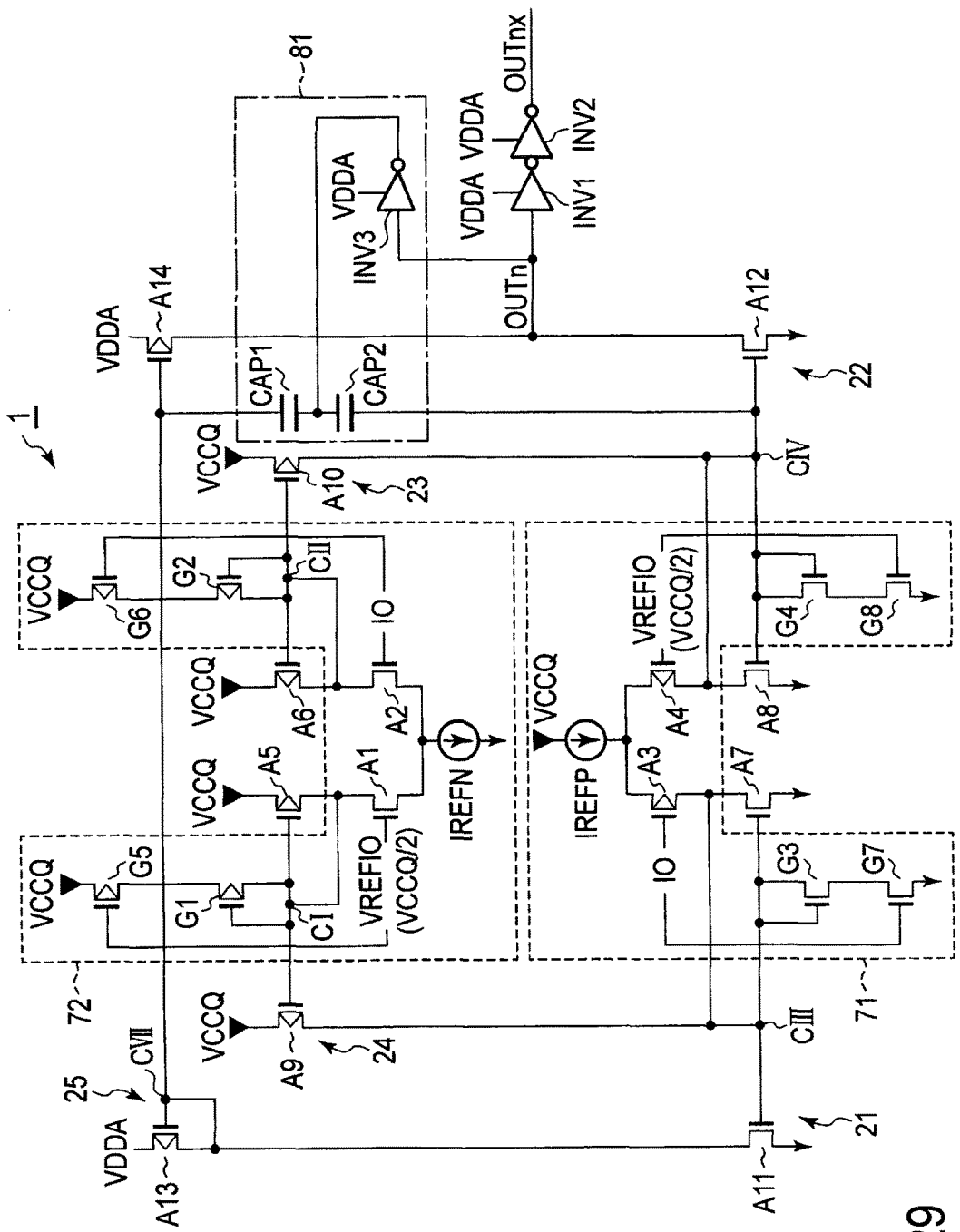

As illustrated in FIG. 29, a semiconductor amplifier circuit 1 of a structure embodiment 7-26 is configured such that a parasitic capacitance cancel circuit 81 is added to the semiconductor amplifier circuit 1 of the structure embodiment 5-1.

[7-1-27] Embodiment 7-27

Figure 30A:
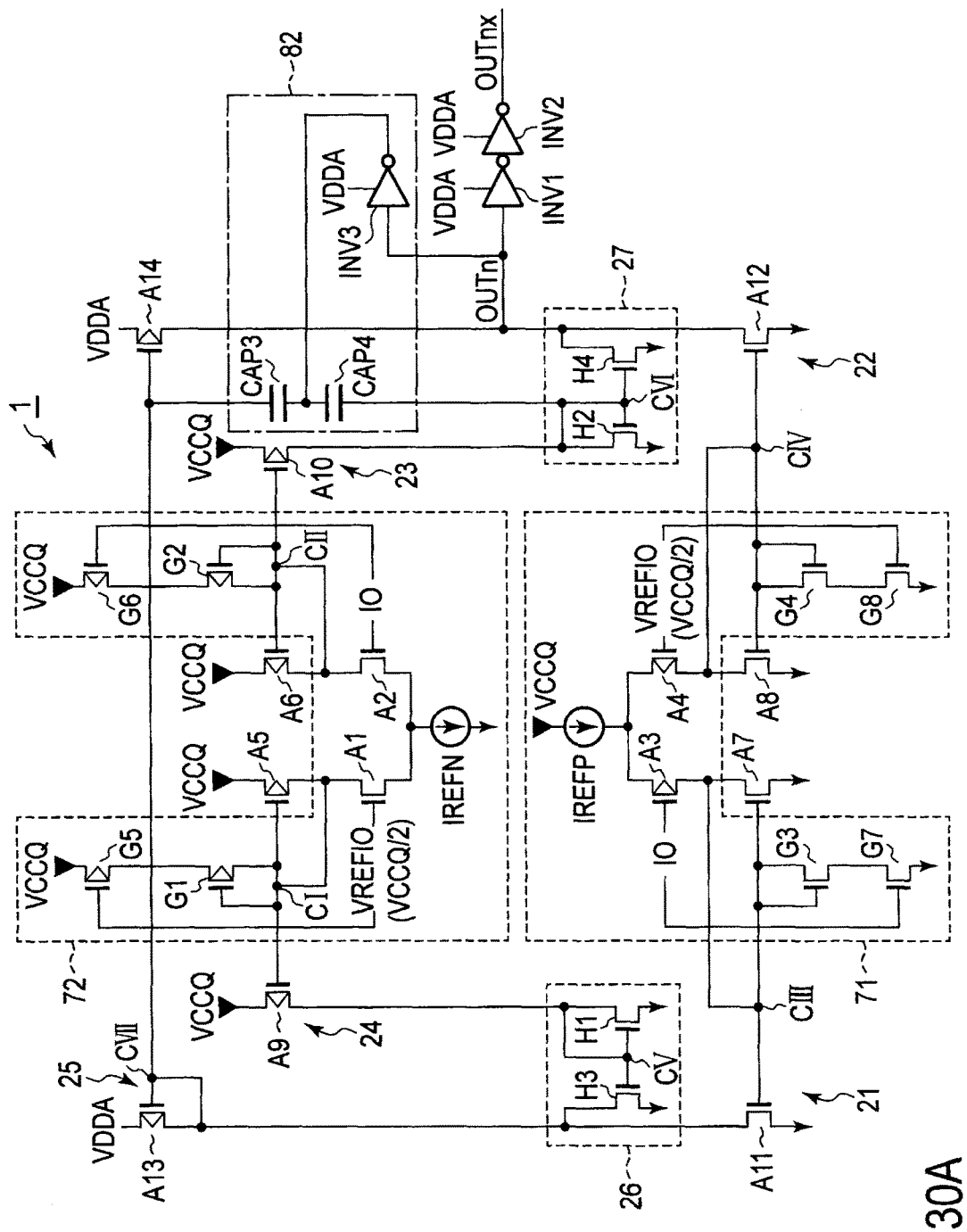

As illustrated in FIG. 30A, a semiconductor amplifier circuit 1 of a structure embodiment 7-27 is configured such that a parasitic capacitance cancel circuit 82 is added to the semiconductor amplifier circuit 1 of the structure embodiment 5-2.

[7-1-28] Embodiment 7-28

As illustrated in FIG. 30B, a semiconductor amplifier circuit 1 of a structure embodiment 7-28 is configured such that a parasitic capacitance cancel circuit 83 is added to the semiconductor amplifier circuit 1 of the structure embodiment 5-3.

[7-1-29] Embodiment 7-29

As illustrated in FIG. 31A, a semiconductor amplifier circuit 1 of a structure embodiment 7-29 is configured such that a parasitic capacitance cancel circuit 84 is added to the semiconductor amplifier circuit 1 of the structure embodiment 5-2.

[7-1-30] Embodiment 7-30

As illustrated in FIG. 31B, a semiconductor amplifier circuit 1 of a structure embodiment 7-30 is configured such that a parasitic capacitance cancel circuit 85 is added to the semiconductor amplifier circuit 1 of the structure embodiment 5-3.

[7-2] Operation

Referring to FIG. 14, a description is given of the operation of the structure embodiment 7-1 of the semiconductor amplifier circuit 1 according to the seventh embodiment.

In the semiconductor amplifier circuit 1 of FIG. 14, when a signal that is input is "H", an output signal OUTn goes to "L". When the output signal OUTn is "L", "L" is input to the inverter INV3, and the inverter INV3 outputs "H". The signal, which is output from the inverter INV3, is input to the capacitors CAP1 and CAP2, and the potential of each capacitor goes to "H" level. Then, with the capacitor CAP1 going to "H" level, the potential that is applied to the gate of the P-type transistor A14 rises and, with the capacitor CAP2 going to "H" level, the potential that is applied to the gate of the N-type transistor A12 rises. Thereby, it becomes possible to prevent the gate voltages of the transistors A12 and A14 from lowering to "L" level due to the effect of parasitic capacitance.

On the other hand, when the signal that is input is "L", the output signal OUTn goes to "H". When the output signal OUTn is "H", "H" is input to the inverter INV3, and the inverter INV3 outputs "L". The signal, which is output from the inverter INV3, is input to the capacitors CAP1 and CAP2, and the potential of each capacitor goes to "L" level. Then, with the capacitor CAP1 going to "L" level, the potential that is applied to the gate of the P-type transistor A14 falls and, with the capacitor CAP2 going to "L" level, the potential that is applied to the gate of the N-type transistor A12 falls. Thereby, it becomes possible to prevent the gate voltages of the transistors A12 and A14 from rising to "H" level due to the effect of parasitic capacitance.

[7-3] Advantageous Effects of the Seventh Embodiment

In the seventh embodiment, the parasitic capacitance cancel circuit 81-85, is added to the semiconductor amplifier circuit 1. Thereby, in each transistor A12, A14, C12, C14, H4, H8, which is connected to the input terminal of the inverter INV1 to which the output signal OUTn is input, the parasitic capacitance in this transistor A12, A14, C12, C14, H4, H8 is canceled, and a delay in response of the output signal OUTn due to a variation of the application voltage of the gate is suppressed.

Specifically, in the case of the structure embodiment 7-1 illustrated in FIG. 14, when the output signal OUTn is "L", the output signal of the inverter INV3 is input to the gates of the transistors A12 and A14, which are connected to the inverter INV1, via the associated capacitors CAP2 and CAP1. Thereby, an "H" signal is supplied to the gate of each of the transistors A12 and A14, and it becomes possible to prevent the gate voltage from lowering to "L" due to the effect of parasitic capacitance.

On the other hand, in the same manner, when the output signal OUTn is "H", an "L" signal is supplied to the gate of each of the transistors A12 and A14 by the parasitic capacitance cancel circuit 81, and it becomes possible to prevent the gate voltage from rising to "H" due to the effect of parasitic capacitance.

In this manner, by adding the parasitic capacitance cancel circuit 81, the variation of the gate voltage of each transistor A12, A14, which is connected to the input terminal of the inverter INV1, can be suppressed, and the high-speed operation is enabled.

In the meantime, in the case of the structure embodiment 7-2 illustrated in FIG. 15A, the capacitor CAP3 cancels the parasitic capacitance of the transistor A14, and the capacitor CAP4 cancels the parasitic capacitance of the transistor H4. In the case of the structure embodiment 7-3 illustrated in FIG. 15B, the capacitor CAP5 cancels the parasitic capacitance of the transistor H8, and the capacitor CAP6 cancels the parasitic capacitance of the transistor C14. In the case of the structure embodiment 7-4 illustrated in FIG. 16A, the capacitor CAP3 cancels the parasitic capacitance of the transistor A14, the capacitor CAP4 cancels the parasitic capacitance of the transistor H4, and the capacitor CAP7 cancels the parasitic capacitance of the transistor A12. In the case of the structure embodiment 7-5 illustrated in FIG. 16B, the capacitor CAP5 cancels the parasitic capacitance of the transistor H8, the capacitor CAP6 cancels the parasitic capacitance of the transistor C14, and the capacitor CAP8 cancels the parasitic capacitance of the transistor C12.

[8] Eighth Embodiment

An eighth embodiment is a 1-input voltage generator circuit configured such that only either the amplifier circuit, which receives the input signal by the N-type transistor, or the amplifier circuit, which receives the input signal by the P-type transistor, is included in each of the semiconductor amplifier circuits described in the first to seventh embodiments. In the description below, only the points different from the first to seventh embodiments will be described.

[8-1] Structure

[8-1-1] Embodiment 8-1

Figure 32A:
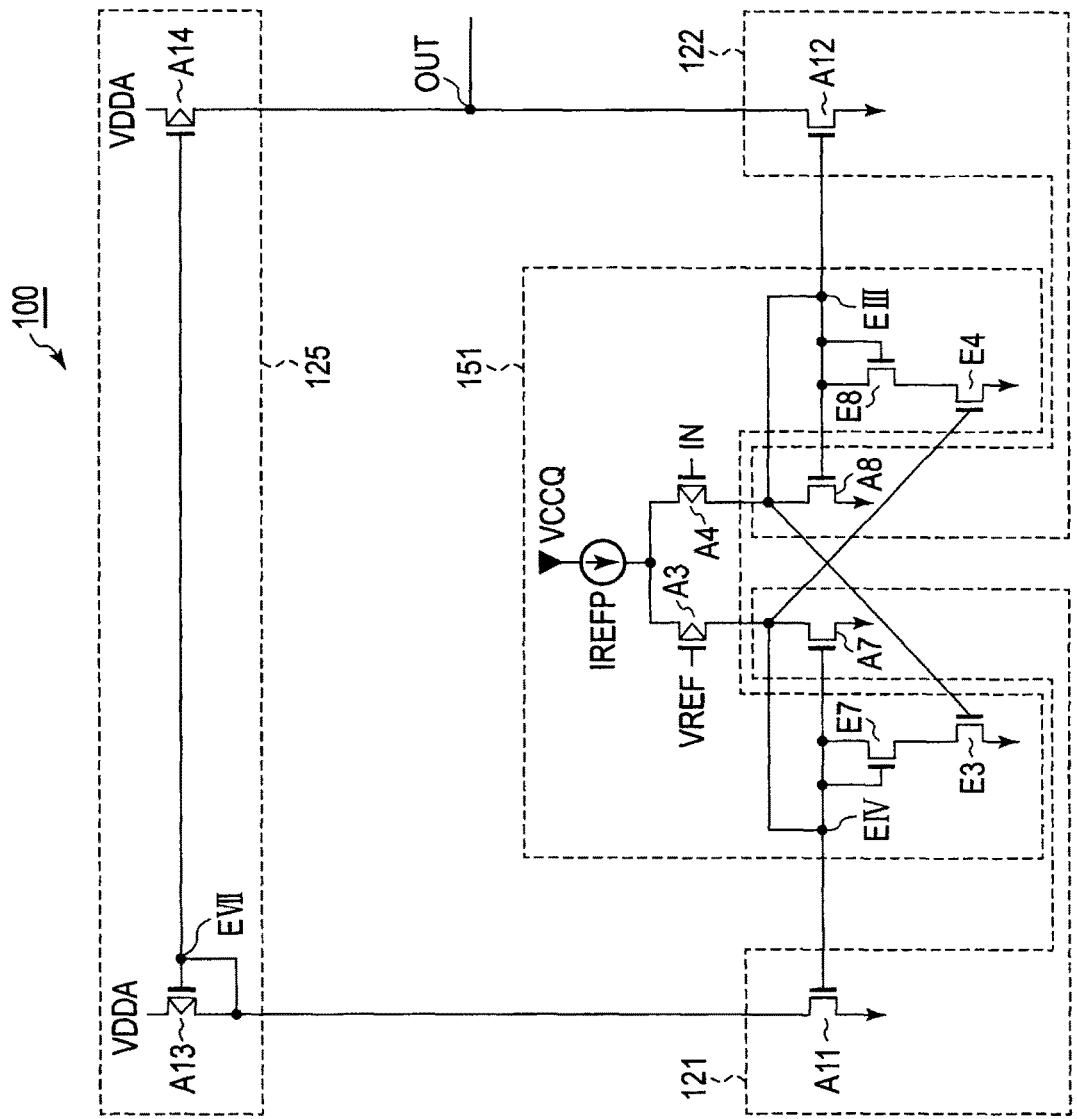

As illustrated in FIG. 32A, a voltage generator circuit 100 of a structure embodiment 8-1 includes an amplifier circuit 151 which accepts an external input by a P-type transistor A4, and current mirror circuits 121, 122 and 125.

The amplifier circuit 151 includes, for example, the same structural elements as the amplifier circuit 51 of the structure embodiment 3-1, and the amplifier circuit 151 is different from the amplifier circuit 51 only with respect to the signals which are input to the P-type transistor A3 and P-type transistor A4. Specifically, a reference voltage VREF is supplied to the P-type transistor A3, and an input signal IN is supplied to the P-type transistor A4. The current mirror circuits 121, 122 and 125 correspond to, for example, the current mirror circuits 21, 22 and 25 of the structure embodiment 3-1, respectively, and the connection states and operations of the circuits are also the same.

[8-1-2] Embodiment 8-2

As illustrated in FIG. 32B, a voltage generator circuit 100 of a structure embodiment 8-2 includes an amplifier circuit 154 which accepts an external input by an N-type transistor C2, and current mirror circuits 133, 134 and 135.

The amplifier circuit 154 includes, for example, the same structural elements as the amplifier circuit 54 of the structure embodiment 3-2. A reference voltage VREF is supplied to the N-type transistor C1, and an input signal IN is supplied to the N-type transistor C2. The current mirror circuits 133, 134 and 135 correspond to, for example, the current mirror circuits 33, 34 and 35 of the structure embodiment 3-2, respectively, and the connection states and operations of the circuits are also the same.

[8-1-3] Embodiment 8-3

As illustrated in FIG. 33A, a voltage generator circuit 100 of a structure embodiment 8-3 includes an amplifier circuit 161 which accepts an external input by a P-type transistor A4, and current mirror circuits 121, 122 and 125.

The amplifier circuit 161 includes, for example, the same structural elements as the amplifier circuit 61 of the structure embodiment 4-1, and the amplifier circuit 161 is different from the amplifier circuit 61 only with respect to the signals which are input to the P-type transistor A3 and P-type transistor A4. Specifically, a reference voltage VREF is supplied to the P-type transistor A3, and an input signal IN is supplied to the P-type transistor A4.

[8-1-4] Embodiment 8-4

As illustrated in FIG. 33B, a voltage generator circuit 100 of a structure embodiment 8-4 includes an amplifier circuit 164 which accepts an external input by an N-type transistor C2, and current mirror circuits 133, 134 and 135.

The amplifier circuit 164 includes, for example, the same structural elements as the amplifier circuit 64 of the structure embodiment 4-2. A reference voltage VREF is supplied to the N-type transistor C1, and an input signal IN is supplied to the N-type transistor C2.

[8-1-5] Embodiment 8-5

As illustrated in FIG. 34A, a voltage generator circuit 100 of a structure embodiment 8-5 includes an amplifier circuit 191 which accepts an external input by a P-type transistor A4, and current mirror circuits 121, 122 and 125.

The amplifier circuit 191 includes, for example, the same structural elements as the amplifier circuit 91 of the structure embodiment 6-1, and the amplifier circuit 191 is different from the amplifier circuit 91 only with respect to the signals which are input to the P-type transistor A3 and P-type transistor A4. Specifically, a reference voltage VREF is supplied to the P-type transistor A3, and an input signal IN is supplied to the P-type transistor A4.

[8-1-6] Embodiment 8-6

As illustrated in FIG. 34B, a voltage generator circuit 100 of a structure embodiment 8-6 includes an amplifier circuit 194 which accepts an external input by an N-type transistor C2, and current mirror circuits 133, 134 and 135.

The amplifier circuit 194 includes, for example, the same structural elements as the amplifier circuit 94 of the structure embodiment 6-2. A reference voltage VREF is supplied to the N-type transistor C1, and an input signal IN is supplied to the N-type transistor C2.

[8-1-7] Embodiment 8-7

As illustrated in FIG. 35A, a voltage generator circuit 100 of a structure embodiment 8-7 includes an amplifier circuit 171 which accepts an external input by a P-type transistor A4, and current mirror circuits 121, 122 and 125.

The amplifier circuit 171 includes, for example, the same structural elements as the amplifier circuit 71 of the structure embodiment 5-1, and the amplifier circuit 171 is different from the amplifier circuit 71 only with respect to the signals which are input to the P-type transistor A3 and P-type transistor A4. Specifically, a reference voltage VREF is supplied to the P-type transistor A3, and an input signal IN is supplied to the P-type transistor A4.

[8-1-8] Embodiment 8-8

Figure 35B:
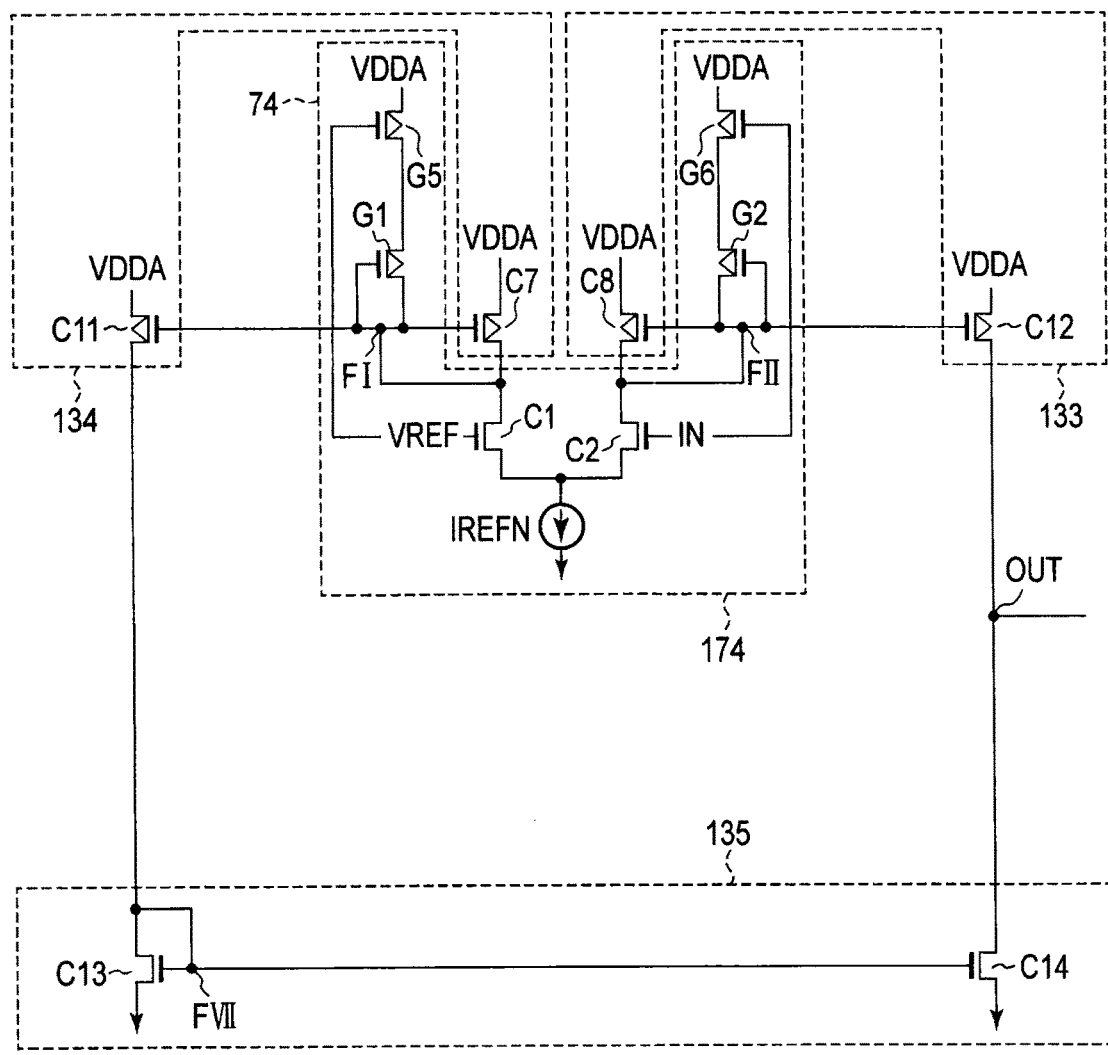

As illustrated in FIG. 35B, a voltage generator circuit 100 of a structure embodiment 8-8 includes an amplifier circuit 174 which accepts an external input by an N-type transistor C2, and current mirror circuits 133, 134 and 135.

The amplifier circuit 174 includes, for example, the same structural elements as the amplifier circuit 74 of the structure embodiment 5-2. A reference voltage VREF is supplied to the N-type transistor C1, and an input signal IN is supplied to the N-type transistor C2.

[8-2] Operation

[8-2-1] Embodiment 8-1

Referring to FIG. 32A, a description is given of the operation of the structure embodiment 8-1 of the voltage generator circuit 100 according to the eighth embodiment.
In the amplifier circuit 151, when a signal, which is input to the P-type transistor A4, has changed from "H" to "L", the P-type transistor A4 enters an ON state. Thus, the charge of a node EIII is charged and goes to "H" level. If the node EIII changes to "H" level, the N-type transistor A12 enters an ON state. Thus, the charge of a node OUT is discharged and goes to "L" level. If the P-type transistor A4 enters the ON state, a current flowing in the P-type transistor A3 decreases. Thus, the charge of a node CIV is discharged, and goes to "L" level. If the node CIV changes to "L" level, the N-type transistor A11 enters an OFF state, and the charge of a node EVII is charged and goes to "H" level. If the node EVII goes to "H" level, the P-type transistor A14 enters an OFF state.

On the other hand, when the signal, which is input to the P-type transistor A4, has changed from "L" to "H", the P-type transistor A4 enters an OFF state. Thus, the charge of the node EIII is discharged, and goes to "L" level. If the node EIII goes to "L" level, the N-type transistor A12 enters an OFF state. Thus, the charge of the node OUT is charged, and goes to "H" level. If the P-type transistor A4 enters the OFF state, a current flowing in the P-type transistor A3 increases. Thus, the charge of the node EIV is charged, and goes to "H" level. If the node EIV goes to "H" level, the N-type transistor A11 enters an ON state, and the charge of the node EVII is discharged and goes to "L" level. If the node EVII goes to "L" level, the P-type transistor A14 enters an ON state, and the charge of the node OUT is charged and goes to "H" level.

[8-2-2] Embodiment 8-2

Referring to FIG. 32B, a description is given of the operation of the structure embodiment 8-2 of the voltage generator circuit 100 according to the eighth embodiment.
In the amplifier circuit 154, when a signal, which is input to the N-type transistor C2, has changed from "H" to "L", the N-type transistor C2 enters an OFF state. Thus, the charge of a node FII is charged and goes to "H" level. If the node FII changes to "H" level, the P-type transistor C12 enters an OFF state. Thus, the charge of a node OUT is discharged and goes to "L" level. If the N-type transistor C2 enters an ON state, a current flowing in the N-type transistor C1 decreases. Thus, the charge of a node FI is discharged and goes to "L" level. If the node FI changes to "L" level, the P-type transistor C11 enters an ON state, and the charge of a node FVII is charged and goes to "H" level. If the node FVII goes to "H" level, the N-type transistor C14 enters an ON state, and the charge of the node OUT is discharged and goes to "L" level.

On the other hand, when the signal, which is input to the N-type transistor C2, has changed from "L" to "H", the N-type transistor C2 enters an ON state. Thus, the charge of the node FII is discharged and goes to "L" level. If the node FII changes to "L" level, the P-type transistor C12 enters an ON state. Thus, the charge of the node OUT is charged and goes to "H" level. If the N-type transistor C2 enters an OFF state, a current flowing in the N-type transistor CI increases. Thus, the charge of the node FI is charged and goes to "H" level. If the node FI goes to "H" level, the P-type transistor C11 enters an ON state, and the charge of the node FVII is discharged and goes to "L" level.

[8-3] Advantageous Effects of the Eighth Embodiment

In the voltage generator circuit 100 of the eighth embodiment, an operation in a higher-speed operation region is enabled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor amplifier circuit comprising:
a first amplifier circuit including a first P-type transistor to which an input signal from an outside is supplied, and a second P-type transistor to which a reference voltage is supplied;
a second amplifier circuit including a first N-type transistor to which the input signal is supplied, and a second N-type transistor to which the reference voltage is supplied;
a first current mirror circuit connected to a drain of the first P-type transistor;
a second current mirror circuit connected to a drain of the second P-type transistor;
a third current mirror circuit connected to a drain of the first N-type transistor;
a fourth current mirror circuit connected to a drain of the second N-type transistor;
a fifth current mirror circuit;
a sixth current mirror circuit connected to the first, fourth and fifth current mirror circuits;
a seventh current mirror circuit connected to the second, third and fifth current mirror circuits;
a first constant current source circuit including a first terminal connected to a power supply terminal and a second terminal connected to a source of the first P-type transistor and to a source of the second P-type transistor; and
a second constant current source circuit including a first terminal connected to a ground terminal and a second terminal connected to a source of the first N-type transistor and to a source of the second N-type transistor.

2. The circuit according to claim 1, wherein the first current mirror circuit includes a third N-type transistor and a fourth N-type transistor, a gate of the third N-type transistor being connected to the drain of the first P-type transistor and to a gate and a drain of the fourth N-type transistor,
the second current mirror circuit includes a fifth N-type transistor and a sixth N-type transistor, a gate of the fifth N-type transistor being connected to the drain of the second P-type transistor and to a gate and a drain of the sixth N-type transistor,
the third current mirror circuit includes a third P-type transistor and a fourth P-type transistor, a gate of the third P-type transistor being connected to the drain of the first N-type transistor and to a gate and a drain of the fourth P-type transistor,
the fourth current mirror circuit includes a fifth P-type transistor and a sixth P-type transistor, a gate of the fifth P-type transistor being connected to the drain of the second N-type transistor and to a gate and a drain of the sixth P-type transistor,
the fifth current mirror circuit includes a seventh P-type transistor and an eighth P-type transistor, a gate of the seventh P-type transistor being connected to a gate of the eighth P-type transistor,
the sixth current mirror circuit includes a seventh N-type transistor and an eighth N-type transistor, a gate of the seventh N-type transistor is connected to a drain of the fifth P-type transistor and to a gate and a drain of the eighth N-type transistor, and a drain of the seventh N-type transistor is connected to a drain of the third N-type transistor and to the gate and a drain of the seventh P-type transistor, and
the seventh current mirror circuit includes a ninth N-type transistor and a tenth N-type transistor, a gate of the ninth N-type transistor is connected to a drain of the third P-type transistor and to a gate and a drain of the tenth N-type transistor, and a drain of the ninth N-type transistor is connected to a drain of the fifth N-type transistor and to a drain of the eighth P-type transistor.

3. The circuit according to claim 2, wherein the first amplifier circuit further includes an eleventh N-type transistor and a twelfth N-type transistor,
a gate of the eleventh N-type transistor is connected to the drain of the second P-type transistor and to a drain of the twelfth N-type transistor, and a gate of the twelfth N-type transistor is connected to the drain of the first P-type transistor and to a drain of the eleventh N-type transistor,
the second amplifier circuit further includes a ninth P-type transistor and a tenth P-type transistor,
a gate of the ninth P-type transistor is connected to the drain of the second N-type transistor and to a drain of the tenth P-type transistor, and a gate of the tenth P-type transistor is connected to the drain of the first N-type transistor and to a drain of the ninth P-type transistor,
the first P-type transistor, the second P-type transistor, the eleventh N-type transistor and the twelfth N-type transistor constitute a first cross-coupling circuit, and
the first N-type transistor, the second N-type transistor, the ninth P-type transistor and the tenth P-type transistor constitute a second cross-coupling circuit.

4. The circuit according to claim 2, wherein the first amplifier circuit further includes eleventh to fourteenth N-type transistors,
a gate and a drain of the eleventh N-type transistor are connected to the drain of the first P-type transistor, a gate of the twelfth N-type transistor is connected to the drain of the second P-type transistor, and a drain of the twelfth N-type transistor is connected to a source of the eleventh N-type transistor,
a gate and a drain of the thirteenth N-type transistor are connected to the drain of the second P-type transistor, a gate of the fourteenth N-type transistor is connected to the drain of the first P-type transistor, and a drain of the fourteenth N-type transistor is connected to a source of the thirteenth N-type transistor,
the first P-type transistor, the second P-type transistor, the twelfth N-type transistor and the fourteenth N-type transistor constitute a first cross-coupling circuit,
each of the eleventh N-type transistor and the thirteenth N-type transistor is a diode-connected transistor,
the second amplifier circuit further includes ninth to twelfth P-type transistors,
a gate and a drain of the ninth P-type transistor are connected to the drain of the first N-type transistor, a gate of the tenth P-type transistor is connected to the drain of the second N-type transistor, and a drain of the tenth P-type transistor is connected to a source of the ninth P-type transistor,
a gate and a drain of the eleventh P-type transistor are connected to the drain of the second N-type transistor, a gate of the twelfth P-type transistor is connected to the drain of the first N-type transistor, and a drain of the twelfth P-type transistor is connected to a source of the eleventh P-type transistor, the first N-type transistor, the second N-type transistor, the tenth P-type transistor and the twelfth P-type transistor constitute a second cross-coupling circuit, and each of the ninth P-type transistor and the eleventh P-type transistor is a diode-connected transistor.

5. The circuit according to claim 2, wherein the first amplifier circuit further includes eleventh to fourteenth N-type transistors, a gate of the eleventh N-type transistor is connected to the drain of the first P-type transistor, a drain of the eleventh N-type transistor is connected to a source of the twelfth N-type transistor, a gate of the twelfth N-type transistor is connected to the drain of the second P-type transistor, and a drain of the twelfth N-type transistor is connected to the gate of the fourth N-type transistor, a gate of the thirteenth N-type transistor is connected to the drain of the second P-type transistor, a drain of the thirteenth N-type transistor is connected to a source of the fourteenth N-type transistor, a gate of the fourteenth N-type transistor is connected to the drain of the first P-type transistor, and a drain of the fourteenth N-type transistor is connected to the gate of the sixth N-type transistor, the first P-type transistor, the second P-type transistor, the twelfth N-type transistor and the fourteenth N-type transistor constitute a first cross-coupling circuit, each of the eleventh N-type transistor and the thirteenth N-type transistor is a diode-connected transistor, the second amplifier circuit further includes ninth to twelfth P-type transistors, a gate of the ninth P-type transistor is connected to the drain of the first N-type transistor, a drain of the ninth P-type transistor is connected to a source of the tenth P-type transistor, a gate of the tenth P-type transistor is connected to the drain of the second N-type transistor, and a drain of the tenth P-type transistor is connected to the gate of the fourth P-type transistor, a gate of the eleventh P-type transistor is connected to the drain of the second N-type transistor, a drain of the eleventh P-type transistor is connected to a source of the twelfth P-type transistor, a gate of the twelfth P-type transistor is connected to the drain of the first N-type transistor, and a drain of the twelfth P-type transistor is connected to the gate of the sixth P-type transistor, the first N-type transistor, the second N-type transistor, the tenth P-type transistor and the twelfth P-type transistor constitute a second cross-coupling circuit, and each of the ninth P-type transistor and the eleventh P-type transistor is a diode-connected transistor.

6. The circuit according to claim 2, wherein the first amplifier circuit further includes eleventh to fourteenth N-type transistors, a gate and a drain of the eleventh N-type transistor are connected to the drain of the first P-type transistor, and a drain of the twelfth N-type transistor is connected to a source of the eleventh N-type transistor, a gate and a drain of the thirteenth N-type transistor are connected to the drain of the second P-type transistor, and a drain of the fourteenth N-type transistor is connected to a source of the thirteenth N-type transistor, the second amplifier circuit further includes ninth to twelfth P-type transistors, a gate and a drain of the ninth P-type transistor are connected to the drain of the first N-type transistor, and a drain of the tenth P-type transistor is connected to a source of the ninth P-type transistor, a gate and a drain of the eleventh P-type transistor are connected to the drain of the second N-type transistor, and a drain of the twelfth P-type transistor is connected to a source of the eleventh P-type transistor, the input signal is supplied to a gate of the twelfth N-type transistor and a gate of the tenth P-type transistor, and the reference voltage is supplied to a gate of the fourteenth N-type transistor and a gate of the twelfth P-type transistor.

7. The circuit according to claim 2, further comprising a parasitic capacitance cancel circuit including a first capacitor, a second capacitor and an inverter, wherein one end of the first capacitor is connected to one end of the second capacitor, the other end of the first capacitor is connected to the gate of the eighth P-type transistor, and the other end of the second capacitor is connected to the gate of the ninth N-type transistor, and an input terminal of the inverter is connected to the drain of the eighth P-type transistor, and an output terminal of the inverter is connected to the one end of the first capacitor.

8. The circuit according to claim 7, wherein the parasitic capacitance cancel circuit further includes a third capacitor, and one end of the third capacitor is connected to the one end of the first capacitor, and the other end of the third capacitor is connected to the gate of the fifth N-type transistor.

9. The circuit according to claim 1, wherein the first current mirror circuit includes a third N-type transistor and a fourth N-type transistor, a gate of the third N-type transistor being connected to the drain of the first P-type transistor and to a gate and a drain of the fourth N-type transistor, the second current mirror circuit includes a fifth N-type transistor and a sixth N-type transistor, a gate of the fifth N-type transistor being connected to the drain of the second P-type transistor and to a gate and a drain of the sixth N-type transistor, the third current mirror circuit includes a third P-type transistor and a fourth P-type transistor, a gate of the third P-type transistor being connected to the drain of the first N-type transistor and to a gate and a drain of the fourth P-type transistor, the fourth current mirror circuit includes a fifth P-type transistor and a sixth P-type transistor, a gate of the fifth P-type transistor being connected to the drain of the second N-type transistor and to a gate and a drain of the sixth P-type transistor, the fifth current mirror circuit includes a seventh N-type transistor and an eighth N-type transistor, a gate of the seventh N-type transistor being connected to a gate of the eighth N-type transistor, the sixth current mirror circuit includes a seventh P-type transistor and an eighth P-type transistor, a gate of the seventh P-type transistor is connected to a drain of the third N-type transistor and to a gate and a drain of the eighth P-type transistor, and a drain of the seventh P-type transistor is connected to a drain of the fifth P-type transistor and to a drain of the eighth N-type transistor, and the seventh current mirror circuit includes a ninth P-type transistor and a tenth P-type transistor, a gate of the ninth P-type transistor is connected to a drain of the fifth N-type transistor and to a gate and a drain of the tenth P-type transistor, and a drain of the ninth P-type transistor is connected to a drain of the third P-type transistor and to the gate and a drain of the seventh N-type transistor.

10. The circuit according to claim 9, wherein the first amplifier circuit further includes a ninth N-type transistor and a tenth N-type transistor,
- a gate of the ninth N-type transistor is connected to the drain of the second P-type transistor and to a drain of the tenth N-type transistor, and a gate of the tenth N-type transistor is connected to the drain of the first P-type transistor and to a drain of the ninth N-type transistor,
- the second amplifier circuit further includes an eleventh P-type transistor and a twelfth P-type transistor,
- a gate of the eleventh P-type transistor is connected to the drain of the second N-type transistor and to a drain of the twelfth P-type transistor, and a gate of the twelfth P-type transistor is connected to the drain of the first N-type transistor and to a drain of the eleventh P-type transistor,
- the first P-type transistor, the second P-type transistor, the ninth N-type transistor and the tenth N-type transistor constitute a first cross-coupling circuit, and
- the first N-type transistor, the second N-type transistor, the eleventh P-type transistor and the twelfth P-type transistor constitute a second cross-coupling circuit.

11. The circuit according to claim 9, wherein the first amplifier circuit further includes ninth to twelfth N-type transistors,
- a gate and a drain of the ninth N-type transistor are connected to the drain of the first P-type transistor, a gate of the tenth N-type transistor is connected to the drain of the second P-type transistor, and a drain of the tenth N-type transistor is connected to a source of the ninth N-type transistor,
- a gate and a drain of the eleventh N-type transistor are connected to the drain of the second P-type transistor, a gate of the twelfth N-type transistor is connected to the drain of the first P-type transistor, and a drain of the twelfth N-type transistor is connected to a source of the eleventh N-type transistor,
- the first P-type transistor, the second P-type transistor, the tenth N-type transistor and the twelfth N-type transistor constitute a first cross-coupling circuit,
- each of the ninth N-type transistor and the eleventh N-type transistor is a diode-connected transistor,
- the second amplifier circuit further includes eleventh to fourteenth P-type transistors,
- a gate and a drain of the eleventh P-type transistor are connected to the drain of the first N-type transistor, a gate of the twelfth P-type transistor is connected to the drain of the second N-type transistor, and a drain of the twelfth P-type transistor is connected to a source of the eleventh P-type transistor,
- a gate and a drain of the thirteenth P-type transistor are connected to the drain of the second N-type transistor, a gate of the fourteenth P-type transistor is connected to the drain of the first N-type transistor, and a drain of the fourteenth P-type transistor is connected to a source of the thirteenth P-type transistor,
- the first N-type transistor, the second N-type transistor, the twelfth P-type transistor and the fourteenth P-type transistor constitute a second cross-coupling circuit, and
- each of the eleventh P-type transistor and the thirteenth P-type transistor is a diode-connected transistor.

12. The circuit according to claim 9, wherein the first amplifier circuit further includes ninth to twelfth N-type transistors,
- a gate of the ninth N-type transistor is connected to the drain of the first P-type transistor, a drain of the ninth N-type transistor is connected to a source of the tenth N-type transistor, a gate of the tenth N-type transistor is connected to the drain of the second P-type transistor, and a drain of the tenth N-type transistor is connected to the gate of the fourth N-type transistor,
- a gate of the eleventh N-type transistor is connected to the drain of the second P-type transistor, a drain of the eleventh N-type transistor is connected to a source of the twelfth N-type transistor, a gate of the twelfth N-type transistor is connected to the drain of the first P-type transistor, and a drain of the twelfth N-type transistor is connected to the gate of the sixth N-type transistor,
- the first P-type transistor, the second P-type transistor, the tenth N-type transistor and the twelfth N-type transistor constitute a first cross-coupling circuit,
- each of the ninth N-type transistor and the eleventh N-type transistor is a diode-connected transistor,
- the second amplifier circuit further includes eleventh to fourteenth P-type transistors,
- a gate of the eleventh P-type transistor is connected to the drain of the first N-type transistor, a drain of the eleventh P-type transistor is connected to a source of the twelfth P-type transistor, a gate of the twelfth P-type transistor is connected to the drain of the second N-type transistor, and a drain of the twelfth P-type transistor is connected to the gate of the fourth P-type transistor,
- a gate of the thirteenth P-type transistor is connected to the drain of the second N-type transistor, a drain of the thirteenth P-type transistor is connected to a source of the fourteenth P-type transistor, a gate of the fourteenth P-type transistor is connected to the drain of the first N-type transistor, and a drain of the fourteenth P-type transistor is connected to the gate of the sixth P-type transistor,
- the first N-type transistor, the second N-type transistor, the twelfth P-type transistor and the fourteenth P-type transistor constitute a second cross-coupling circuit, and
- each of the eleventh P-type transistor and the thirteenth P-type transistor is a diode-connected transistor.

13. The circuit according to claim 9, wherein the first amplifier circuit further includes ninth to twelfth N-type transistors,
- a gate and a drain of the ninth N-type transistor are connected to the drain of the first P-type transistor, and a drain of the tenth N-type transistor is connected to a source of the ninth N-type transistor,
- a gate and a drain of the eleventh N-type transistor are connected to the drain of the second P-type transistor, and a drain of the twelfth N-type transistor is connected to a source of the eleventh N-type transistor,
- the second amplifier circuit further includes eleventh to fourteenth P-type transistors,
- a gate and a drain of the eleventh P-type transistor are connected to the drain of the first N-type transistor, and a drain of the twelfth P-type transistor is connected to a source of the eleventh P-type transistor, a gate and a drain of the thirteenth P-type transistor are connected to the drain of the second N-type transistor, and a drain of the fourteenth P-type transistor is connected to a source of the thirteenth P-type transistor, the input signal is supplied to a gate of the tenth N-type transistor and a gate of the twelfth P-type transistor, and the reference voltage is supplied to a gate of the twelfth N-type transistor and a gate of the fourteenth P-type transistor.

14. The circuit according to claim 9, further comprising a parasitic capacitance cancel circuit including a first capacitor, a second capacitor and an inverter, wherein one end of the first capacitor is connected to one end of the second capacitor, the other end of the first capacitor is connected to the gate of the eighth N-type transistor, and the other end of the second capacitor is connected to the gate of the seventh P-type transistor, and an input terminal of the inverter is connected to the drain of the eighth N-type transistor, and an output terminal of the inverter is connected to the one end of the first capacitor.

15. The circuit according to claim 14, wherein the parasitic capacitance cancel circuit further includes a third capacitor, and one end of the third capacitor is connected to the one end of the first capacitor, and the other end of the third capacitor is connected to the gate of the fifth P-type transistor.

16. A semiconductor amplifier circuit comprising:
a first amplifier circuit;
a second amplifier circuit; and
first to fifth current mirror circuits,
wherein the first amplifier circuit includes a first P-type transistor to which an input signal from an outside is supplied, a second P-type transistor to which a reference voltage is supplied, and first and second N-type transistors;

a gate and a drain of the first N-type transistor are connected to a drain of the first P-type transistor, a gate and a drain of the second N-type transistor are connected to a drain of the second P-type transistor, the second amplifier circuit includes a third N-type transistor to which the input signal is supplied, a fourth N-type transistor to which the reference voltage is supplied, and third and fourth P-type transistors;

a gate and a drain of the third P-type transistor are connected to a drain of the third N-type transistor, a gate and a drain of the fourth P-type transistor are connected to a drain of the fourth N-type transistor, the first current mirror circuit includes a fifth N-type transistor and a sixth N-type transistor, a gate of the fifth N-type transistor is connected to the drain of the first P-type transistor and to a gate and a drain of the sixth N-type transistor, the second current mirror circuit includes a seventh N-type transistor and an eighth N-type transistor, a gate of the seventh N-type transistor is connected to the drain of the second P-type transistor and to a gate and a drain of the eighth N-type transistor, the third current mirror circuit includes a fifth P-type transistor and a sixth P-type transistor, a gate of the fifth P-type transistor is connected to the drain of the third N-type transistor and to a gate and a drain of the sixth P-type transistor, and a drain of the fifth P-type transistor is connected to the drain of the second P-type transistor, the fourth current mirror circuit includes a seventh P-type transistor and an eighth P-type transistor, a gate of the seventh P-type transistor is connected to the drain of the fourth N-type transistor and to a gate and a drain of the eighth P-type transistor, and a drain of the seventh P-type transistor is connected to the drain of the first P-type transistor, the fifth current mirror circuit includes a ninth P-type transistor and a tenth P-type transistor, a gate and a drain of the ninth P-type transistor are connected to a drain of the fifth N-type transistor, and a gate of the tenth P-type transistor is connected to the gate of the ninth P-type transistor, and a drain of the tenth P-type transistor is connected to a drain of the seventh N-type transistor.

17. The circuit according to claim 16, wherein the first amplifier circuit further includes a ninth N-type transistor to which the input signal is supplied, and a tenth N-type transistor to which the reference voltage is supplied, a drain of the ninth N-type transistor is connected to a source of the first N-type transistor, a drain of the tenth N-type transistor is connected to a source of the second N-type transistor, the second amplifier circuit further includes an eleventh P-type transistor to which the input signal is supplied, and a twelfth P-type transistor to which the reference voltage is supplied, a drain of the eleventh P-type transistor is connected to a source of the third P-type transistor, and a drain of the twelfth P-type transistor is connected to a source of the fourth P-type transistor.

18. The circuit according to claim 17, further comprising a parasitic capacitance cancel circuit including a first capacitor, a second capacitor and an inverter, wherein one end of the first capacitor is connected to one end of the second capacitor, the other end of the first capacitor is connected to the gate of the tenth P-type transistor, and the other end of the second capacitor is connected to the gate of the seventh N-type transistor, and an input terminal of the inverter is connected to the drain of the tenth P-type transistor, and an output terminal of the inverter is connected to the one end of the first capacitor.

* * * * *